US012795005B2

(12) United States Patent
Choi et al.

(10) Patent No.: US 12,795,005 B2
(45) Date of Patent: Nov. 10, 2026

(54) ELECTRONIC DEVICE COMPRISING HINGE STRUCTURE

(71) Applicant: SAMSUNG ELECTRONICS CO., LTD., Suwon-si (KR)

(72) Inventors: Sooyeon Choi, Suwon-si (KR); Jongkeun Kim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 129 days.

(21) Appl. No.: 18/809,354

(22) Filed: Aug. 20, 2024

(65) Prior Publication Data

US 2024/0414249 A1 Dec. 12, 2024

Related U.S. Application Data

(63) Continuation of application No. PCT/KR2023/004753, filed on Apr. 7, 2023.

(30) Foreign Application Priority Data

May 13, 2022 (KR) ........................ 10-2022-0059136
Jul. 12, 2022 (KR) ........................ 10-2022-0085926

(51) Int. Cl.
*H05K 5/00* (2025.01)
*F16C 11/04* (2006.01)
(Continued)

(52) U.S. Cl.
CPC ........... *H04M 1/0216* (2013.01); *F16C 11/04* (2013.01); *H05K 5/0226* (2013.01)

(58) Field of Classification Search
CPC ..... H04M 1/0216; F16C 11/04; H05K 5/0226
See application file for complete search history.

(56) References Cited

U.S. PATENT DOCUMENTS 10,845,850 B1 * 11/2020 Kang .................... G06F 1/1681
11,231,754 B2 1/2022 Kang et al.
(Continued)

FOREIGN PATENT DOCUMENTS

CN 114185398 A * 3/2022 ........... G06F 1/1616
JP 2022063700 A 4/2022
(Continued)

OTHER PUBLICATIONS

International Search Report mailed Jul. 13, 2023 for PCT/KR2023/004753.
(Continued)

*Primary Examiner* — Allen L Parker
*Assistant Examiner* — Rashen E Morrison
(74) *Attorney, Agent, or Firm* — CANTOR COLBURN LLP

(57) ABSTRACT

An electronic device according to an embodiment includes a housing including a first housing and a second housing, a display, and a hinge structure. The hinge structure includes a fixed member, a first rotary member, a second rotary member, a first arm member, a second arm member, a first coupling member including one portion coupled to the first housing and another portion coupled to the first arm member so as to be linearly movable, a second coupling member including one portion coupled to the second housing and another portion coupled to the second arm member so as to slide, a first elastic member disposed between the first coupling member and the first arm member, and a second elastic member disposed between the second coupling member and the second arm member. Besides, it may be permissible to prepare various other embodiments speculated through the specification.

20 Claims, 29 Drawing Sheets

(51) Int. Cl.
*H04M 1/02* (2006.01)
*H05K 5/02* (2006.01)

(56) References Cited

U.S. PATENT DOCUMENTS

| | | | |
|---|---|---|---|
| 11,353,932 | B2 | 6/2022 | Kim et al. |
| 11,360,526 | B2 | 6/2022 | Kim et al. |
| 11,502,598 | B2 | 11/2022 | Zhu et al. |
| 11,537,173 | B2 | 12/2022 | Kim et al. |
| 11,579,661 | B2 | 2/2023 | Kinoshita et al. |
| 11,614,780 | B2 | 3/2023 | Kim et al. |
| 11,625,073 | B2 | 4/2023 | Shim et al. |
| 11,662,781 | B2 | 5/2023 | Kang et al. |
| 11,726,532 | B2 | 8/2023 | Kim et al. |
| 11,762,433 | B2 | 9/2023 | Kim et al. |
| 11,788,330 | B2 | 10/2023 | Kim et al. |
| 12,038,794 | B2 | 7/2024 | Shim et al. |
| 12,332,703 | B2 * | 6/2025 | Liao ........................ F16C 11/04 |
| 2021/0181808 | A1 * | 6/2021 | Liao .................... H04M 1/0216 |
| 2021/0271294 | A1 * | 9/2021 | Liao ........................ G06F 1/181 |
| 2021/0368032 | A1 | 11/2021 | Liao et al. |
| 2022/0011827 | A1 | 1/2022 | Kim et al. |
| 2022/0116489 | A1 | 4/2022 | Nagai et al. |
| 2022/0137675 | A1 | 5/2022 | Kuramochi |
| 2023/0251692 | A1 | 8/2023 | Kang et al. |
| 2024/0035324 | A1 | 2/2024 | Kim et al. |

FOREIGN PATENT DOCUMENTS

| | | | |
|---|---|---|---|
| KR | 20180094172 | A | 8/2018 |
| KR | 20200126524 | A | 11/2020 |
| KR | 20210101717 | A | 8/2021 |
| KR | 20210108933 | A | 9/2021 |
| KR | 20210111212 | A | 9/2021 |
| KR | 20220002630 | A | 1/2022 |
| KR | 20220007321 | A | 1/2022 |
| KR | 20220008020 | A | 1/2022 |
| KR | 20220013212 | A | 2/2022 |
| KR | 20220039675 | A | 3/2022 |

OTHER PUBLICATIONS

The extended European search report for EP Application No. 23714999.2 mailed on Jun. 3, 2024.

European Office Action issued on Jun. 3, 2025 for EP Application No. 23714999.2.

* cited by examiner

<S1>

<S2>

<S3>

(a)

(b)

(a)

(b)

ELECTRONIC DEVICE COMPRISING HINGE STRUCTURE

TECHNICAL FIELD

Various embodiments of the disclosure described herein relate to an electronic device including a hinge structure.

BACKGROUND ART

A portable electronic device such as a smartphone may provide various functions, such as telephone call, video playback, Internet search, and the like, based on various types of applications. A user may want to use the aforementioned various functions through a wider screen. However, as the size of the screen of the portable electronic device is increased, portability may be deteriorated. Accordingly, a foldable electronic device including a flexible display, a partial region of which is deformable to be curved or flat, is being developed. The foldable electronic device may include a hinge structure to fold or unfold the flexible display.

The hinge structure of the foldable electronic device may be connected with adjacent housings such that each of the adjacent housings rotates through a predetermined angle. As the adjacent housings rotate, the flexible display may be unfolded or folded.

DISCLOSURE

Technical Problem

The foldable electronic device may include the flexible display, at least a partial region (e.g., a folding region) of which is deformable to be curved or flat. When the electronic device is folded, a fold (or, a crease) may occur in the folding region if the folding region has a large curvature. Furthermore, when the electronic device is folded, a gap may occur between the housings if the folding region has a small curvature.

Various embodiments of the disclosure may provide a hinge structure for reducing stress in a folding region of a display by forming the folding region of the display in a water-drop shape (or, a dumbbell shape) to which a predetermined magnitude of gravity is applied, and an electronic device including the hinge structure.

Various embodiments of the disclosure may provide a hinge structure for forming a folding region of a display in a water-drop shape (or, a dumbbell shape), in which a detent structure is implemented to replace a cam structure.

Technical Solution

An electronic device according to an embodiment of the disclosure includes a housing including a first housing and a second housing, a display that extends from the first housing to the second housing, and a hinge structure that rotatably connects the first housing and the second housing. The hinge structure includes a fixed member, a first rotary member coupled to one side of the fixed member so as to be rotatable about a first axis, a second rotary member coupled to an opposite side of the fixed member so as to be rotatable about a second axis, a first arm member coupled to the one side of the fixed member so as to be rotatable about a third axis, the third axis and the first axis being spaced apart from each other in parallel, a second arm member coupled to the opposite side of the fixed member so as to be rotatable about a fourth axis, the fourth axis and the second axis being spaced apart from each other in parallel, a first coupling member including one portion coupled to the first housing and another portion coupled to the first arm member so as to be linearly movable, a second coupling member including one portion coupled to the second housing and another portion coupled to the second arm member so as to slide, a first elastic member disposed between the first coupling member and the first arm member such that opposite ends of the first elastic member are supported by the first coupling member and the first arm member, and a second elastic member disposed between the second coupling member and the second arm member such that opposite ends of the second elastic member are supported by the second coupling member and the second arm member. In folding and unfolding operations of the electronic device, the first coupling member and the second coupling member perform a linear reciprocating motion relative to the first arm member and the second arm member, respectively. The first elastic member and the second elastic member are compressed or uncompressed based on the linear reciprocating motion of the first coupling member and the second coupling member.

Advantageous Effects

According to the various embodiments of the disclosure, when the electronic device is in a folded state, the display may be supported to form a specified shape (e.g., a water-drop shape or a dumbbell shape). Accordingly, the curvature of the folding region may be made small, and a crease in the folding region may be reduced.

Furthermore, in the electronic device according to the various embodiments of the disclosure, the detent structure may be implemented using a change in the degree of compression of the elastic members (e.g., springs) disposed between the components that perform a linear reciprocating motion, among the components of the hinge structure. Accordingly, the structure of the hinge structure may be simplified, and the size of the hinge structure may be reduced.

Moreover, according to the various embodiments of the disclosure, when the electronic device is in a folded state, the first housing and the second housing may be substantially brought into close contact with each other. Accordingly, the aesthetics of the external appearance of the electronic device may be improved.

In addition, the disclosure may provide various effects that are directly or indirectly recognized.

DESCRIPTION OF DRAWINGS

With regard to description of the drawings, identical or similar reference numerals may be used to refer to identical or similar components.

MODE FOR INVENTION

Hereinafter, various embodiments of the disclosure will be described with reference to accompanying drawings.

Figure 1:
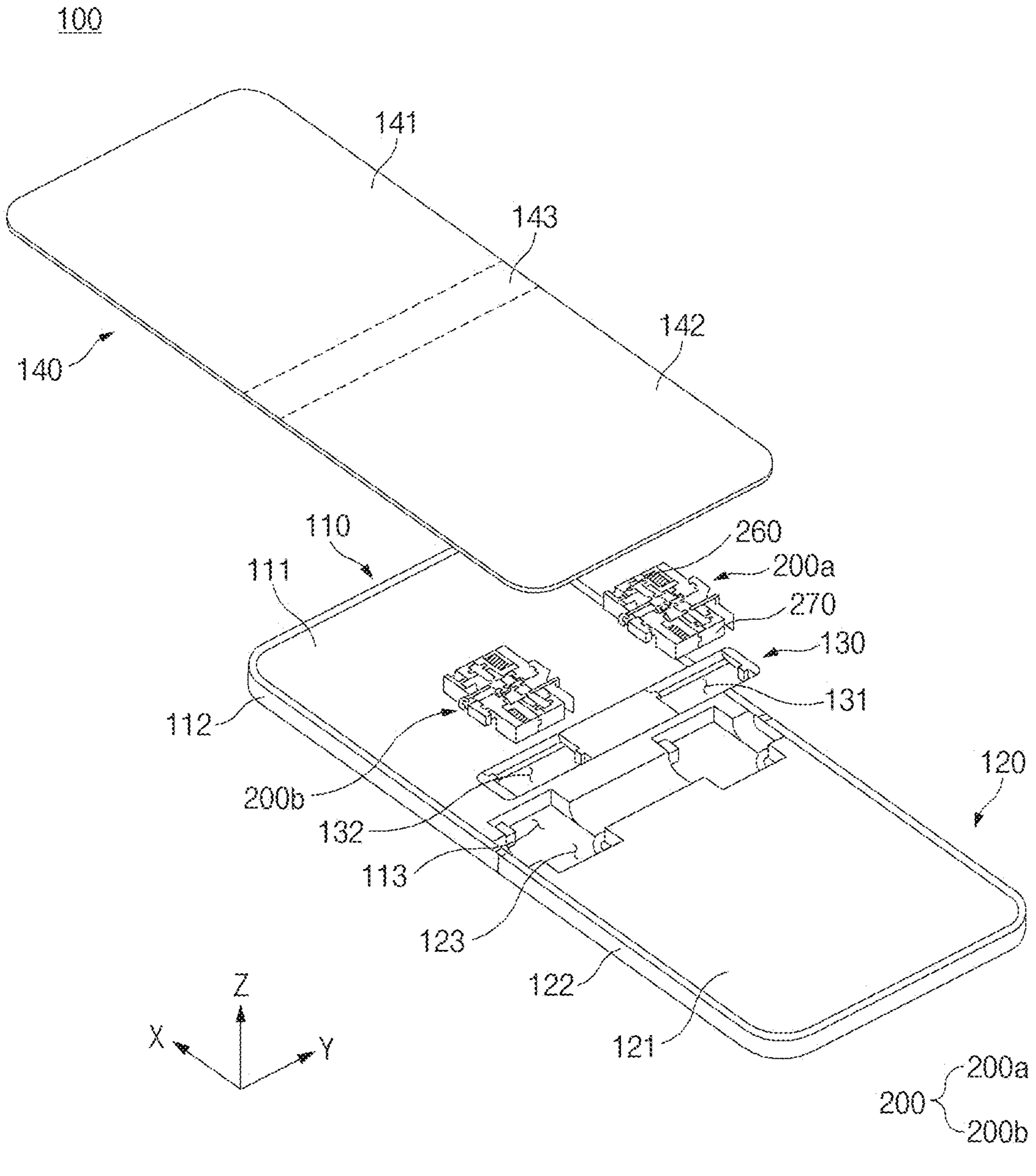
FIG. 1 is an exploded perspective view of an electronic device according to an embodiment.

FIG. 1 is an exploded perspective view of an electronic device according to an embodiment.

Referring to FIG. 1, the electronic device 100 according to an embodiment may include a first housing 110, a second housing 120, a hinge housing 130, a display 140, and a hinge structure 200.

The first housing 110 may be connected with the second housing 120 through the hinge structure 200. The first housing 110 may include a first plate 111 on which the display 140 is seated and a first frame 112 surrounding at least a portion of the first plate 111. For example, the first frame 112 may form a portion of a surface (e.g., a side surface) of the electronic device 100. For example, at least a portion of a first region 141 of the display 140 and at least a portion of a folding region 143 of the display 140 may be disposed on the first plate 111. A first coupling member 260 of the hinge structure 200 may be coupled to the first plate 111.

Although not illustrated, the first housing 110 may further include a first back cover that is disposed to face the first plate 111 and that forms a surface (particularly, a rear surface) of the electronic device 100. For example, the first housing 110 may be formed in a form in which the first frame 112 surrounds the first plate 111 and the first back cover disposed to face each other. Accordingly, a space in which other parts are disposed may be provided in the first housing 110. According to various embodiments, the first frame 112 may be integrally formed with the first plate 111 and/or the first back cover.

At least a portion of the first housing 110 may be attached with the first region 141 of the display 140. Alternatively, a portion of the periphery of the first housing 110 may be attached with the periphery of the first region 141 of the display 140. In this regard, an adhesive layer may be disposed between the first plate 111 of the first housing 110 and the first region 141 of the display 140.

At least a portion of the inside of the first housing 110 may be provided in a hollow form. Although not illustrated, a first circuit board (not illustrated), a first battery (e.g., a battery 589 of FIG. 24), and a camera module (e.g., a camera module 580 of FIG. 24) may be disposed in the first housing 110. The first circuit board and the first battery may be electrically connected with a second circuit board and a second battery in the second housing 120 through a flexible substrate (not illustrated). For example, the flexible substrate may extend from a partial region of the first housing 110 to a partial region of the second housing 120 across the hinge housing 130. A partial region of the flexible substrate may be located in the hinge housing 130. According to various embodiments, a processor (e.g., a processor 520 of FIG. 24) and a memory (e.g., a memory 530 of FIG. 24) may be disposed on the first circuit board. For example, the first battery and the first circuit board in the first housing 110 may be supported on and/or coupled to one surface (e.g., a surface facing in the −z-axis direction) of the first plate 111.

At least a portion of the first housing 110 may be formed of a metallic material, or at least a portion of the first housing 110 may be formed of a non-metallic material. The first housing 110 may be formed of a material having a predetermined magnitude of rigidity to support at least a portion of the display 140. The first housing 110 may have, in a portion facing the second housing 120, a recessed region 113 for accommodating the hinge housing 130 and/or the hinge structure 200.

The second housing 120 may be connected with the first housing 110 through the hinge structure 200. The second housing 120 may include a second plate 121 on which the display 140 is seated and a second frame 122 surrounding at least a portion of the second plate 121. For example, the second frame 122 may form a portion of a surface (e.g., the side surface) of the electronic device 100. For example, at least a portion of a second region 142 and at least a portion of the folding region 143 may be disposed on the second plate 121. A second coupling member 270 of the hinge structure 200 may be coupled to the second plate 121.

Although not illustrated, the second housing 120 may further include a second back cover that is disposed to face the second plate 121 and that forms a surface (e.g., the rear surface) of the electronic device 100. For example, the second housing 120 may be formed in a form in which the second frame 122 surrounds the second plate 121 and the second back cover disposed to face each other. Accordingly, a space in which other parts are disposed may be provided in the second housing 120. According to various embodiments, the second frame 122 may be integrally formed with the second plate 121 and/or the second back cover.

At least a portion of the second housing 120 may be attached with the second region 142 of the display 140. Alternatively, a portion of the periphery of the second housing 120 may be attached with the periphery of the second region 142 of the display 140. In this regard, an adhesive layer may be disposed between the second plate 121 of the second housing 120 and the second region 142 of the display 140.

At least a portion of the inside of the second housing 120 may be provided in a hollow form. Although not illustrated, the second circuit board (not illustrated) and the second battery (e.g., the battery 589 of FIG. 24) may be disposed in the second housing 120. The second circuit board and the second battery may be electrically connected with the first circuit board and/or the first battery in the first housing 110 through the flexible substrate (not illustrated). For example, the second battery and the second circuit board in the second housing 120 may be supported on and/or coupled to one surface (e.g., a surface facing in the −z-axis direction) of the second plate 121.

At least a portion of the second housing 120 may be formed of a metallic material, or at least a portion of the second housing 120 may be formed of a non-metallic material. The second housing 120 may be formed of a material having a predetermined magnitude of rigidity to support at least a portion of the display 140. The second housing 120 may have, in a portion facing the first housing 110, a recessed region 123 for accommodating the hinge housing 130 and/or the hinge structure 200.

The hinge housing 130 may be disposed in spaces formed by the recessed regions 113 and 123 of the first housing 110 and of the second housing 120. The hinge housing 130 may be formed in a form extending in the width direction of the display 140 (e.g., the y-axis direction). For example, the width direction of the display 140 may mean the direction of long sides of the folding region 143. A boss for coupling the hinge structure 200 may be disposed on a portion of the hinge housing 130. For example, some components of the hinge structure 200 may be fixedly coupled to the hinge housing 130 through various coupling methods including screw coupling. The hinge housing 130 may include hinge receiving portions 131 and 132 in which at least portions of the hinge structure 200 are disposed. For example, the hinge receiving portions 131 and 132 may be concavely recessed to accommodate some components of the hinge structure 200 and prevent interference or collision between the hinge structure 200 and the hinge housing 130 in a rotation operation of the hinge structure 200.

At least a portion of the display 140 may have flexibility. For example, the display 140 may include the first region 141 disposed on the first housing 110, the second region 142 disposed on the second housing 120, and the folding region 143 located between the first region 141 and the second region 142. The first region 141 and the second region 142 may be formed flat, and the folding region 143 may be formed such that at least a portion thereof is deformable to be flat or curved. For example, the first region 141 and the second region 142 may be regions that remain substantially flat when the electronic device 100 is folded or unfolded, and the folding region 143 may be a region that deforms between the first region 141 and the second region 142 to form a substantially flat or curved shape in response to a folding or unfolding operation of the electronic device 100.

The hinge structure 200 may connect the first housing 110 and the second housing 120 such that the first housing 110 and the second housing 120 are rotatable relative to each other. The hinge structure 200 may include the first coupling member 260 connected to the first housing 110 and the second coupling member 270 connected to the second housing 120. The hinge structure 200 may be configured such that the first coupling member 260 and the second coupling member 270 are rotatable about rotational axes thereof (e.g., axes parallel to the y-axis direction). For example, when the first housing 110 and the second housing 120 are folded or unfolded, a first rotary member 220 and a second rotary member 230 may rotate about rotational axes thereof. The first coupling member 260 may be fixedly coupled to the first housing 110, and the first coupling member 260 and the first housing 110 may rotate together when the electronic device 100 is folded or unfolded. The second coupling member 270 may be fixedly coupled to the second housing 120, and the second coupling member 270 and the second housing 120 may rotate together when the electronic device 100 is folded or unfolded.

The hinge structure 200 may include a pair of hinge structures. For example, the hinge structure 200 may include a first hinge structure **200*a* and a second hinge structure 200*b* spaced apart from each other in the direction of the long sides of the folding region 143. The first hinge structure 200*a* and the second hinge structure 200*b* may be aligned parallel to the direction of the long sides of the folding region 143. The first hinge structure 200*a* may be disposed such that at least a portion is accommodated in the first hinge receiving portion 131 of the hinge housing 130, and the second hinge structure 200*b* may be disposed such that at least a portion is accommodated in the second hinge receiving portion 132 of the hinge housing 130. The first hinge structure 200*a* and the second hinge structure 200*b*** may be formed in the same structure and/or shape.

Figure 2A:
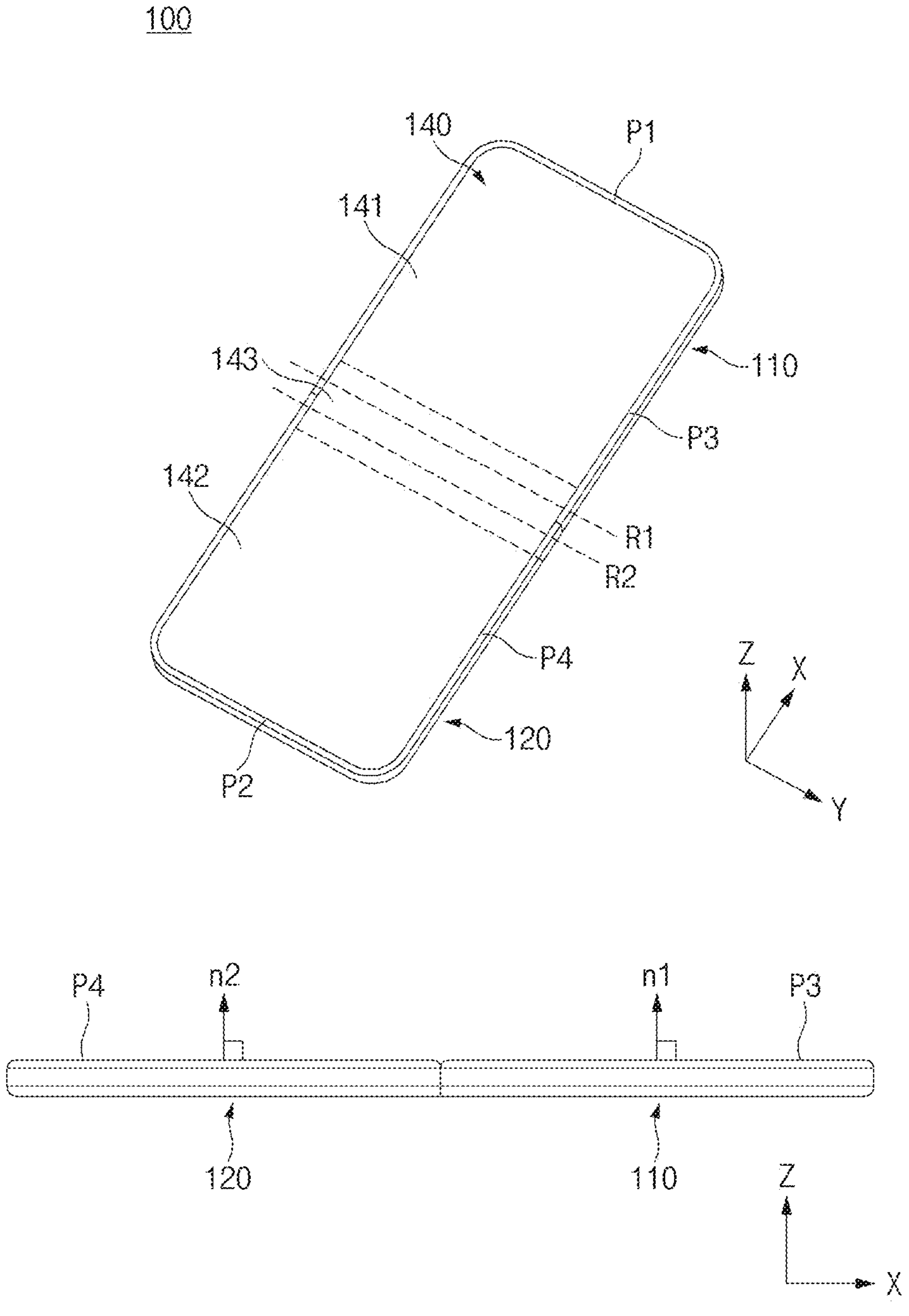
FIG. 2A is a view illustrating an unfolded state of the electronic device according to an embodiment.
Figure 2B:
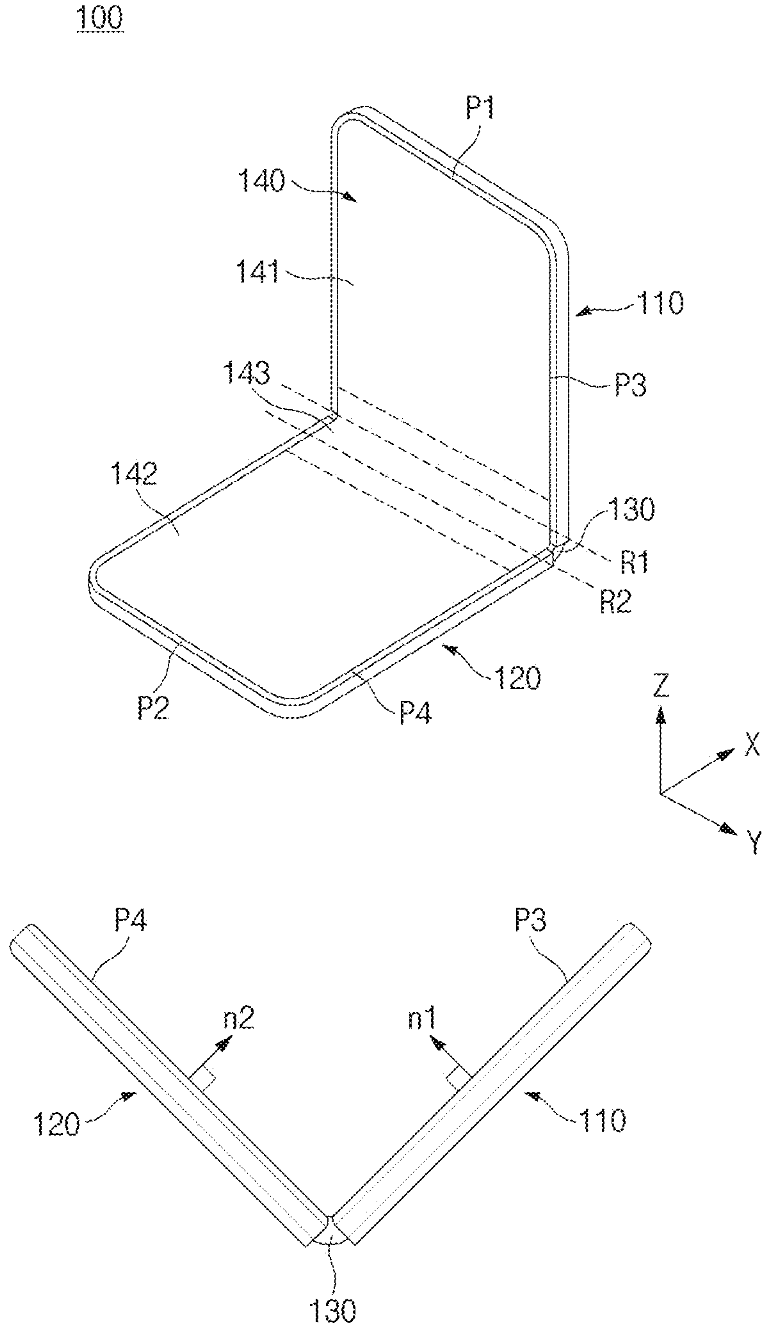
FIG. 2B is a view illustrating an intermediate folded state of the electronic device according to an embodiment.
Figure 2C:
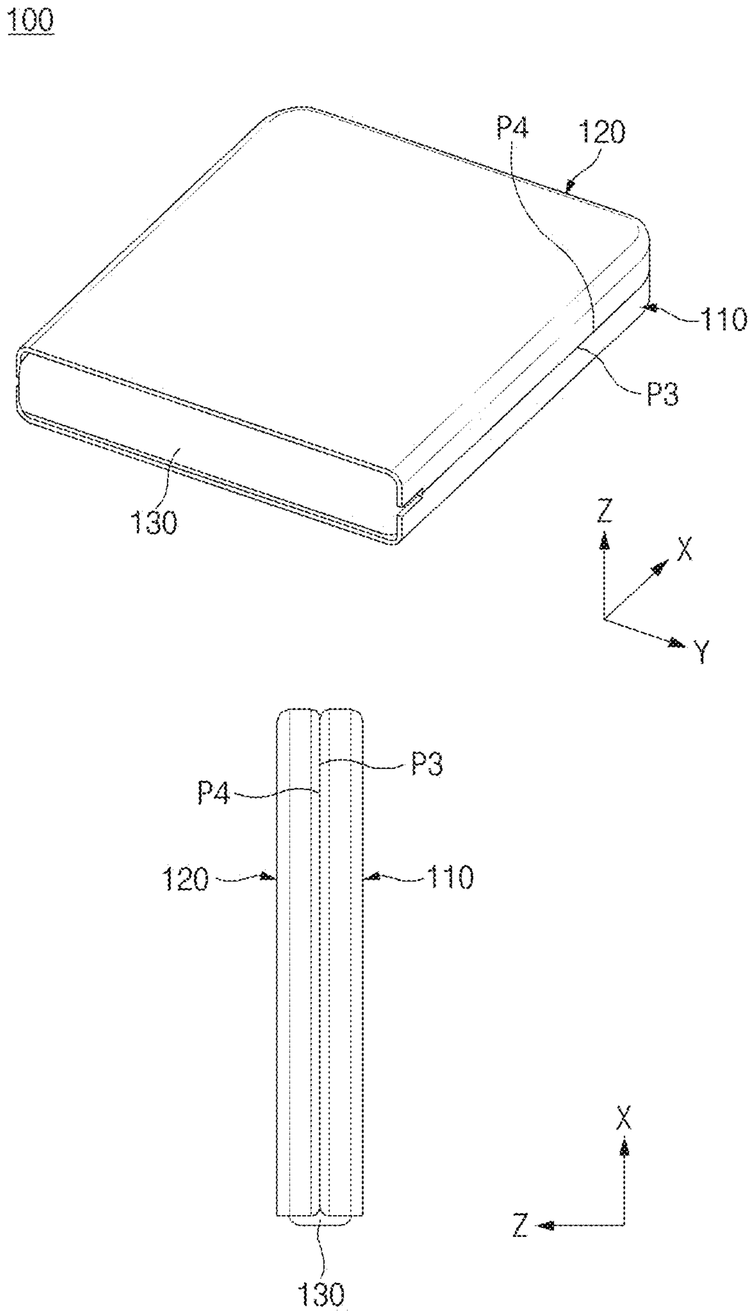
FIG. 2C is a view illustrating a fully folded state of the electronic device according to an embodiment.

FIG. 2A is a view illustrating an unfolded state of the electronic device according to an embodiment. FIG. 2B is a view illustrating an intermediate folded state of the electronic device according to an embodiment. FIG. 2C is a view illustrating a fully folded state of the electronic device according to an embodiment.

Referring to FIGS. 2A, 2B, and 2C, the electronic device 100 according to an embodiment may be configured such that the first housing 110 and the second housing 120 rotate about rotational axes R1 and R2 in opposite directions, respectively. For example, in a folding operation performed in the unfolded state (e.g., the state illustrated in FIG. 2A), the first housing 110 may rotate in the counterclockwise direction based on the drawing, and the second housing 120 may rotate in the clockwise direction based on the drawing.

In FIGS. 2A, 2B, and 2C, a direction parallel to the rotational axes R1 and R2 of the first housing 110 and the second housing 120 may be defined as an axial direction.

The axial direction may mean the extension direction of the folding region 143 of the display 140. For example, the axial direction may be the direction of the long sides of the folding region 143 (e.g., the y-axis direction).

To describe states of the electronic device 100 according to embodiments of the disclosure, a first edge P1 of the electronic device 100 and a second edge P2 of the electronic device 100 that are parallel to the axial direction may be defined, and a third edge P3 of the electronic device 100 and a fourth edge P4 of the electronic device 100 that are perpendicular to the axial direction may be defined. For example, the first edge P1 and the third edge P3 may be a portion of the first frame (e.g., the first frame 112 of FIG. 1) of the first housing 110. For example, the second edge P2 and the fourth edge P4 may be a portion of the second frame (e.g., the second frame 122 of FIG. 1) of the second housing 120.

The unfolded state of the electronic device 100 will be described with reference to FIG. 2A. The unfolded state of the electronic device 100 may mean a state in which the folding region 143 of the display 140 is substantially flat. In the unfolded state, the first region 141 and the second region 142 of the display 140 may be flat and may face the same direction. For example, in the unfolded state, a first normal vector n1 of the first region 141 and a second normal vector n2 of the second region 142 of the display 140 may be substantially parallel to each other and may face the same direction. In the unfolded state, the third edge P3 and the fourth edge P4 may be located on substantially the same line. For example, in the unfolded state, the third edge P3 and the fourth edge P4 may form substantially 180 degrees.

The intermediate folded state of the electronic device 100 will be described with reference to FIG. 2B. The intermediate folded state of the electronic device 100 may mean a state in which the folding region 143 of the display 140 is curved with a curvature smaller than that in the fully folded state. In the intermediate folded state, the first normal vector n1 of the first region 141 and the second normal vector n2 of the second region 142 may form a certain angle rather than 180 degrees. In the intermediate folded state, the third edge P3 and the fourth edge P4 may form a certain angle rather than 180 degrees.

The fully folded state of the electronic device 100 will be described with reference to FIG. 2C. The fully folded state of the electronic device 100 may mean a state in which the folding region 143 of the display 140 is curved with a specified curvature, and the specified curvature may be greater than the curvature in the intermediate folded state. For example, the folding region 143 in the fully folded state may be curved with a curvature greater than that of the folding region 143 in the intermediate folded state. The fully folded state may be the state in which the first edge P1 and the second edge P2 substantially make contact with each other and/or the state in which the third edge P3 and the fourth edge P4 substantially make contact with each other. In the fully folded state, the third edge P3 and the fourth edge P4 may be parallel to each other and may face each other. For example, in the fully folded state, the third edge P3 and the fourth edge P4 may form substantially about 0 degrees. However, the illustrated embodiment is illustrative, and according to various embodiments, the electronic device 100 may be configured such that the third edge P3 and the fourth edge P4 form a certain angle (e.g., an angle smaller than that in the intermediate folded state) in the fully folded state.

The intermediate folded state of the electronic device 100 of the disclosure may be defined as including any intermediate states existing between the unfolded state and the fully folded state when a folding or unfolding operation is performed. For example, the intermediate folded state may include may include a plurality of folded states formed by the electronic device 100 between the start and end of a deformation operation when the electronic device 100 is deformed from the unfolded state to the fully folded state or from the fully folded state to the unfolded state. For example, the intermediate folded state may include states in which the included angle between the third edge P3 and the fourth edge P4 is greater than 0 degrees and less than 180 degrees.

In the intermediate folded state and the fully folded state, at least a portion of the hinge housing 130 may be exposed outside the electronic device 100 and may form the exterior (or, a surface) of the electronic device 100. For example, when the electronic device 100 is in the intermediate folded state or the fully folded state, the hinge housing 130 may be visually exposed between the first housing 110 and the second housing 120. When the electronic device 100 is in the unfolded state, the hinge housing 130 may be hidden by the first housing 110 and the second housing 120 and may not be exposed outside the electronic device 100. However, without being limited to the illustrated embodiment, the electronic device 100 may be configured such that at least a portion of the hinge housing 130 is exposed in the unfolded state.

Figure 3:
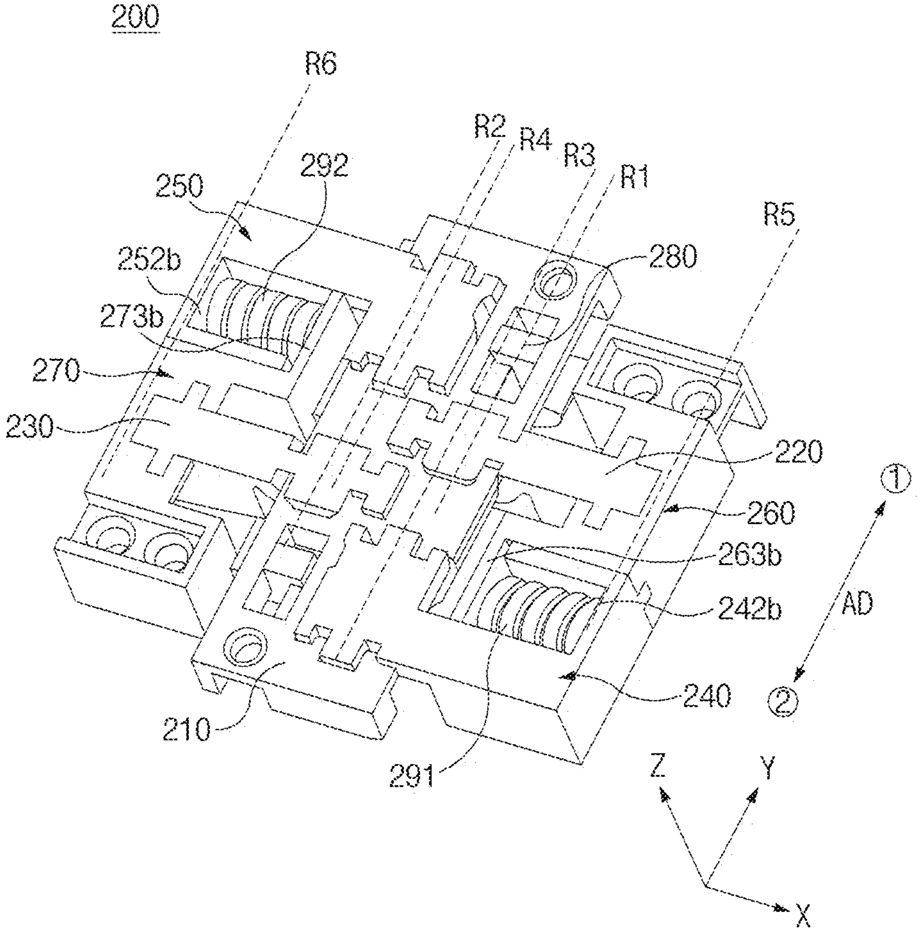
FIG. 3 is a perspective view of a hinge structure of the electronic device according to an embodiment.
Figure 4:
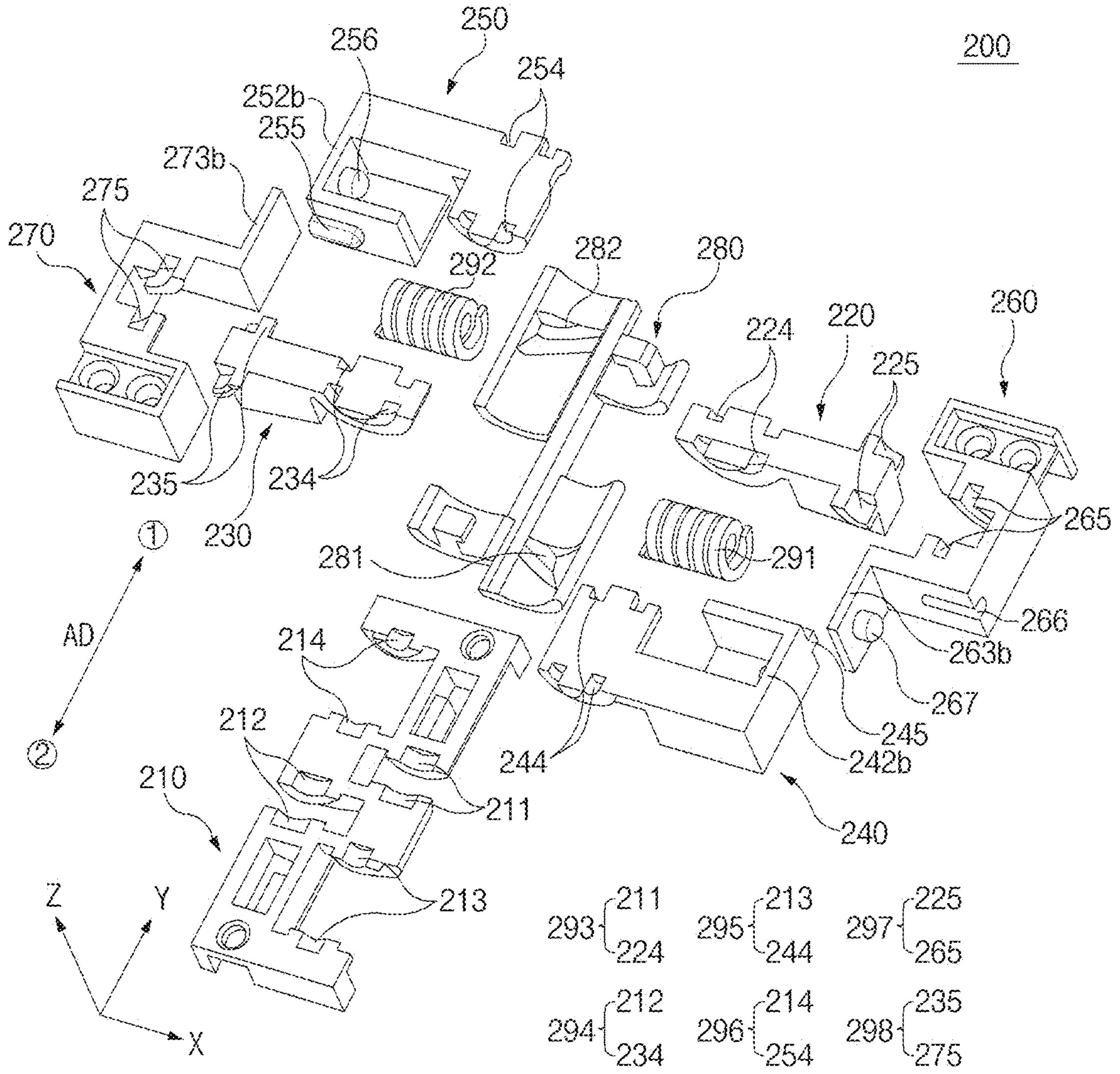
FIG. 4 is an exploded perspective view of the hinge structure of the electronic device according to an embodiment.

FIG. 3 is a perspective view of the hinge structure of the electronic device according to an embodiment. FIG. 4 is an exploded perspective view of the hinge structure of the electronic device according to an embodiment.

Referring to FIGS. 3 and 4, the hinge structure 200 according to an embodiment may include a fixed member 210, the pair of rotary members 220 and 230, a pair of arm members 240 and 250, the pair of coupling members 260 and 270, an interlocking member 280, and a pair of elastic members 291 and 292.

As illustrated in FIGS. 3 to 4, axial directions AD may be defined for the hinge structure 200. The axial directions AD may be directions parallel to rotational axes R1 to R6 of components included in the hinge structure 200. The axial directions AD may include a first direction ① and a second direction ② opposite to each other.

The pair of rotary members 220 and 230 may include the first rotary member 220 and the second rotary member 230 that are connected to one side and an opposite side of the fixed member 210, respectively. The pair of arm members 240 and 250 may include the first arm member 240 and the second arm member 250 that are connected to the one side and the opposite side of the fixed member 210, respectively. The pair of coupling members 260 and 270 may include the first coupling member 260 and the second coupling member 270 that are connected to the first rotary member 220 and the second rotary member 230, respectively. The pair of elastic members 291 and 292 may include the first elastic member 291 connected to the first coupling member 260 and the first arm member 240 and the second elastic member 292 connected to the second coupling member 270 and the second arm member 250.

The fixed member 210 may provide rotational paths along which the rotary members 220 and 230 and the arm members 240 and 250 rotate about rotational axes thereof. For example, the fixed member 210 may be coupled with the rotary members 220 and 230 and may form the rotational axes R1 and R2 of the rotary members 220 and 230. The fixed member 210 may be coupled with the arm members 240 and 250 and may form the rotational axes R3 and R4 of the arm members 240 and 250.

The first rotary member 220 may be coupled to the one side of the fixed member 210 (e.g., in the +x-axis direction) so as to be rotatable about the first axis R1, and the first arm member 240 may be coupled to the one side of the fixed member 210 (e.g., in the +x-axis direction) so as to be rotatable about the third axis R3 that is parallel to the first axis R1 and spaced apart from the first axis R1. For example, the first axis R1 may be formed by a coupling of the fixed member 210 and the first rotary member 220 through a rail structure, and the third axis R3 may be formed by a coupling of the fixed member 210 and the first arm member 240 through a rail structure.

The second rotary member 230 may be coupled to the opposite side of the fixed member 210 (e.g., in the −x-axis direction) so as to be rotatable about the second axis R2, and the second arm member 250 may be coupled to the opposite side of the fixed member 210 (e.g., in the −x-axis direction) so as to be rotatable about the fourth axis R4 that is parallel to the second axis R2 and spaced apart from the second axis R2. For example, the second axis R2 may be formed by a coupling of the fixed member 210 and the second rotary member 230 through a rail structure, and the fourth axis R4 may be formed by a coupling of the fixed member 210 and the second arm member 250 through a rail structure.

The coupling members 260 and 270 may be coupled to the arm members 240 and 250 so as to slide while being coupled to the rotary members 220 and 230 so as to be rotatable. For example, portions of the coupling members 260 and 270 may be coupled to the rotary members 220 and 230 so as to be rotatable, and other portions of the coupling members 260 and 270 may be coupled to the arm members 240 and 250 so as to slide. Accordingly, the coupling members 260 and 270 may perform a rotational movement (or, motion) relative to the rotary members 220 and 230 and may perform a sliding operation relative to the arm members 240 and 250. Based on the sliding operation of the coupling members 260 and 270, the coupling members 260 and 270 may perform a linear movement (or, motion) relative to the arm members 240 and 250. According to various embodiments, the coupling members 260 and 270 may slide along curved paths (e.g., gently curved paths), and based on the sliding operation, the coupling members 260 and 270 may move while rotating through a certain angle (e.g., rotating through a gentle angle) relative to the arm members 240 and 250.

The first coupling member 260 may be coupled to the first rotary member 220 so as to be rotatable about the fifth axis R5. For example, the fifth axis R5 may be formed by a coupling of the first coupling member 260 and the first rotary member 220 through a rail structure. The first coupling member 260 may slide relative to the first arm member 240 in a direction substantially perpendicular to the axial directions AD. However, the disclosure is not limited thereto, and according to various embodiments, the first coupling member 260 may move while rotating relative to the first arm member 240 through a gentle angle.

The first coupling member 260 may be fixedly coupled to the first housing 110 to move together with the first housing (e.g., the first housing 110 of FIG. 1). For example, one portion of the first coupling member 260 may be fixedly coupled to the first housing 110, the first rotary member 220 may be connected to another portion of the first coupling member 260 so as to be rotatable, and the first arm member 240 may be connected to another portion of the first coupling member 260 so as to slide.

The second coupling member 270 may be coupled to the second rotary member 230 so as to be rotatable about the sixth axis R6. For example, the sixth axis R6 may be formed by a coupling of the second coupling member 270 and the second rotary member 230 through a rail structure. The second coupling member 270 may slide relative to the second arm member 250 in a direction substantially perpendicular to the axial directions AD. However, the disclosure is not limited thereto, and according to various embodiments, the second coupling member 270 may move while rotating relative to the second arm member 250 through a gentle angle.

The second coupling member 270 may be fixedly coupled to the second housing 120 to move together with the second housing (e.g., the second housing 120 of FIG. 1). For example, one portion of the second coupling member 270 may be fixedly coupled to the second housing 120, the second rotary member 230 may be connected to another portion of the second coupling member 270 so as to be rotatable, and the second arm member 250 may be connected to another portion of the second coupling member 270 so as to slide.

The hinge structure 200 according to an embodiment of the disclosure may be configured such that rotational axes (e.g., the first axis R1 and the second axis R2) between the fixed member 210 and the rotary members 220 and 230, rotational axes (e.g., the third axis R3 and the fourth axis R4) between the fixed member 210 and the arm members 240 and 250, and rotational axes (e.g., the fifth axis R5 and the sixth axis R6) between the rotary members 220 and 230 and the coupling members 260 and 270 are parallel to each other, but spaced apart from each other without overlapping each other. The rail structures that form the first to sixth axes R1 to R6 will be described below in detail.

The interlocking member 280 may interlock the first arm member 240 and the second arm member 250 such that the first arm member 240 and the second arm member 250 rotate in opposite directions by the same angle. For example, when one of the first arm member 240 and the second arm member 250 rotates in a first rotational direction by a first angle, the interlocking member 280 may rotate the other one by the first angle in the direction opposite to the first rotational direction. An interlocking structure through the interlocking member 280 will be described below in detail with reference to FIG. 10.

The elastic members 291 and 292 may be disposed between the arm members 240 and 250 and the coupling members 260 and 270 and may provide elastic forces. Opposite end portions of the elastic members 291 and 292 may be supported on portions of the arm members 240 and 250 (e.g., support portions 242*b* and 252*b*) and portions of the coupling members 260 and 270 (e.g., support portions 263*b* and 273*b*), and the degrees of compression of the elastic members 291 and 292 may be changed depending on changes in distance between the portions of the arm members 240 and 250 (e.g., the support portions 242*b* and 252*b*) and the portions of the coupling members 260 and 270 (e.g., the support portions 263*b* and 273*b*). The first elastic member 291 may be disposed between the portion 242*b* of the first arm member 240 and the portion 263*b* of the first coupling member 260. The second elastic member 292 may be disposed between the portion 252*b* of the second arm member 250 and the portion 273*b* of the second coupling member 270.

Figure 5:
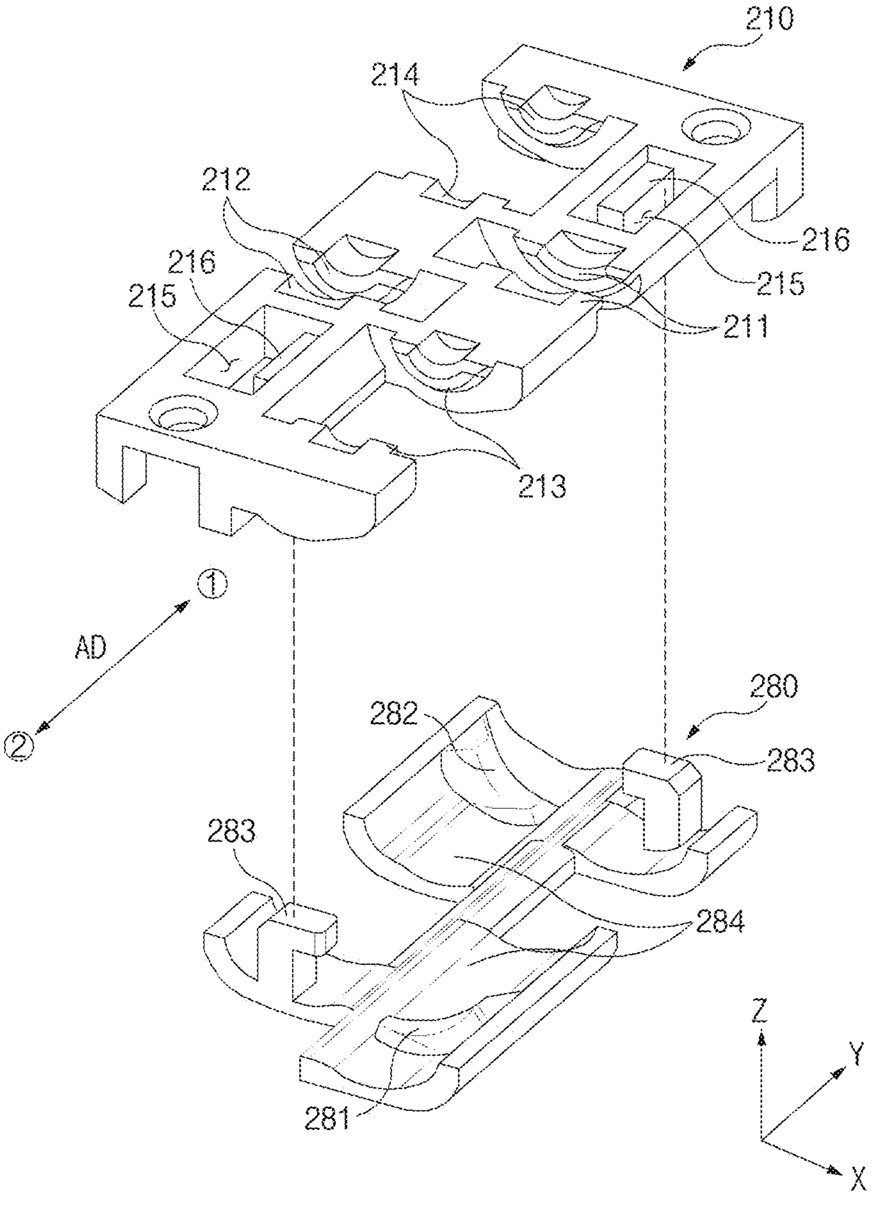
FIG. 5 is a view illustrating a fixed member and an interlocking member of the hinge structure according to an embodiment.
Figure 6:
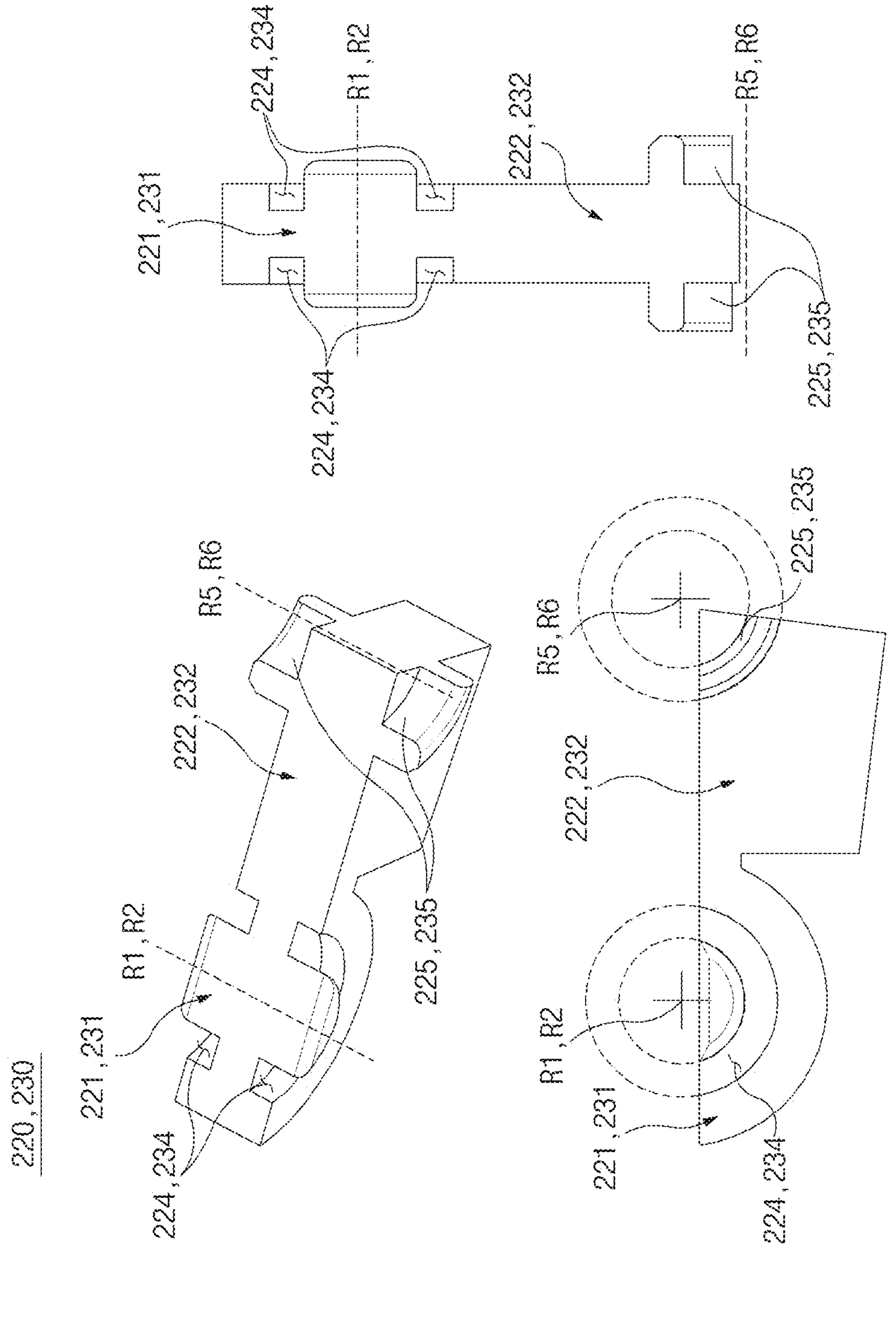
FIG. 6 is a view illustrating rotary members of the hinge structure according to an embodiment.
Figure 7:
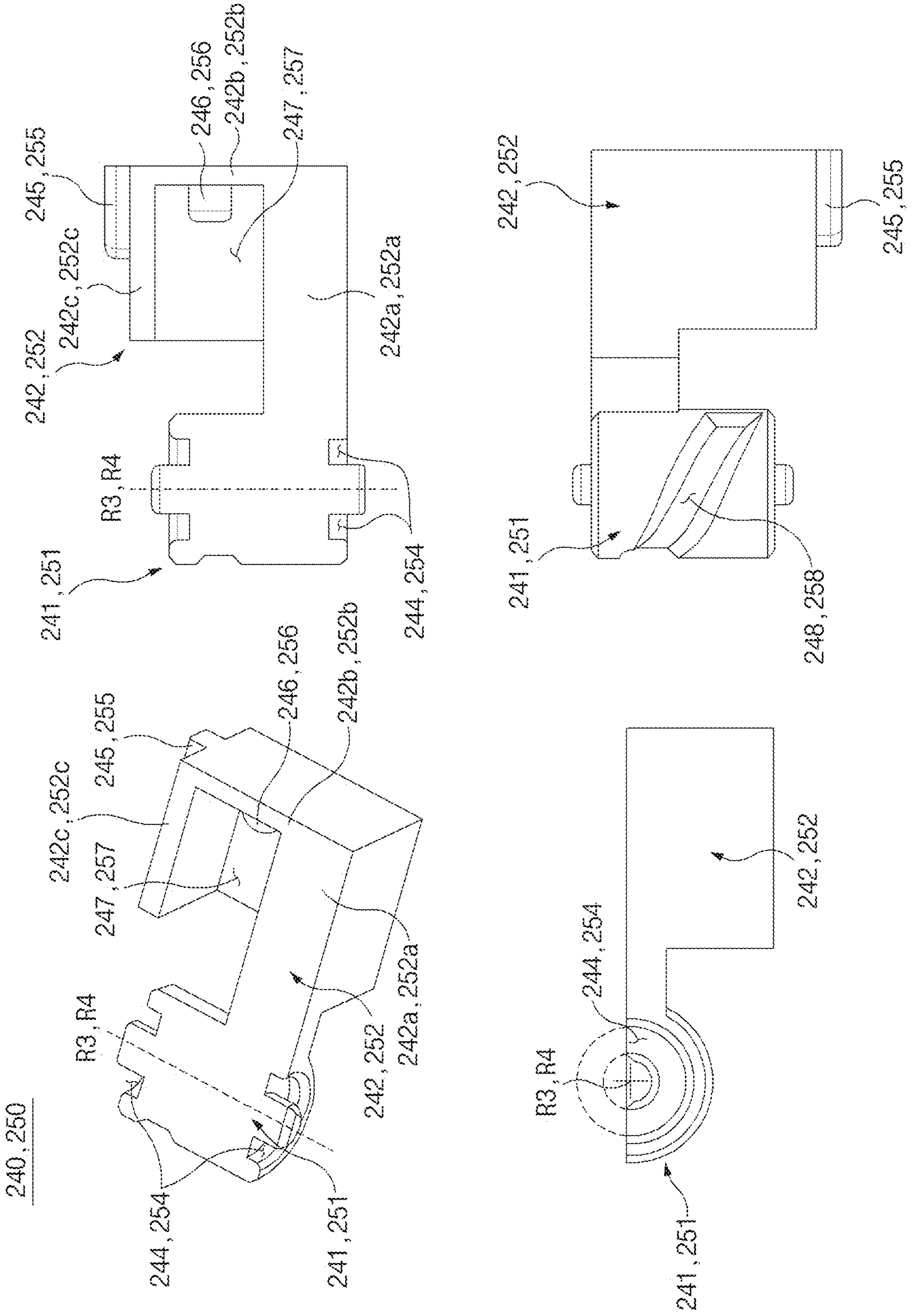
FIG. 7 is a view illustrating arm members of the hinge structure according to an embodiment.
Figure 8:
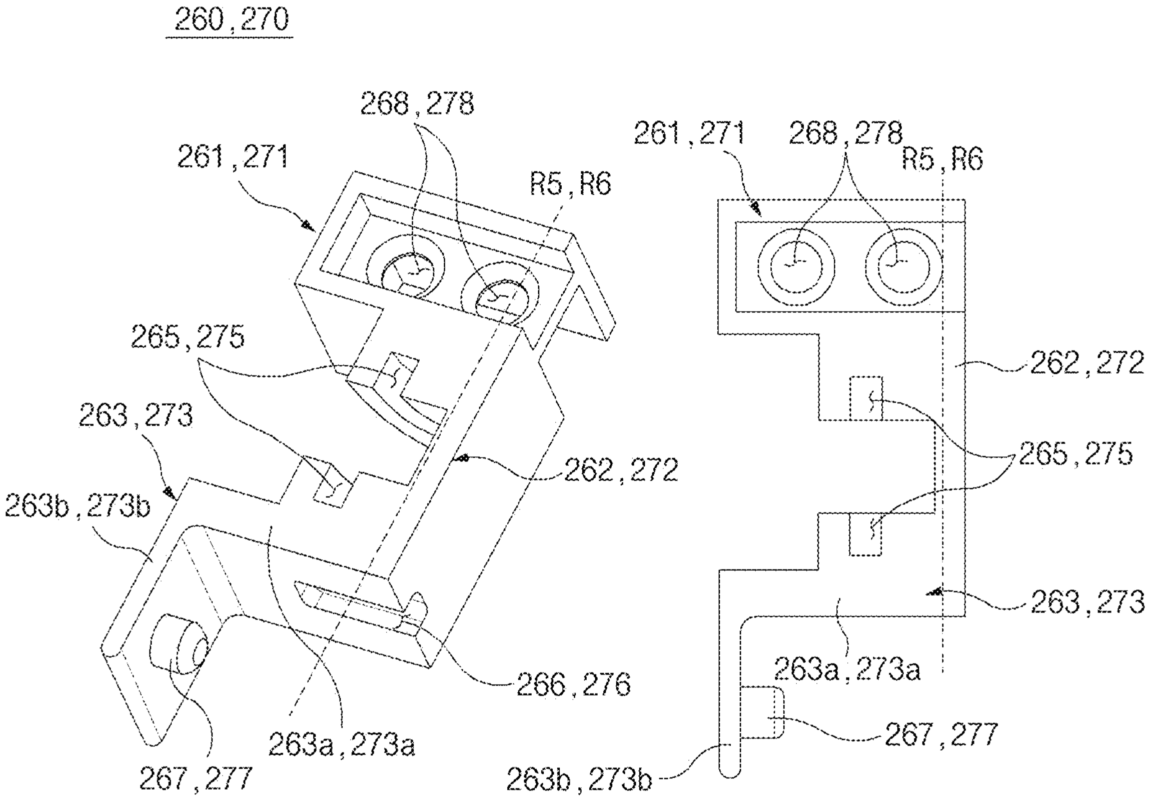
FIG. 8 is a view illustrating coupling members of the hinge structure according to an embodiment.

FIG. 5 is a view illustrating the fixed member and the interlocking member of the hinge structure according to an embodiment. FIG. 6 is a view illustrating the rotary members of the hinge structure according to an embodiment. FIG. 7 is a view illustrating the arm members of the hinge structure according to an embodiment. FIG. 8 is a view illustrating the coupling members of the hinge structure according to an embodiment.

FIGS. 5, 6, 7, and 8 are enlarged views illustrating the fixed member 210, the interlocking member 280, the rotary members 220 and 230, the arm members 240 and 250, and the coupling members 260 and 270 of the hinge structure 200 illustrated in FIGS. 3 and 4. Hereinafter, the components included in the hinge structure 200 and coupling relationships therebetween will be described with reference to FIGS. 3 and 4 together.

Referring to FIGS. 3 to 8, the hinge structure 200 according to an embodiment may include the fixed member 210, the interlocking member 280, the first rotary member 220, the second rotary member 230, the first arm member 240, the second arm member 250, the first coupling member 260, the second coupling member 270, the first elastic member 291, and the second elastic member 292.

At least a portion of the fixed member 210 may be fixedly disposed in an inner portion (e.g., the hinge receiving portion 131 or 132 of FIG. 1) of the hinge housing (e.g., the hinge housing 130 of FIG. 1). The first rotary member 220 and the second rotary member 230 may be coupled to portions of the fixed member 230 so as to be rotatable. The first arm member 240 and the second arm member 250 may be coupled to other portions of the fixed member 210 so as to be rotatable. The interlocking member 280 may be coupled to the fixed member 210 so as to slide.

The fixed member 210 may include first guide protrusions 211 that have an arc shape and guide a rotational path of the first rotary member 220, second guide protrusions 212 that have an arc shape and guide a rotational path of the second rotary member 230, third guide protrusions 213 that guide a rotational path of the first arm member 240, and fourth guide protrusions 214 that guide a rotational path of the second arm member 250.

At least portions of the first guide protrusions 211 may be accommodated in first guide rails 224 of the first rotary member 220. Accordingly, the first guide protrusions 211 and the first guide rails 224 may form a first rail structure 293 for guiding rotation of the first rotary member 220. For example, the fixed member 210 and the first rotary member 220 may be connected through the first rail structure 293 so as to be rotatable about the first axis R1. The first axis R1 may be a virtual axis or a real axis that the first guide protrusions 211 of the first rail structure 293 form while rotating along the first guide rails 224.

At least portions of the second guide protrusions 212 may be accommodated in second guide rails 234 of the second rotary member 230. Accordingly, the second guide protrusions 212 and the second guide rails 234 may form a second rail structure 294 for guiding rotation of the second rotary member 230. For example, the fixed member 210 and the second rotary member 230 may be connected through the second rail structure 294 so as to be rotatable about the second axis R2. The second axis R2 may be a virtual axis or a real axis that the second guide protrusions 212 of the second rail structure 294 form while rotating along the second guide rails 234.

According to the illustrated embodiment, the guide protrusions 211 and 212 may be formed on the fixed member 210, and the guide rails 224 and 234 may be formed on the rotary members 220 and 230. However, this is illustrative, and according to various embodiments, the first rail structure 293 and the second rail structure 294 may be configured such that the first guide protrusions 211 and the second guide protrusions 212 are formed on the rotary members 220 and 230 and the first guide rails 224 and the second guide rails 234 are formed on the fixed member 210.

At least portions of the third guide protrusions 213 may be accommodated in third guide rails 244 of the first arm member 240. Accordingly, the third guide protrusions 213 and the third guide rails 244 may form a third rail structure 295 for guiding rotation of the first arm member 240. For example, the fixed member 210 and the first arm member 240 may be connected through the third rail structure 295 so as to be rotatable about the third axis R3. The second axis R3 may be a virtual axis or a real axis that the third guide protrusions 213 of the third rail structure 295 form while rotating along the third guide rails 244.

At least portions of the fourth guide protrusions 214 may be accommodated in fourth guide rails 254 of the second arm member 250. Accordingly, the fourth guide protrusions 214 and the fourth guide rails 254 may form a fourth rail structure 296 for guiding rotation of the second arm member 250. For example, the fixed member 210 and the second arm member 250 may be connected through the fourth rail structure 296 so as to be rotatable about the fourth axis R4. The fourth axis R4 may be a virtual axis or a real axis that the fourth guide protrusions 214 of the fourth rail structure 296 form while rotating along the fourth guide rails 254.

According to the illustrated embodiment, the guide protrusions 213 and 214 may be formed on the fixed member 210, and the guide rails 244 and 254 may be formed on the arm members 240 and 250. However, this is illustrative, and according to various embodiments, the third rail structure 295 and the fourth rail structure 296 may be configured such that the third guide protrusions 213 and the fourth guide protrusions 214 are formed on the arm members 240 and 250 and the third guide rails 244 and the fourth guide rails 254 are formed on the fixed member 210.

The fixed member 210 may include coupling holes 215 to which at least portions of the interlocking member 280 are coupled so as to slide. For example, locking protrusions 283 of the interlocking member 280 may be accommodated in the coupling holes 215, and steps 216 by which the locking protrusions 283 are stopped may be formed in the coupling holes 215. The coupling holes 215 may extend a predetermined length in the axial directions AD (e.g., the y-axis direction).

The interlocking member 280 may be coupled to the fixed member 210 so as to slide in the axial directions AD. For example, the interlocking member 280 may rotationally interlock the first arm member 240 with the second arm member 250 through a sliding operation. In various embodiments, the interlocking member 280 may be referred to as a slider. The interlocking member 280 may be disposed under the fixed member 210 (e.g., in the −z-axis direction). For example, the interlocking member 280 may be located between the fixed member 210 and the hinge housing 130 when the hinge structure 200 is coupled to the hinge housing 130. The interlocking member 280 may include the locking protrusions 283 protruding toward the fixed member 210 (e.g., in the +z-axis direction) from partial regions of an upper surface 284 facing toward the fixed member 210. The locking protrusions 283 may be accommodated in the coupling holes 215 of the fixed member 210 and may be stopped by and fastened to the steps 216. The interlocking member 280 may perform a linear motion in the axial directions AD depending on rotation of the arm members 240 and 250 in the state in which the locking protrusions 283 are stopped by the steps 216.

The interlocking member 280 may include inclined protrusions 281 and 282 formed on the upper surface 284. The inclined protrusions 281 and 282 may be accommodated in inclined grooves 248 and 258 formed on the arm members 240 and 250. Since the inclined protrusions 281 and 282 are accommodated in the inclined grooves 248 and 258, the interlocking member 280 may perform a linear motion in the axial directions AD when the arm members 240 and 250 rotate. The inclined protrusions 281 and 282 may include the first inclined protrusion 281 corresponding to the first arm member 240 and the second inclined protrusion 282 corresponding to the second arm member 250. Since the interlocking member 280 is coupled to the arm members 240 and 250 through the inclined protrusions 281 and 282, the interlocking member 280 may rotationally interlock the first arm member 240 with the second arm member 250.

According to various embodiments (e.g., refer to FIGS. 20, 21, and 22), the interlocking member 280 may rotationally interlock the first arm member 240 with the second arm member 250 through gears instead of a sliding operation.

The first rotary member 220 may rotate relative to the fixed member 210 and the first coupling member 260 when the electronic device (e.g., the electronic device 100 of FIGS. 1, 2A, 2B, and 2C) is folded or unfolded. For example, the first rotary member 220 may rotate along a specified path (e.g., an arc-shaped path whose center coincides with the first axis R1) relative to the fixed member 210 that is fixed to the hinge housing 130. The first rotary member 220 may rotate along a specified path (e.g., an arc-shaped path whose center coincides with the fifth axis R5) relative to the first coupling member 260 that is fixed to the first housing 110.

The first rotary member 220 may include a first coupling part 221 connected to the one side of the fixed member 210 (e.g., in the +x-axis direction) so as to be rotatable about the first axis R1 and a second coupling part 222 that extends from the first coupling part 221 and to which the first coupling member 260 is connected so as to be rotatable about the fifth axis R5.

The first rotary member 220 may include, on the first coupling part 221, the first guide rails 224 to which the first guide protrusions 211 of the fixed member 210 are coupled so as to be rotatable. The first guide rails 224 and the first guide protrusions 211 may be formed in shapes corresponding to each other. For example, at least partial regions on surfaces of the first coupling part 221 that face in the axial directions AD may be recessed in a shape corresponding to the first guide rails 224 to form the first guide rails 224.

The first guide rails 224 of the first rotary member 220 may be formed in a substantially arc shape. For example, the first rotary member 220 may rotate about the center of the arc relative to the fixed member 210, based on an operation in which the first guide protrusions 211 of the fixed member 210 move in the arc-shaped first guide rails 224. The centers of the arcs of the first guide rails 224 may coincide with the first axis R1. For example, the first rotary member 210 may rotate relative to the fixed member 210 along an arc-shaped rotational path whose center coincides with the first axis R1.

The first rotary member 220 may include, on the second coupling part 222, fifth guide protrusions 225 at least partially accommodated in fifth guide rails 265 of the first coupling member 260. For example, the fifth guide protrusions 225 may protrude from partial regions of the second coupling part 222 in the axial directions AD. The fifth guide protrusions 225 of the first rotary member 220 and the fifth guide rails 265 of the first coupling member 260 may form a fifth rail structure 297 for guiding relative rotation between the first rotary member 220 and the first coupling member 260. For example, the first rotary member 220 and the first coupling member 260 may be connected through the fifth rail structure 297 so as to be rotatable about the fifth axis R5. The fifth guide protrusions 225 and the fifth guide rails 265 may be formed in shapes corresponding to each other. The fifth axis R5 may be a virtual axis formed by the fifth rail structure 297.

The second rotary member 230 may rotate relative to the fixed member 210 and the second coupling member 270 when the electronic device 100 is folded or unfolded. For example, the second rotary member 230 may rotate along a specified path (e.g., an arc-shaped path whose center coincides with the second axis R2) relative to the fixed member 210 that is fixed to the hinge housing 130. The second rotary member 230 may rotate along a specified path (e.g., an arc-shaped path whose center coincides with the sixth axis R6) relative to the second coupling member 270 that is fixed to the second housing 120.

The second rotary member 230 may include a third coupling part 231 connected to the opposite side of the fixed member 210 (e.g., in the −x-axis direction) so as to be rotatable about the second axis R2 and a fourth coupling part 232 that extends from the third coupling part 231 and to which the second coupling member 270 is connected so as to be rotatable about the sixth axis R6.

The second rotary member 230 may include, on the third coupling part 231, the second guide rails 234 to which the second guide protrusions 212 of the fixed member 210 are coupled so as to be rotatable. The second guide rails 234 and the second guide protrusions 212 may be formed in shapes corresponding to each other. For example, at least partial regions on surfaces of the second coupling part 231 that face in the axial directions AD may be recessed in a shape corresponding to the second guide rails 234 to form the second guide rails 234.

The second guide rails 234 of the second rotary member 230 may be formed in a substantially arc shape. For example, the second rotary member 230 may rotate about the center of the arc relative to the fixed member 210, based on an operation in which the second guide protrusions 212 of the fixed member 210 move in the arc-shaped second guide rails 234. The centers of the arcs of the second guide rails 234 may coincide with the second axis R2. For example, the second rotary member 230 may rotate relative to the fixed member 210 along an arc-shaped rotational path whose center coincides with the second axis R2.

The second rotary member 230 may include, on the fourth coupling part 232, sixth guide protrusions 235 at least partially accommodated in sixth guide rails 275 of the second coupling member 270. For example, the sixth guide protrusions 235 may protrude from partial regions of the fourth coupling part 232 in the axial directions AD. The sixth guide protrusions 235 of the second rotary member 230 and the sixth guide rails 275 of the second coupling member 270 may form a sixth rail structure 298 for guiding relative rotation between the second rotary member 230 and the second coupling member 270. For example, the second rotary member 230 and the second coupling member 270 may be connected through the sixth rail structure 298 so as to be rotatable about the sixth axis R6. The sixth guide protrusions 235 and the sixth guide rails 275 may be formed in shapes corresponding to each other. The sixth axis R6 may be a virtual axis formed by the sixth rail structure 298.

According to various embodiments, the fifth rail structure 297 and the sixth rail structure 298 may be configured such that the fifth guide protrusions 225 and the sixth guide protrusions 235 are formed on the coupling members 260 and 270 and the fifth guide rails 265 and the sixth guide rails 275 are formed on the rotary members 220 and 230.

Although not illustrated in FIGS. 3 to 8, the first rotary member 220 and the second rotary member 230 may be coupled with rotary plates (e.g., rotary plates 150 and 160 of FIGS. 16A, 16B, and 17) that support the display 140. The rotary plates 150 and 160 may rotate together with the first rotary member 220 and the second rotary member 230. The rotary plates 150 and 160 may support the display 140 while rotating together with the rotary members 220 and 230 when the electronic device 100 is folded or unfolded. A coupling structure of the rotary plates 150 and 160 and the rotary members 220 and 230 and an operation in which the rotary plates 150 and 160 support the display 140 will be described below in detail with reference to FIGS. 16 to 18.

The first arm member 240 may rotate relative to the fixed member 210 and slide relative to the first coupling member 260 when the electronic device 100 is folded or unfolded. For example, the first arm member 240 may rotate along a specified path (e.g., an arc-shaped path whose center coincides with the third axis R3) relative to the fixed member 210 that is fixed to the hinge housing 130. The first arm member 240 may linearly move relative to the first coupling member 260 in a direction perpendicular to the axial directions AD.

The first arm member 240 may include a fifth coupling part 241 coupled to the one side of the fixed member 210 (e.g., in the +x-axis direction) so as to be rotatable about the third axis R3 and a sixth coupling part 242 that extends from the fifth coupling part 241 and that is connected with the first coupling member 260 so as to slide.

The first arm member 240 may include, on the fifth coupling part 241, the third guide rails 244 to which the third guide protrusions 213 of the fixed member 210 are coupled so as to be rotatable. For example, at least partial regions on surfaces of the fifth coupling part 241 that face in the axial directions AD may be recessed in a shape corresponding to the third guide rails 244 to form the third guide rails 244. The third guide rails 244 and the third guide protrusions 213 may be formed in shapes corresponding to each other. The first inclined groove 248, in which at least a portion of the first inclined protrusion 281 of the interlocking member 280 is accommodated, may be formed on the fifth coupling part 241. For example, the first inclined groove 248 may be formed in a shape obliquely recessed along an outer circumferential surface of the fifth coupling part 241.

The third guide rails 244 of the first arm member 240 may be formed in a substantially arc shape. For example, the first arm member 240 may rotate about the center of the arc relative to the fixed member 210, based on an operation in which the third guide protrusions 213 of the fixed member 210 move in the arc-shaped third guide rails 244. The centers of the arcs of the third guide rails 244 may coincide with the third axis R3. For example, the first arm member 240 may rotate relative to the fixed member 210 along an arc-shaped rotational path whose center coincides with the third axis R3.

The first arm member 240 may include, on the sixth coupling part 242, a first slide protrusion 245 at least partially accommodated in a first slide groove 266 of the first coupling member 260. The first slide protrusion 245 may be formed in a shape corresponding to the first slide groove 266. The first slide protrusion 245 and the first slide groove 266 may guide a sliding path between the first arm member 240 and the first coupling member 260. For example, the first slide protrusion 245 and the first slide groove 266 may extend in a direction perpendicular to the axial directions AD. However, the shape of the first slide protrusion 245 is not limited to the illustrated embodiment. For example, only the first slide groove 266 may extend in the direction perpendicular to the axial directions AD, and the first slide protrusion 245 may be formed in a cylindrical shape capable of being accommodated in the first slide groove 266.

In a folding or unfolding operation of the electronic device 100, when the first rotary member 220 and the first coupling member 260 rotate about the first axis R1 relative to the fixed member 210, the first arm member 240 may slide relative to the first coupling member 260 while rotating relative to the fixed member 210 about the third axis R3 spaced apart from the first axis R1. For example, the first arm member 240 may slide relative to the first coupling member 260 as the first slide protrusion 245 linearly moves along the first slide groove 266.

The sixth coupling part 242 of the first arm member 240 may include a first extending portion 242*a* extending from the fifth coupling part 241 in a direction perpendicular to the axial directions AD, the first support portion 242*b* extending perpendicular to the first extending portion 242*a* from the first extending portion 242*a*, and a second extending portion 242*c* extending perpendicular to the first support portion 242*b* from the first support portion 242*b*. The second extending portion 242*c* may face one portion of the first coupling member 260 on which the first slide groove 266 is formed, and the first slide protrusion 245 may be formed on the second extending portion 242*c*. For example, the first slide protrusion 245 may protrude in the axial direction AD from a partial region of the second extending portion 242*c* toward the first coupling member 260.

The first arm member 240 may have, in the sixth coupling part 242, a space in which the first elastic member 291 is accommodated. The first extending portion 242*a*, the first support portion 242*b*, and the second extending portion 242*c* may form a first receiving groove 247 in which the first elastic member 291 is accommodated. For example, the first receiving groove 247 may be surrounded by the first extending portion 242*a*, the first support portion 242*b*, and the second extending portion 242*c*. The first support portion 242*b* may support a first end portion of the first elastic member 291. For example, a first support protrusion 246 accommodated in the first elastic member 291 may be formed on the first support portion 242*b*. For example, the first support protrusion 246 may protrude from a partial region of the first support portion 242*b* toward the fifth coupling part 241 or the fixed member 210. The first support portion 242*b* may face the third support portion 263*b* of the first coupling member 260.

The second arm member 250 may rotate relative to the fixed member 210 and slide relative to the second coupling member 270 when the electronic device 100 is folded or unfolded. For example, the second arm member 250 may rotate along a specified path (e.g., an arc-shaped path whose center coincides with the fourth axis R4) relative to the fixed member 210 that is fixed to the hinge housing 130. The second arm member 250 may linearly move relative to the second coupling member 270 in a direction perpendicular to the axial directions AD.

The second arm member 250 may include a seventh coupling part 251 coupled to the other side of the fixed member 210 (e.g., in the −x-axis direction) so as to be rotatable about the fourth axis R4 and an eighth coupling part 252 that extends from the seventh coupling part 251 and that is connected with the second coupling member 270 so as to slide.

The second arm member 250 may include, on the seventh coupling part 251, the fourth guide rails 254 to which the fourth guide protrusions 214 of the fixed member 210 are coupled so as to be rotatable. For example, at least partial regions on surfaces of the seventh coupling part 251 that face in the axial directions AD may be recessed in a shape corresponding to the fourth guide rails 254 to form the fourth guide rails 254. The fourth guide rails 254 and the fourth guide protrusions 214 may be formed in shapes corresponding to each other. The second inclined groove 258, in which at least a portion of the second inclined protrusion 282 of the interlocking member 280 is accommodated, may be formed on the seventh coupling part 251. For example, the second inclined groove 258 may be formed in a shape obliquely recessed along an outer circumferential surface of the seventh coupling part 251.

The fourth guide rails 254 of the second arm member 250 may be formed in a substantially arc shape. For example, the second arm member 250 may rotate about the center of the arc relative to the fixed member 210, based on an operation in which the fourth guide protrusions 214 of the fixed member 210 move in the arc-shaped fourth guide rails 254. The centers of the arcs of the fourth guide rails 254 may coincide with the fourth axis R4. For example, the second arm member 250 may rotate relative to the fixed member 210 along an arc-shaped rotational path whose center coincides with the fourth axis R4.

The second arm member 250 may include, on the eighth coupling part 252, a second slide protrusion 255 at least partially accommodated in a second slide groove 276 of the second coupling member 270. The second slide protrusion 255 may be formed in a shape corresponding to the second slide groove 276. The second slide protrusion 255 and the second slide groove 276 may guide a sliding path between the second arm member 250 and the second coupling member 270. For example, the second slide protrusion 255 and the second slide groove 276 may extend in a direction perpendicular to the axial directions AD. However, the shape of the second slide protrusion 255 is not limited to the illustrated embodiment.

In a folding or unfolding operation of the electronic device 100, when the second rotary member 230 and the second coupling member 270 rotate about the second axis R2 relative to the fixed member 210, the second arm member 250 may slide relative to the second coupling member 270 while rotating relative to the fixed member 210 about the fourth axis R4 spaced apart from the second axis R2. For example, the second arm member 250 may slide relative to the second coupling member 270 as the second slide protrusion 255 linearly moves along the second slide groove 276.

The eighth coupling part 252 of the second arm member 250 may include a third extending portion 252*a* extending from the seventh coupling part 251 in a direction perpendicular to the axial directions AD, the second support portion 252*b* extending perpendicular to the third extending portion 252*a* from the third extending portion 252*a*, and a fourth extending portion 252*c* extending perpendicular to the second support portion 252*b* from the second support portion 252*b*. The fourth extending portion 252*c* may face one portion of the second coupling member 270 on which the second slide groove 276 is formed, and the second slide protrusion 255 may be formed on the fourth extending portion 252*c*. For example, the second slide protrusion 255 may protrude in the axial direction AD from a partial region of the fourth extending portion 252*c* toward the second coupling member 270.

The second arm member 250 may have, in the eighth coupling part 252, a space in which the second elastic member 292 is accommodated. The third extending portion 252*a*, the second support portion 252*b*, and the fourth extending portion 252*c* may form a second receiving groove 257 in which the second elastic member 292 is accommodated. For example, the second receiving groove 257 may be surrounded by the third extending portion 252*a*, the second support portion 252*b*, and the fourth extending portion 252*c*. The second support portion 252*b* may support a first end portion of the second elastic member 292. For example, a second support protrusion 256 accommodated in the second elastic member 292 may be formed on the second support portion 252*b*. For example, the second support protrusion 256 may protrude from a partial region of the second support portion 252*b* toward the seventh coupling part 252 or the fixed member 210. The second support portion 252*b* may face the fourth support portion 273*b* of the second coupling member 270.

The first coupling member 260 may be coupled to the first rotary member 220 to rotate about the first axis R1 together with the first rotary member 220 and rotate about the fifth axis R5 relative to the first rotary member 220. The first coupling member 260 may be coupled to the first arm member 240 so as to slide. The first coupling member 260 may be fixedly coupled to the first housing 110 to connect the hinge structure 200 and the first housing 110. For example, the first coupling member 260 and the first housing 110 may move together.

The first coupling member 260 may include a first part 261 coupled to the first housing 110, a second part 262 that extends from the first part 261 and to which the first rotary member 220 is coupled so as to be rotatable, and a third part 263 that extends from the second part 262 and to which the first arm member 240 is coupled so as to slide. The first coupling member 260 may have a shape in which the first part 261, the second part 262, and the third part 263 are disposed in the axial directions AD.

The first part 261 of the first coupling member 260 may be fixedly coupled to the first housing 110. For example, screw fastening holes 268 for screw coupling with the first housing 110 (e.g., refer to FIG. 9) may be formed in the first part 261. However, a coupling method of the first part 261 and the first housing 110 is not limited to the above-described example.

The first coupling member 260 may include, in the second part 262, the fifth guide rails 265 to which the fifth guide protrusions 225 of the first rotary member 220 are coupled so as to be rotatable. For example, at least portions of the fifth guide protrusions 225 may be accommodated in the fifth guide rails 265. The fifth guide rails 265 and the fifth guide protrusions 225 may be formed in shapes corresponding to each other. For example, partial regions on one surface of the second part 262 that substantially perpendicular to the axial directions AD may be recessed to form the fifth guide rails 265.

The fifth guide rails 265 of the first coupling member 260 may be formed in a substantially arc shape. For example, the first coupling member 260 may rotate about the center of the arc relative to the first rotary member 220, based on an operation in which the fifth guide protrusions 225 of the first rotary member 220 move in the arc-shaped fifth guide rails 265. The centers of the arcs of the fifth guide rails 265 may coincide with the fifth axis R5. For example, the first coupling member 260 may rotate relative to the first rotary member 220 along an arc-shaped rotational path whose center coincides with the fifth axis R5.

The third part 263 of the first coupling member 260 may include a fifth extending portion 263*a* extending from the second part 262 and the third support portion 263*b* extending from the fifth extending portion 263*a*. For example, the fifth extending portion 263*a* may be connected with the second part 262, and the third support portion 263*b* may extend substantially perpendicular to the fifth extending portion 263*a*.

The fifth extending portion 263*a* of the first coupling member 260 may face the second extending portion 242*c* of the first arm member 240. For example, the fifth extending portion 263*a* of the first coupling member 260 and the second extending portion 242*c* of the first arm member 240 may be disposed to face each other. The fifth extending portion 263*a* may have the first slide groove 266 in which the first slide protrusion 245 of the first arm member 240 is accommodated.

The third support portion 263*b* of the first coupling member 260 may face the first support portion 242*b* of the first arm member 240. For example, the third support portion 263*b* of the first coupling member 260 and the first support portion 242*b* of the first arm member 240 may be disposed to face each other in a direction substantially perpendicular to the axial directions AD. For example, the third support portion 263*b* of the first coupling member 260 and the first support portion 242*b* of the first arm member 240 may be disposed to partially overlap each other in the direction in which the first slide groove 266 extends. The third support portion 263*b* may support the first elastic member 291 together with the first support portion 242*b*. The third support portion 263*b* may support a second end portion of the first elastic member 291. For example, a third support protrusion 267 accommodated in the first elastic member 291 may be formed on the third support portion 263*b*. For example, the third support protrusion 267 may protrude from a partial region of the third support portion 263*b* toward the first support portion 242*b*.

The second coupling member 270 may be coupled to the second rotary member 230 to rotate about the second axis R2 together with the second rotary member 230 and rotate about the sixth axis R6 relative to the second rotary member 230. The second coupling member 270 may be coupled to the second arm member 250 so as to slide. The second coupling member 270 may be fixedly coupled to the second housing 120 to connect the hinge structure 200 and the second housing 120. For example, the second coupling member 270 and the second housing 120 may move together.

The first coupling member 270 may include a fourth part 271 coupled to the second housing 120, a fifth part 272 that extends from the fourth part 271 and to which the second rotary member 230 is coupled so as to be rotatable, and a sixth part 273 that extends from the fifth part 272 and to which the second arm member 250 is coupled so as to slide. The second coupling member 270 may have a shape in which the fourth part 271, the fifth part 272, and the sixth part 273 are disposed in the axial directions AD.

The fourth part 271 of the second coupling member 270 may be fixedly coupled to the second housing 120. For example, screw fastening holes 278 for screw coupling with the second housing 120 (e.g., refer to FIG. 9) may be formed in the fourth part 271. However, a coupling method of the fourth part 271 and the second housing 120 is not limited to the above-described example.

The second coupling member 270 may include, in the fifth part 272, the sixth guide rails 275 to which the sixth guide protrusions 235 of the second rotary member 230 are coupled so as to be rotatable. For example, at least portions of the sixth guide protrusions 235 may be accommodated in the sixth guide rails 275. The sixth guide rails 275 and the sixth guide protrusions 235 may be formed in shapes corresponding to each other. For example, partial regions on one surface of the fifth part 272 that substantially perpendicular to the axial directions AD may be recessed to form the sixth guide rails 275.

The sixth guide rails 275 of the second coupling member 270 may be formed in a substantially arc shape. For example, the second coupling member 270 may rotate about the center of the arc relative to the second rotary member 230, based on an operation in which the sixth guide protrusions 235 of the second rotary member 230 move in the arc-shaped sixth guide rails 275. The centers of the arcs of the sixth guide rails 275 may coincide with the sixth axis R6. For example, the second coupling member 270 may rotate relative to the second rotary member 230 along an arc-shaped rotational path whose center coincides with the sixth axis R6.

The sixth part 273 of the second coupling member 270 may include a sixth extending portion 273*a* extending from the fourth part 271 and the fourth support portion 273*b* extending from the sixth extending portion 273*a*. For example, the sixth extending portion 273*a* may be connected with the fourth part 271, and the fourth support portion 273*b* may extend substantially perpendicular to the sixth extending portion 273*a*.

The sixth extending portion 273*a* of the second coupling member 270 may face the fourth extending portion 252*c* of the second arm member 250. For example, the sixth extending portion 273*a* of the second coupling member 270 and the fourth extending portion 252*c* of the second arm member 250 may be disposed to face each other. The sixth extending portion 273*a* may have the second slide groove 276 in which the second slide protrusion 255 of the second arm member 250 is accommodated.

The fourth support portion 273*b* of the second coupling member 270 may face the second support portion 252*b* of the second arm member 250. For example, the fourth support portion 273*b* of the second coupling member 270 and the second support portion 252*b* of the second arm member 250 may be disposed to face each other in a direction substantially perpendicular to the axial directions AD. For example, the fourth support portion 273*b* of the second coupling member 270 and the second support portion 252*b* of the second arm member 250 may be disposed to partially overlap each other in the direction in which the second slide groove 276 extends. The fourth support portion 273*b* may support the second elastic member 292 together with the second support portion 252*b*. The fourth support portion 273*b* may support a second end portion of the second elastic member 292. For example, a fourth support protrusion 277 accommodated in the second elastic member 292 may be formed on the fourth support portion 273*b*. For example, the fourth support protrusion 277 may protrude from a partial region of the fourth support portion 273*b* toward the second support portion 252*b*.

The first elastic member 291 may be compressed or uncompressed in response to a linear reciprocating motion between the first arm member 240 and the first coupling member 260 when the first rotary member 220, the first arm member 240, and the first coupling member 260 rotate relative to the fixed member 210. For example, the first elastic member 291 may be accommodated in the first receiving groove 247 of the first arm member 240. One end portion of the first elastic member 291 may be supported by the first support portion 242*b* of the first arm member 240, and an opposite end portion of the first elastic member 291 may be supported by the third support portion 263*b* of the first coupling member 260.

The second elastic member 292 may be compressed or uncompressed in response to a linear reciprocating motion between the second arm member 250 and the second coupling member 270 when the second rotary member 230, the second arm member 250, and the second coupling member 270 rotate relative to the fixed member 210. For example, the second elastic member 292 may be accommodated in the second receiving groove 257 of the second arm member 250. One end portion of the second elastic member 292 may be supported by the second support portion 252*b* of the second arm member 250, and an opposite end portion of the second elastic member 292 may be supported by the fourth support portion 273*b* of the second coupling member 270.

The hinge structure 200 according to an embodiment of the disclosure may be configured such that a linear reciprocating motion occurs between the arm members 240 and 250 and the coupling members 260 and 270 in an unfolding operation and a folding operation of the electronic device 100. The rotational axes (e.g., the third axis R3 and the fourth axis R4) of the arm members 240 and 250 with respect to the fixed member 210 and the rotational axes (e.g., the first axis R1 and the second axis R2) of the coupling members 260 and 270 (or, the rotary members 220 and 230) with respect to the fixed member 210 may be designed at positions where the reciprocating motion is able to occur. The elastic members 291 and 292 may provide a detent function by generating forces resisting rotation as the degree of compression is changed in response to the reciprocal linear motion between the arm members 240 and 250 and the coupling members 260 and 270. An operation in which the arm members 240 and 250 and the coupling members 260 and 270 perform a linear reciprocating motion and a detent operation will be described below in detail.

Figure 9:
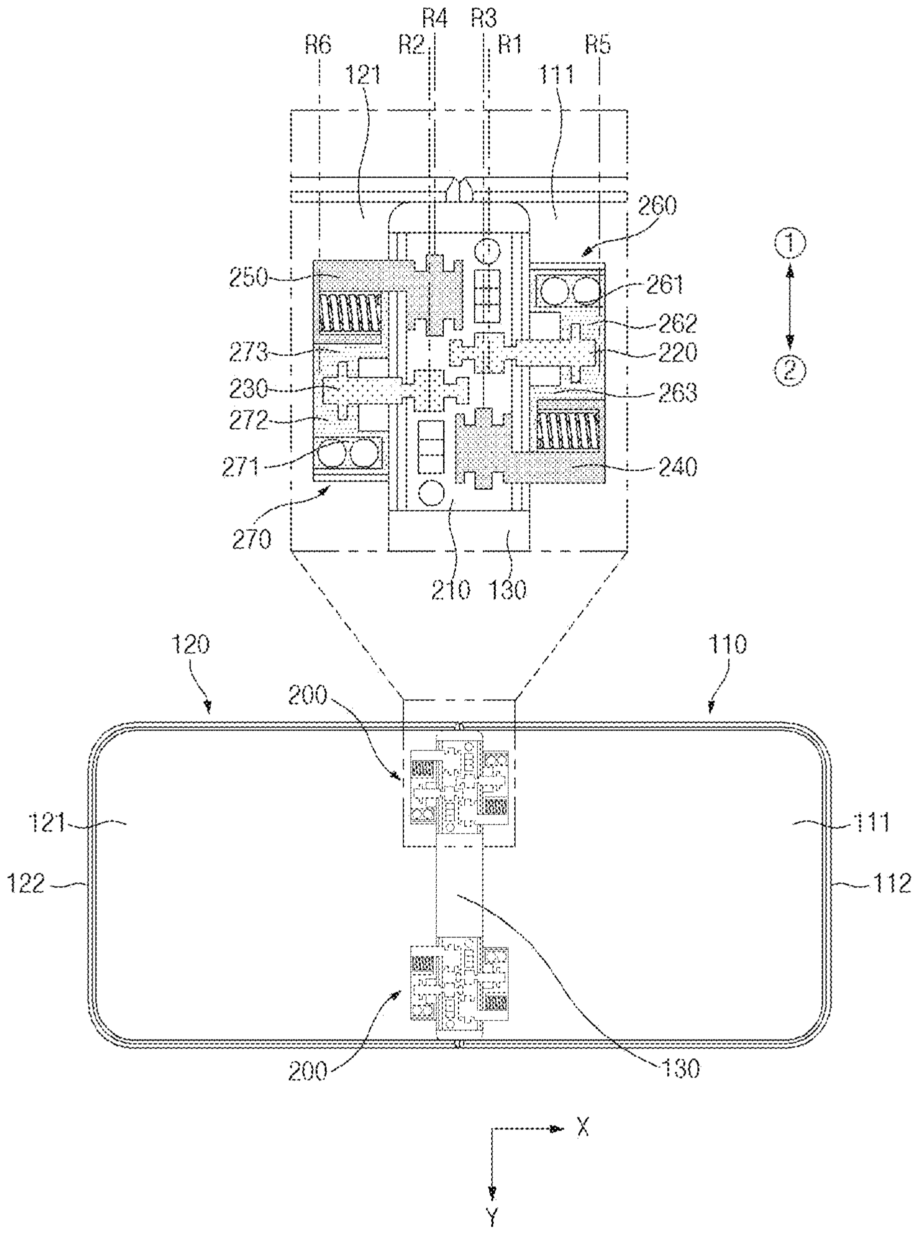
FIG. 9 is a view illustrating a coupling relationship between the housings and the hinge structure of the electronic device according to an embodiment.

FIG. 9 is a view illustrating a coupling relationship between the housings and the hinge structure of the electronic device according to an embodiment.

Referring to FIG. 9, the electronic device 100 according to an embodiment may include the first housing 110, the second housing 120, the hinge housing 130, and the hinge structure 200. The first housing 110 may include the first plate 111 and the first frame 112, and the second housing 120 may include the second plate 121 and the second frame 122.

FIG. 9 may be a view in which the display (e.g., the display 140 of FIG. 2A) is omitted to illustrate the coupling relationship between the hinge structure 200 and the housing 110 and 120 in the electronic device 100 in the unfolded state illustrated in FIG. 2A.

The hinge structure 200 may be coupled to the first housing 110 and the second housing 120, and the first housing 110 and the second housing 120 may be connected through the hinge structure 200 so as to be rotatable relative to each other. The hinge structure 200 may include the fixed member 210, the rotary members 220 and 230, the arm members 240 and 250, the coupling members 260 and 270, and the elastic members 291 and 292.

The fixed member 210 may be fixed to the hinge housing 130. For example, the fixed member 210 may be at least partially accommodated in the hinge housing 130 and may be screw-coupled with the hinge housing 130. However, a coupling method is not limited to the screw coupling.

The first rotary member 220 may be coupled to the one side of the fixed member 210 (e.g., in the +x-axis direction) so as to be rotatable about the first axis R1, and the first arm member 240 may be coupled to the one side of the fixed member 210 (e.g., in the +x-axis direction) so as to be rotatable about the third axis R3. The second rotary member 230 may be coupled to the opposite side of the fixed member 210 (e.g., in the −x-axis direction) so as to be rotatable about the second axis R2, and the second arm member 250 may be coupled to the opposite side of the fixed member 210 (e.g., in the −x-axis direction) so as to be rotatable about the fourth axis R4. For example, the fixed member 210 may be used as the basis for rotation operations of the rotary members 220 and 230 and the arm members 240 and 250.

The coupling members 260 and 270 may be fixedly coupled with the housings 110 and 120. The first part 261 of the first coupling member 260 may be fixe to the first plate 111 of the first housing 110. For example, the first coupling member 260 may be screw-coupled to the first plate 111. The fourth part 271 of the second coupling member 270 may be fixe to the second plate 121 of the second housing 120. For example, the second coupling member 270 may be screw-coupled to the second plate 121. However, a coupling method of the coupling members 260 and 270 and the housings 110 and 120 is not limited to the screw coupling.

When the electronic device 100 is folded or unfolded, the first housing 110 and the first coupling member 260 may rotate together about the first axis R1 relative to the fixed member 210, and the second housing 120 and the second coupling member 270 may rotate together about the second axis R2 relative to the fixed member 210.

In a state in which parts of the coupling members 260 and 270 (e.g., the first part 261 and the fourth part 271) are fixed to the housings 110 and 120, the rotary members 220 and 230 and the arm members 240 and 250 may be connected to other parts of the coupling members 260 and 270.

The coupling members 260 and 270 and the rotary members 220 and 230 may be connected (or, interlocked) with each other to rotate together about the same rotational axis, but may rotate through different angles while rotating relative to each other.

For example, the first rotary member 220 may be connected to the second part 262 of the first coupling member 260 such that the first coupling member 260 rotates about the fifth axis R5 relative to the first rotary member 220 while rotating about the first axis R1 together with the first rotary member 220. The second rotary member 230 may be connected to the fifth part 272 of the second coupling member 270 such that the second coupling member 270 rotates about the sixth axis R6 relative to the second rotary member 230 while rotating about the second axis R2 together with the second rotary member 230.

The coupling members 260 and 270 and the arm members 240 and 250 may be connected (or, interlocked) with each other to rotate together about different rotational axes, but may rotate along different paths while sliding (linearly moving) relative to each other.

For example, the first arm member 240 may be connected to the third part 263 of the first coupling member 260 such that the first coupling member 260 rotates about the first axis R1 together with the first rotary member 220 and linearly moves relative to the first arm member 240 that rotates about the third axis R3. The second arm member 250 may be connected to the sixth part 273 of the second coupling member 270 such that the second coupling member 270 rotates about the second axis R2 together with the second rotary member 230 and linearly moves relative to the second arm member 250 that rotates about the fourth axis R4.

Figure 10:
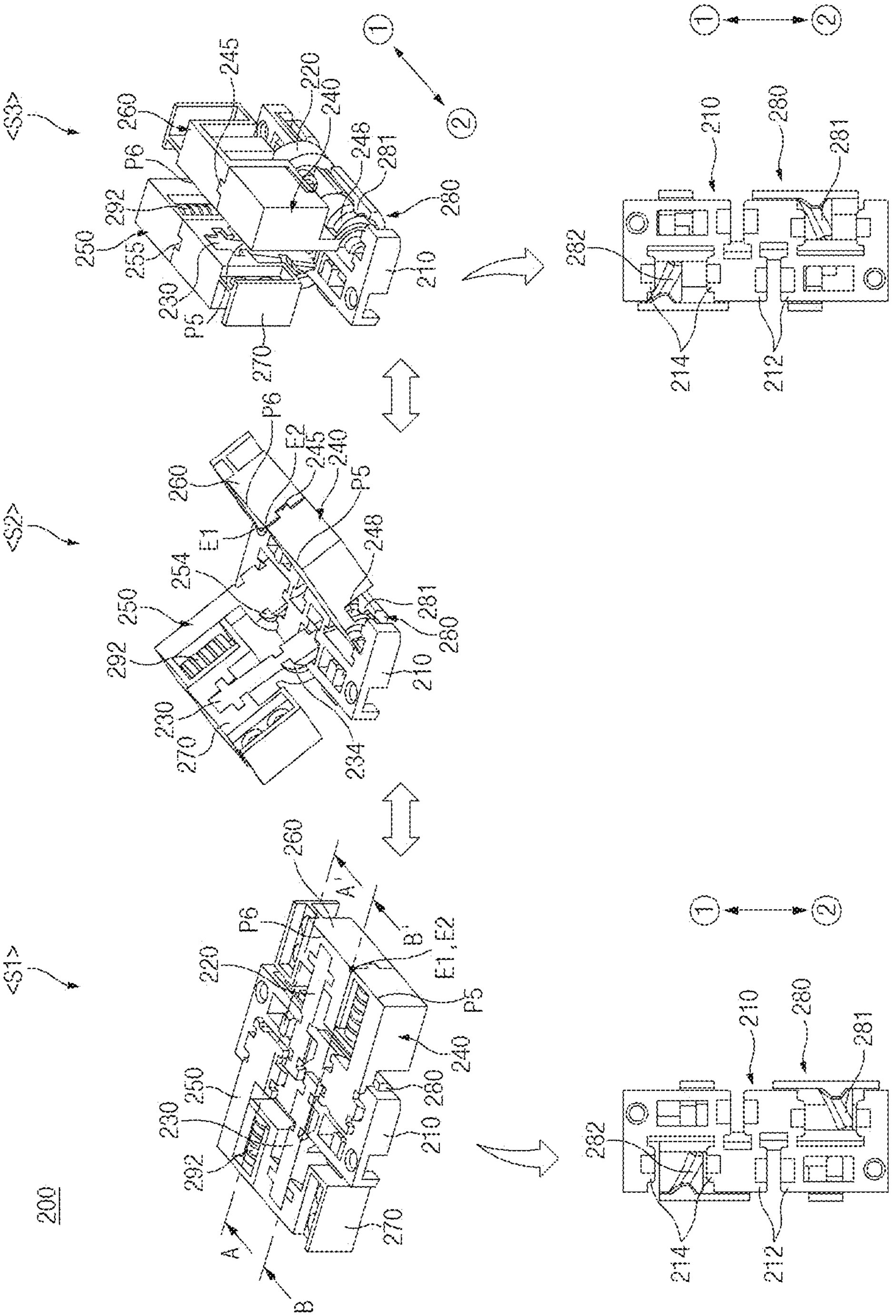
FIG. 10 is a view illustrating a rotation operation of the hinge structure according to an embodiment.
Figure 11:
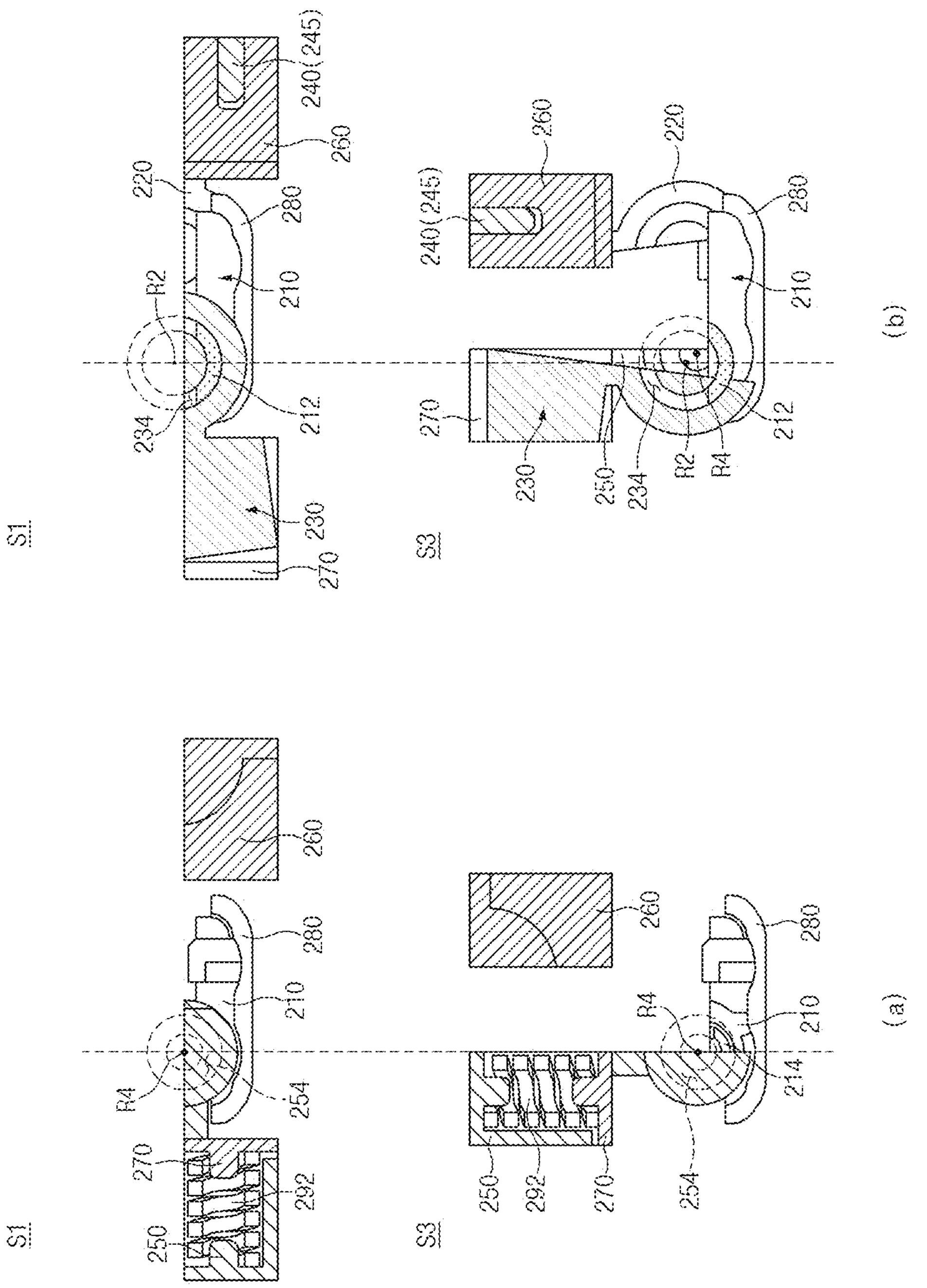
FIG. 11 is a view illustrating a rotation operation of the hinge structure according to an embodiment.

FIG. 10 is a view illustrating a rotation operation of the hinge structure according to an embodiment. FIG. 11 is a view illustrating a rotation operation of the hinge structure according to an embodiment.

FIG. 10 illustrates an operation in which the hinge structure 200 rotates when the electronic device (e.g., the electronic device 100 of FIGS. 1, 2A, 2B, and 2C) is folded or unfolded.

FIG. 11 illustrates sections of the hinge structure 200 taken along lines A-A' and B-B' illustrated in FIG. 10 when the electronic device 100 is in the unfolded state and the fully folded state. For example, FIG. 11(*a*) illustrates sectional views of the hinge structure 200 taken along line A-A' in a first state S1 and a third state S3, and FIG. 11(*b*) illustrates sectional views of the hinge structure 200 taken along line B-B' in the first state S1 and the third state S3.

Referring to FIGS. 10 and 11, the hinge structure 200 according to an embodiment may include the fixed member 210, the interlocking member 280, the rotary members 220 and 230, the arm members 240 and 250, the coupling members 260 and 270, and the elastic members 291 and 292. The components of the hinge structure 200 illustrated in FIGS. 10 and 11 may be identical or similar to the components of the hinge structure 200 described with reference to FIGS. 3 to 8, and repetitive descriptions will hereinafter be omitted.

The hinge structure 200 may rotate in response to a folding operation and an unfolding operation of the electronic device 100. The hinge structure 200 may be changed to the first state S1, the second state S2, and the third state S3 as the hinge structure 200 performs a rotation operation. For example, the hinge structure 200 may be in the first state S1 in the unfolded state of the electronic device 100 (e.g., the state illustrated in FIG. 2A). The hinge structure 200 may be in the third state S3 in the fully folded state of the electronic device 100 (e.g., the state illustrated in FIG. 2C). The hinge structure 200 may be in the second state S2 in the intermediate folded state of the electronic device 100 (e.g., the state illustrated in FIG. 2B).

The second state S2 of the hinge structure 200 described in the disclosure means one state in which the arm members 240 and 250 and the coupling members 260 and 270 are rotated by a specified angle based on the first state S1 or the third state S3. For example, the second state S2 may be a state in which the arm members 240 and 250 and the coupling members 260 and 270 are rotated by about 45°. In this case, the second state S2 may correspond to a state in which the first housing 110 (e.g., the third edge P3 of FIG. 2B) and the second housing 120 (e.g., the fourth edge P4 of FIG. 2B) are folded to form about 45°, among a plurality of intermediate folded states of the electronic device 100. However, according to various embodiments, the angle by which the arm members 240 and 250 and the coupling members 260 and 270 are rotated in the second state S2 may be greater than or less than about 45°.

The hinge structure 200 may be configured such that in a folding operation (e.g., an operation in which the hinge structure 200 is sequentially changed to the first state S1, the second state S2, and the third state S3), the first rotary member 220 and the first arm member 240 rotate relative to the fixed member 210 in a first rotational direction (e.g., in the counterclockwise direction based on FIG. 10) and the second rotary member 230 and the second arm member 250 rotate relative to the fixed member 210 in a second rotational direction opposite to the first rotational direction (e.g., in the clockwise direction based on FIG. 10).

The hinge structure 200 may be configured such that in an unfolding operation (e.g., an operation in which the hinge structure 200 is sequentially changed to the third state S3, the second state S2, and the first state S1), the first rotary member 220 and the first arm member 240 rotate relative to the fixed member 210 in the second rotational direction (e.g., in the clockwise direction based on FIG. 10) and the second rotary member 230 and the second arm member 250 rotate relative to the fixed member 210 in the first rotational direction opposite to the second rotational direction (e.g., in the counterclockwise direction based on FIG. 10).

Referring to FIG. 10, a rotation operation of the first rotary member 220 and the first arm member 240 and a rotation operation of the second rotary member 230 and the second arm member 250 may be interlocked with each other by the interlocking member 280. The interlocking member 280 may interlock the first arm member 240 and the second arm member 250 such that the first arm member 240 and the second arm member 250 rotate in opposite directions by the same angle.

Since the interlocking member 280 is connected with the arm members 240 and 250 through the inclined protrusions 281 and 282 and the inclined grooves 248 and 258, the interlocking member 280 may perform a linear motion by a rotary motion of one of the first arm member 240 and the second arm member 250, and the other one of the first arm member 240 and the second arm member 250 may perform a rotary motion by the linear motion of the interlocking member 280. For example, the interlocking member 280 may linearly move in the axial directions AD as the first inclined protrusion 281 moves along the first inclined groove 248 when the first arm member 240 rotates in one direction, and the second arm member 250 may rotate in the direction opposite to that of the first arm member 240 as the second inclined protrusion 282 moves along the second inclined groove (e.g., the second inclined groove 258 of FIG. 7) by the linear movement of the interlocking member 280. For example, the interlocking member 280 may linearly move in the axial directions AD as the second inclined protrusion 282 moves along the second inclined groove 258 when the second arm member 250 rotates in one direction, and the first arm member 240 may rotate in the direction opposite to that of the second arm member 250 as the first inclined protrusion 281 moves along the first inclined groove 248 by the linear movement of the interlocking member 280.

Based on FIG. 10, in a folding operation of the hinge structure 200, the interlocking member 280 may linearly move relative to the fixed member 210 in the first direction ① by rotation of one of the first arm member 240 and the second arm member 250, and the other one of the first arm member 240 and the second arm member 250 may rotate by the linear movement of the interlocking member 280. In an unfolding operation of the hinge structure 200, the interlocking member 280 may linearly move relative to the fixed member 210 in the second direction ② by rotation of one of the first arm member 240 and the second arm member 250, and the other one of the first arm member 240 and the second arm member 250 may rotate by the linear movement of the interlocking member 280. However, the directions in which the interlocking member 280 linearly moves in the folding and unfolding operations of the hinge structure 200 may be opposite to the embodiments illustrated in FIG. 10.

Referring to FIG. 11, the rotary members 220 and 230 and the arm members 240 and 250 may be guided by the guide rails and the guide protrusions thereof to rotate along the specified paths. Since FIG. 11 illustrates sectional views of the second rail structure 294 of the second rotary member 230 and the fourth rail structure 296 of the second arm member 250, the following description will be given based on the second rotary member 230 and the second arm member 250, and the described contents may be identically applied to the rail structures of the first rotary member 220 and the first arm member 240 (e.g., the first rail structure 293 and the third rail structure 295).

The second rotary member 230 may rotate about the second axis R2 relative to the fixed member 210 in the state in which the second guide protrusions 212 of the fixed member 210 are accommodated in the second guide rails 234 of the third coupling part 231. The second guide rails 234 may have an arc shape, and the second axis R2 may coincide with the centers of the arcs of the second guide rails 234. For example, in a folding operation and an unfolding operation of the hinge structure 200, the second guide rails 234 may guide rotation of the second rotary member 230 along an arc-shaped rotational path whose center coincides with the second axis R2. For example, the cross-section of the third coupling part 231 may have a substantially arc shape.

The second arm member 250 may rotate about the fourth axis R4 relative to the fixed member 210 in the state in which the fourth guide protrusions 214 of the fixed member 210 are accommodated in the fourth guide rails 254 of the seventh coupling part 251. The fourth guide rails 254 may have an arc shape, and the fourth axis R4 may coincide with the centers of the arcs of the fourth guide rails 254. For example, in a folding operation and an unfolding operation of the hinge structure 200, the fourth guide rails 254 may guide rotation of the second arm member 250 along an arc-shaped rotational path whose center coincides with the fourth axis R4. For example, the cross-section of the seventh coupling part 251 may have a substantially arc shape.

Figure 12:
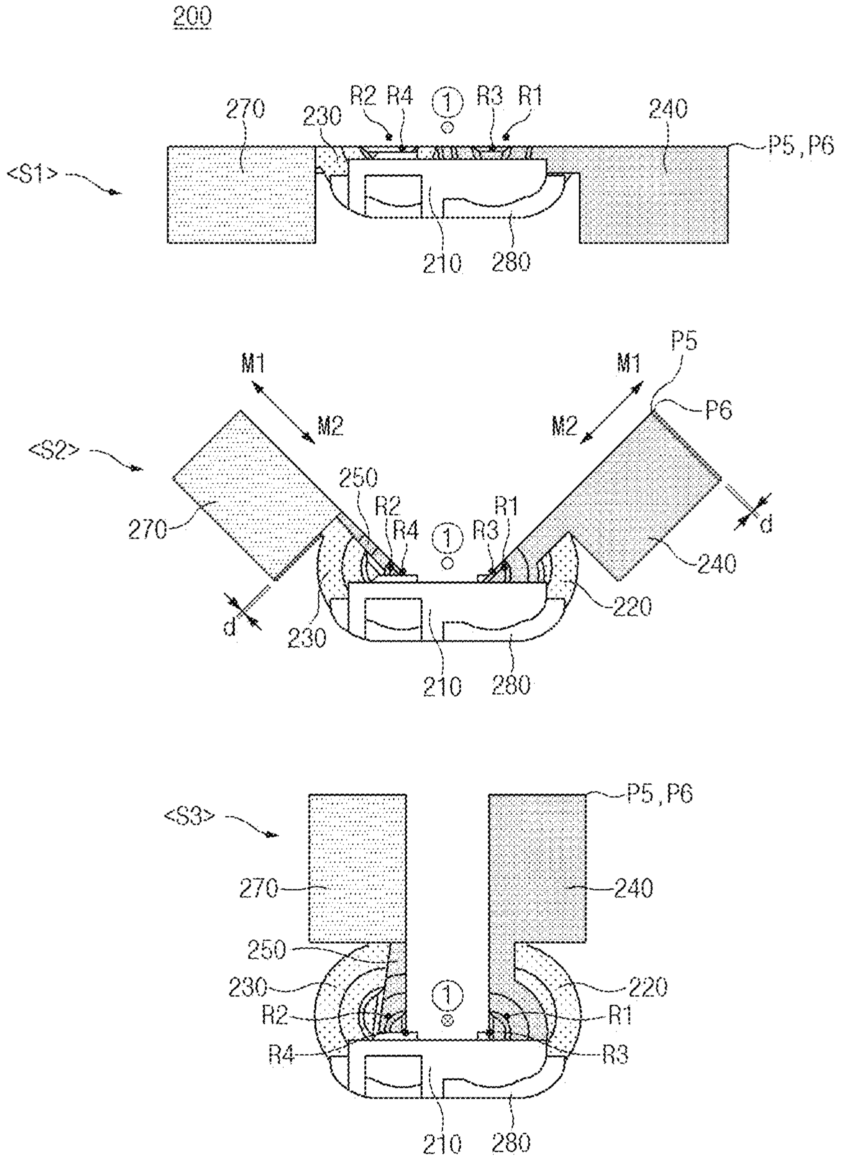
FIG. 12 is a view illustrating a rotation operation of the hinge structure and a sliding operation between the arm members and the coupling members according to an embodiment.
Figure 13:
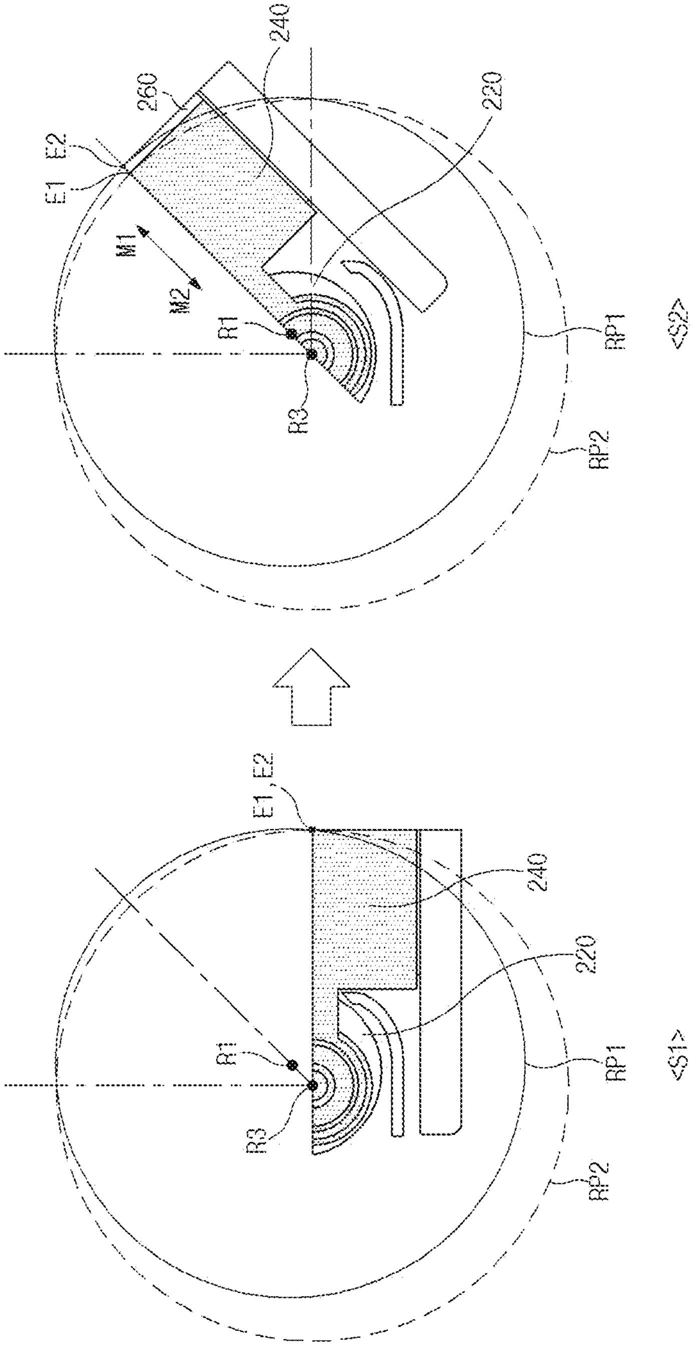
FIG. 13 is a view illustrating a rotation operation of the hinge structure and a sliding operation between the arm members and the coupling members according to an embodiment.

FIG. 12 is a view illustrating a rotation operation of the hinge structure and a sliding operation between the arm members and the coupling members according to an embodiment. FIG. 13 is a view illustrating a rotation operation of the hinge structure and a sliding operation between the arm members and the coupling members according to an embodiment.

FIG. 12 is a front view illustrating a rotation operation of the hinge structure 200 illustrated in FIG. 10 as viewed in the first direction ①. Hereinafter, an operation in which a linear reciprocating motion occurs between the arm members 240 and 250 and the coupling members 260 and 270 when the hinge structure 200 is folded or unfolded will be described with reference to FIGS. 10, 12, and 13 together.

Referring to FIGS. 10, 12, and 13, the hinge structure 200 according to an embodiment may be provided in a form in which the first rotary member 220, the second rotary member 230, the first arm member 240, and the second arm member 250 are coupled to the fixed member 210 so as to be rotatable about the rotational axes R1 to R4.

The first rotary member 220 may be coupled to the one side of the fixed member 210 so as to be rotatable about the first axis R1, and the first arm member 240 may be coupled to the one side of the fixed member 210 so as to be rotatable about the third axis R3 different from the first axis R1. The first axis R1 and the third axis R3 may be parallel to each other.

The second rotary member 230 may be coupled to the opposite side of the fixed member 210 so as to be rotatable about the second axis R2, and the second arm member 250 may be coupled to the opposite side of the fixed member 210 so as to be rotatable about the fourth axis R4 different from the second axis R2. The second axis R2 and the fourth axis R4 may be parallel to each other.

Since the coupling members 260 and 270 are connected to the rotary members 220 and 230 and the arm members 240 and 250 to operate in conjunction with rotation of the rotary members 220 and 230 and the arm members 240 and 250, the coupling members 260 and 270 may linearly move relative to the arm members 240 and 250 while rotating together with the rotary members 220 and 230.

The first coupling member 260 may interlock with the first arm member 240 and rotate about the first axis R1 and may simultaneously perform a linear motion relative to the first arm member 240 that rotates about the third axis R3. For example, in a folding operation and an unfolding operation, a rotational path RP1 of the first coupling member 260 and a rotational path RP2 of the first arm member 240 may differ from each other since the first coupling member 260 and the first arm member 240 rotate about different rotational axes. Accordingly, the first coupling member 260 may slide relative to the first arm member 240, and the position of the first coupling member 260 relative to the first arm member 240 may be changed.

The second coupling member 270 may interlock with the second arm member 250 and rotate about the second axis R2 and may simultaneously perform a linear motion relative to the second arm member 250 that rotates about the fourth axis R4. For example, in the folding operation and the unfolding operation, a rotational path of the second coupling member 270 and a rotational path of the second arm member 250 may differ from each other since the second coupling member 270 and the second arm member 250 rotate about different rotational axes. Accordingly, the second coupling member 270 may slide relative to the second arm member 250, and the position of the second coupling member 270 relative to the second arm member 250 may be changed.

The hinge structure 200 may be configured such that when the folding operation and the unfolding operation are performed, the direction of a linear motion of the coupling members 260 and 270 relative to the arm members 240 and 250 is reversed depending on the degree or angle of rotation of the arm members 240 and 250 and the coupling members 260 and 270. Accordingly, the coupling members 260 and 270 may perform a linear reciprocating motion relative to the arm members 240 and 250.

In the folding operation and the unfolding operation of the hinge structure 200, the arm members 240 and 250 and the coupling members 260 and 270 may rotate about the rotational axes thereof in one direction, and the coupling members 260 and 270 may perform a linear motion relative to the arm members 240 and 250 in a first sliding direction M1 until the rotation angle of the arm members 240 and 250 and the coupling members 260 and 270 reaches a specified angle (e.g., about 45°). Thereafter, when the arm members 240 and 250 and the coupling members 260 and 270 continue to rotate in the one direction and the rotation angle of the arm members 240 and 250 and the coupling members 260 and 270 exceeds the specified angle, the coupling members 260 and 270 may perform a linear motion relative to the arm members 240 and 250 in a second sliding direction M2 opposite to the first sliding direction M1. For example, the first sliding direction M1 and the second sliding direction M2 may be substantially parallel to the extension direction of the elastic members 291 and 292.

When the hinge structure 200 is in the first state S1 and the third state S3, edges P5 of the arm members 240 and 250 and edges P6 of the coupling members 260 and 270 that are parallel to the axial directions AD may be located on the same lines. When the hinge structure 200 is in the second state S2, the edges P6 of the coupling members 260 and 270 may be spaced apart from the edges P5 of the arm members 240 and 250 by a predetermined distance d in the first sliding direction M1. For example, when the hinge structure 200 is folded in the first state S1 (e.g., when the hinge structure 200 is sequentially changed to the first state, the second state, and the third state), the separation distance between the edges P5 of the arm members 240 and 250 and the edges P6 of the coupling members 260 and 270 may be increased in the first state S1 and the second state S2 and may be decreased between the second state S2 and the third state S3. In contrast, when the hinge structure 200 is unfolded in the third state S3 (e.g., when the hinge structure 200 is sequentially changed to the third state, the second state, and the first state), the separation distance between the edges P5 of the arm members 240 and 250 and the edges P6 of the coupling members 260 and 270 may be increased in the third state S3 and the second state S2 and may be decreased between the second state S2 and the first state S1.

The hinge structure 200 may be configured such that the rotational axes R3 and R4 of the arm members 240 and 250 and the rotational axes R1 and R2 of the coupling members 260 and 270 are formed at positions where the arm members 240 and 250 and the coupling members 260 and 270 are able to relatively perform a linear reciprocating motion.

As illustrated in FIGS. 10 and 13, to compare the rotational paths of the first arm member 240 and the first coupling member 260, one point of the edge P6 of the first coupling member 260 and one point of the edge P5 of the first arm member 240 that are in contact with each other in the first state S1 may be defined as a second point E2 and a first point E1. For example, the second point E2 may be an end point of the edge P6 of the first coupling member 260, and the first point E1 may be an end point of the edge P5 of the first arm member 240 that overlaps the second point E2 in the first state S1.

In the folding and unfolding operations of the hinge structure 200, the first coupling member 260 may rotate about the first axis R1 together with the first rotary member 220. The second point E2 of the first coupling member 260 may move along the first rotational path RP1 that is a portion of a circle whose center coincides with the first axis R1. For example, the first rotational path RP1 may correspond to an arc-shaped path having a central angle of about 90° on the circumference of the circle whose center coincides with the first axis R1.

In the folding and unfolding operations of the hinge structure 200, the first arm member 240 may rotate about the third axis R3. The first point E1 of the first arm member 240 may move along the second rotational path RP2 that is a portion of a circle whose center coincides with the third axis R3. For example, the second rotational path RP2 may correspond to an arc-shaped path having a central angle of about 90° on the circumference of the circle whose center coincides with the third axis R3.

The gap between the first rotational path RP1 and the second rotational path RP2 may increase and then decrease based on a specified rotation angle. In the folding and unfolding operations of the hinge structure 200, the second point E2 of the first coupling member 260 may move along the first rotational path RP1, and the first point E1 of the first arm member 240 may move along the second rotational path RP2. Accordingly, the distance between the second point E2 and the first point E1 may increase and then decrease at the specified angle.

For example, when a folding operation is performed in the first state S1, the separation distance between the second point E2 and the first point E1 may increase until the hinge structure 200 reaches the second state S2 in which the arm members 240 and 250 and the coupling members 260 and 270 are rotated by about 45°. The separation distance between the second point E2 and the first point E1 may decrease based on the second state S2, and in the third state S3, the second point E2 and the first point E1 may overlap each other at the same position. In contrast, when an unfolding operation is performed in the third state S3, the separation distance between the second point E2 and the first point E1 may increase until the hinge structure 200 reaches the second state S2 in which the arm members 240 and 250 and the coupling members 260 and 270 are rotated by about 45°. The separation distance between the second point E2 and the first point E1 may decrease based on the second state S2, and in the first state S1, the second point E2 and the first point E1 may overlap each other at the same position.

In the folding operation of the hinge structure 200, the first coupling member 260 may linearly move relative to the first arm member 240 in the first sliding direction M1 while the hinge structure 200 is changed from the first state S1 to the second state S2, and the first coupling member 260 may linearly move relative to the first arm member 240 in the second sliding direction M2 opposite to the first sliding direction M1 while the hinge structure 200 is changed from the second state S2 to the third state S3. In contrast, in the unfolding operation of the hinge structure 200, the first coupling member 260 may linearly move relative to the first arm member 240 in the first sliding direction M1 while the hinge structure 200 is changed from the third state S3 to the second state S2, and the first coupling member 260 may linearly move relative to the first arm member 240 in the second sliding direction M2 opposite to the first sliding direction M1 while the hinge structure 200 is changed from the second state S2 to the first state S1. Here, the first sliding direction M1 may be defined as a direction away from the centers of the circles whose centers coincide with the first axis R1 and the third axis R3, among the radial directions of the circles, and the second sliding direction M2 may be defined as a direction toward the centers of the circles. The second coupling member 270 may also perform a linear reciprocating motion relative to the second arm member 250 in the same manner as described above.

The degree of compression of the elastic members 291 and 292 may be changed in response to a linear reciprocating motion between the arm members 240 and 250 and the coupling members 260 and 270. For example, as the coupling members 260 and 270 linearly move relative to the arm members 240 and 250, the distances between the support portions of the arm members 240 and 250 (e.g., the support portions **242*b* and 252*b* of FIG. 4) and the support portions of the coupling members 260 and 270 (e.g., the support portions 263*b* and 273*b* of FIG. 4) that support the opposite ends of the elastic members 291 and 292 may be changed. For example, when the hinge structure 200 is folded, the elastic members 291 and 292 may be compressed between the first state S1 and the second state S2. For example, as the coupling members 260 and 270 move relative to the arm members 240 and 250 in the first sliding direction M1, the distances between the support portions of the arm members 240 and 250 (e.g., the support portions 242*b* and 252*b* of FIGS. 3, 4, and 7) and the support portions of the coupling members 260 and 270 (e.g., the support portions 263*b* and 273*b* of FIGS. 3, 4, and 8) that may be decreased, and thus the elastic members 291 and 292** may be compressed.

Between the second state S2 and the third state S3, the elastic members 291 and 292 may be returned (e.g., uncompressed) to the state prior to the compression. For example, as the coupling members 260 and 270 move relative to the arm members 240 and 250 in the second sliding direction M2, the distances between the support portions 242*b* and 252*b* of the arm members 240 and 250 and the support portions 263*b* and 273*b* of the coupling members 260 and 270 may be increased, and thus the compressed elastic members 291 and 292 may be returned to the state prior to the compression.

In contrast, when the hinge structure 200 is unfolded, the elastic members 291 and 292 may be compressed between the third state S3 and the second state S2 and may be returned (e.g., uncompressed) to the state prior to the compression between the second state S2 and the first state S1.

In an embodiment of the disclosure, the second state S2 of the hinge structure 200 may be defined as a state in which the linear movement distance of the coupling members 260 and 270 relative to the arm members 240 and 250 is at a maximum when the hinge structure 200 rotates in the first state S1 or the third state S3. For example, the second state S2 may mean a state in which the coupling members 260 and 270 slide relative to the arm members 240 and 250 by a maximum distance d in the first sliding direction M1 or a state in which the elastic members 291 and 292 are compressed to the maximum. According to the illustrated embodiment, the second state S2 may be a state in which the arm members 240 and 250 and the coupling members 260 and 270 are rotated by about 45°, and the degree of compression of the elastic members 291 and 292 may be substantially the same in the first state S1 and the third state S3. However, this is illustrative, and according to various embodiments, the hinge structure 200 may be configured such that the rotation angles of the arm members 240 and 250 and the coupling members 260 and 270 in the second state S2, in which the elastic members 291 and 292 are compressed to the maximum, are greater than or less than 450 and may be configured such that the degrees of compression of the elastic members 291 and 292 differ from each other in the first state S1 and the third state S3.

Figure 14:
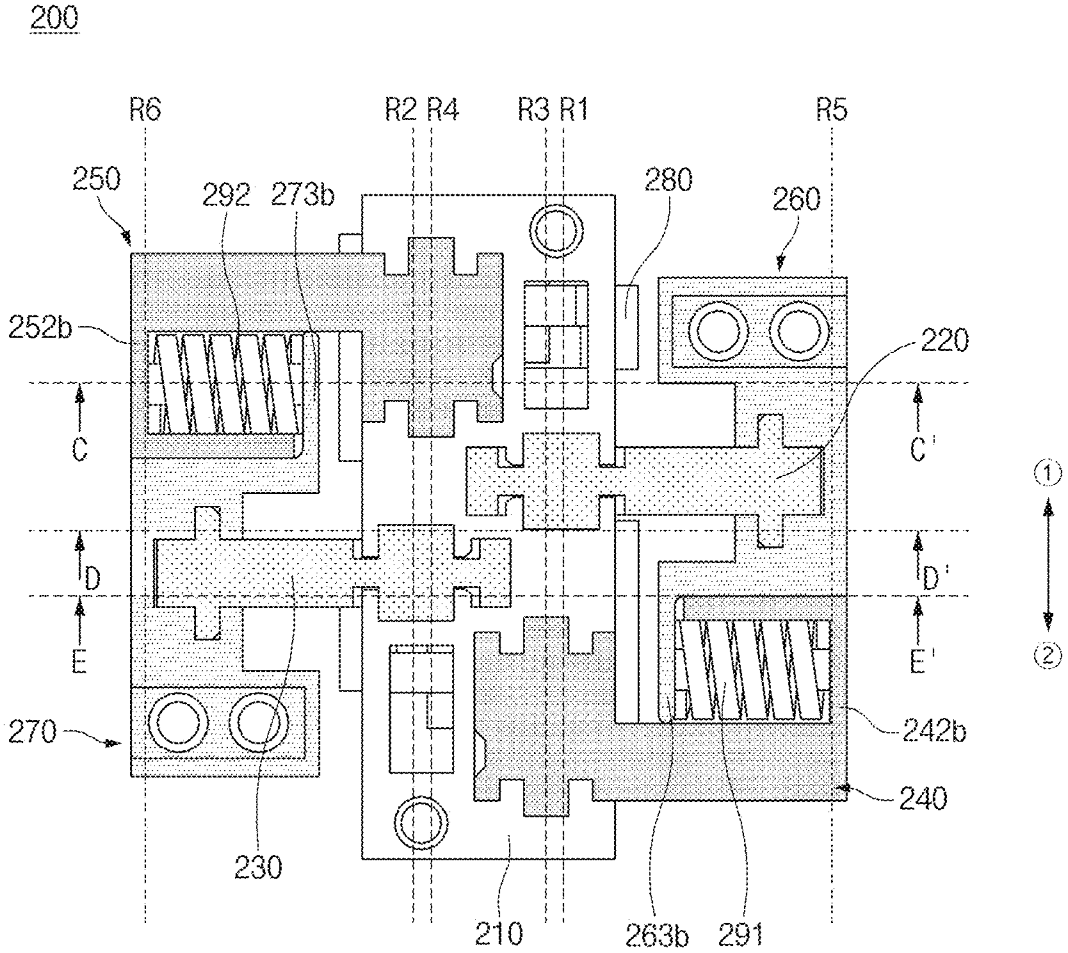
FIG. 14 is a plan view of the hinge structure according to an embodiment.
Figure 15A:
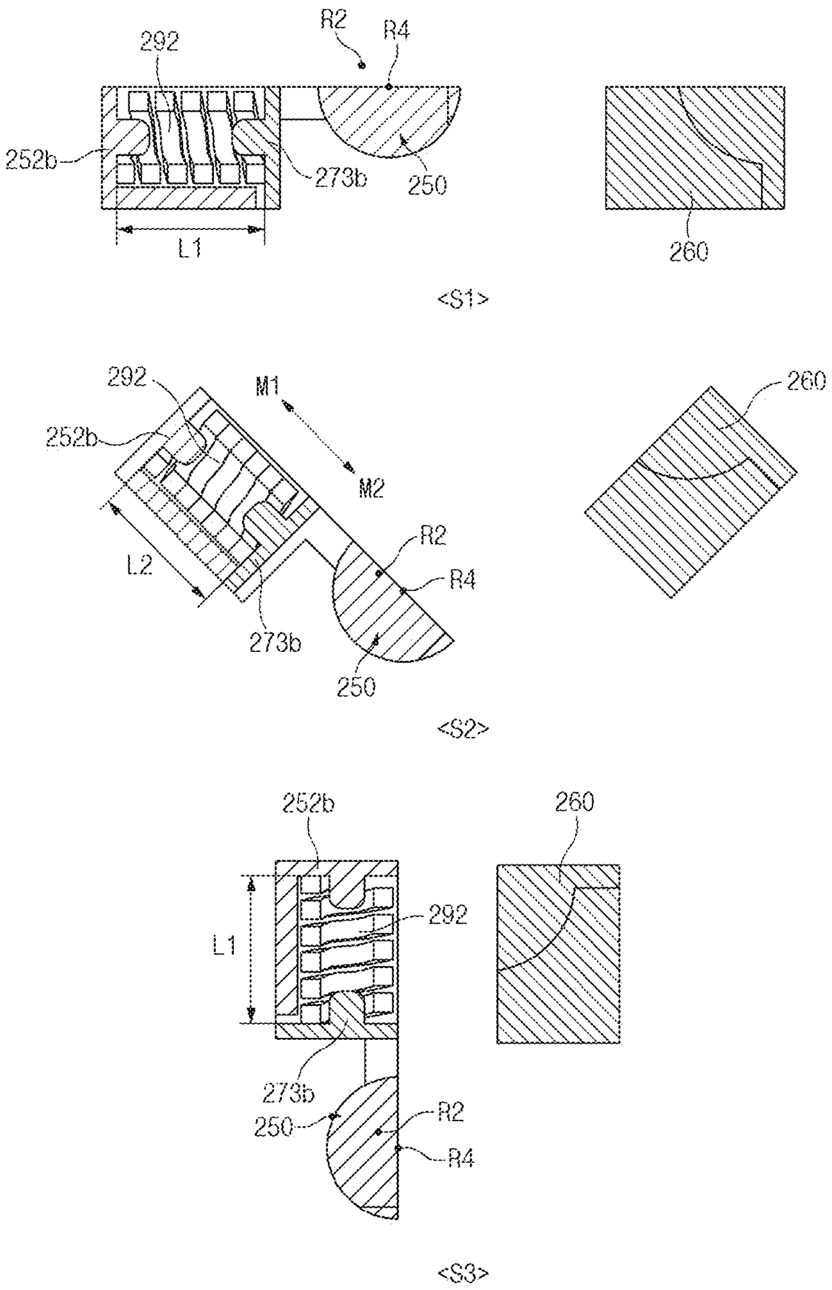
FIG. 15A is a sectional view illustrating a rotation operation of the hinge structure according to an embodiment.
Figure 15B:
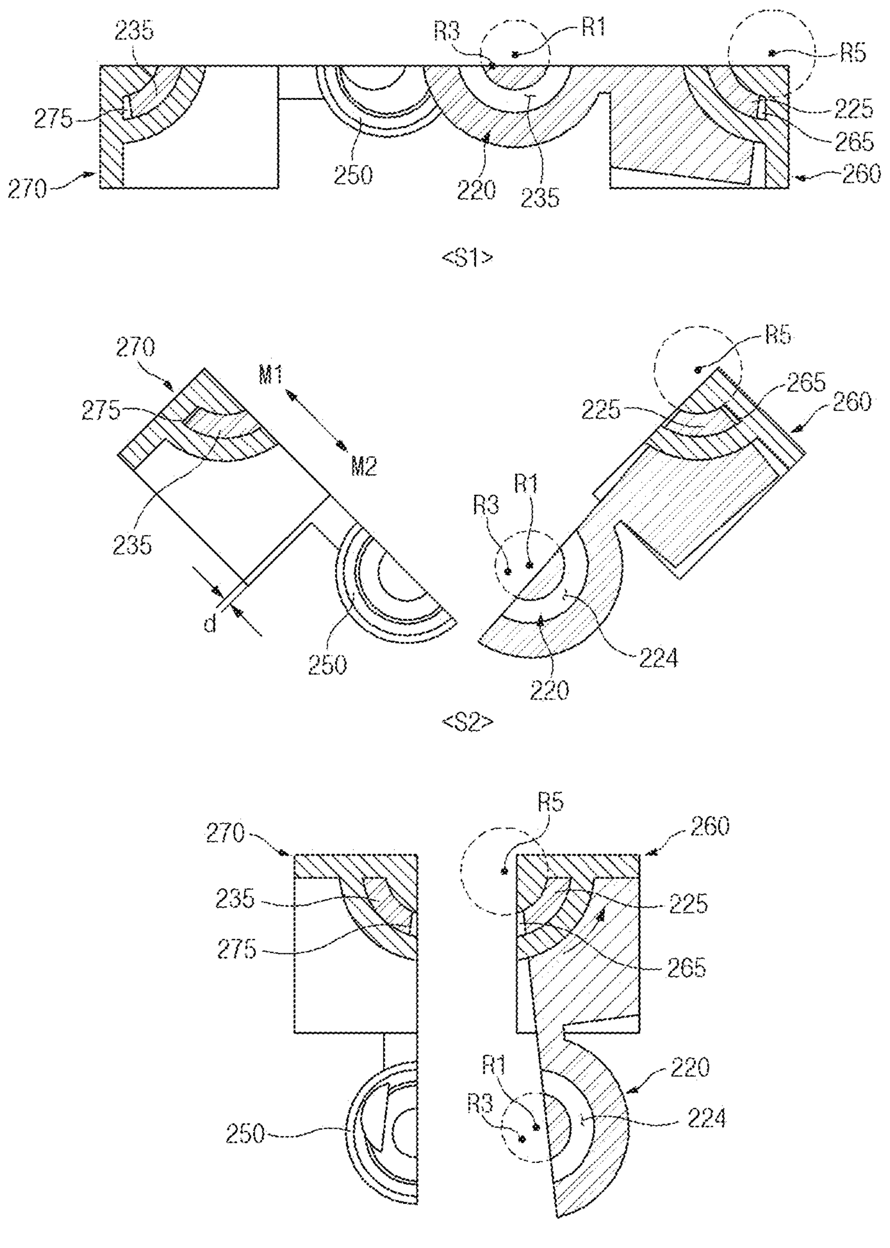
FIG. 15B is a sectional view illustrating the rotation operation of the hinge structure according to an embodiment.
Figure 15C:
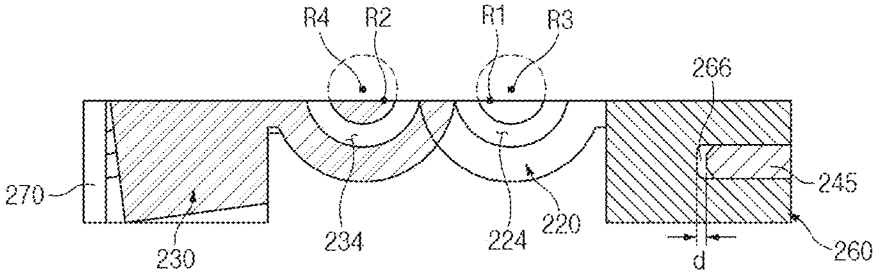
FIG. 15C is a sectional view illustrating the rotation operation of the hinge structure according to an embodiment.
Figure 15C:
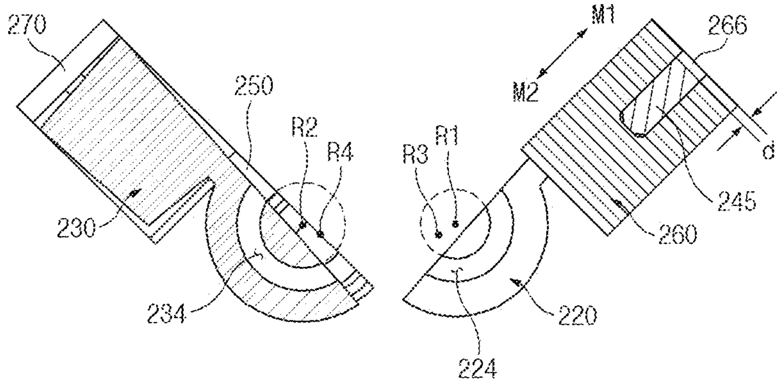
Figure 15C:
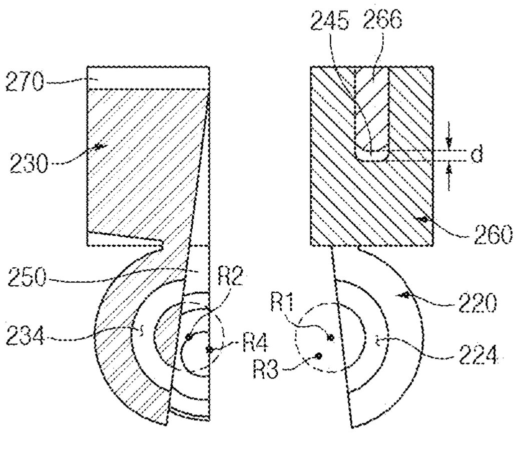

FIG. 14 is a plan view of the hinge structure according to an embodiment. FIG. 15A is a sectional view illustrating a rotation operation of the hinge structure according to an embodiment. FIG. 15B is a sectional view illustrating the rotation operation of the hinge structure according to an embodiment. FIG. 15C is a sectional view illustrating the rotation operation of the hinge structure according to an embodiment.

FIG. 14 illustrates a first state (e.g., the first state S1 of FIGS. 10 to 12) in which the hinge structure 200 is fully unfolded.

FIG. 15A illustrates sectional views for explaining the rotation operation of the hinge structure 200 illustrated in FIG. 14, wherein the sectional views are taken along line C-C' of FIG. 14. FIG. 15B illustrates sectional views for explaining the rotation operation of the hinge structure 200 illustrated in FIG. 14, wherein the sectional views are taken along line D-D' of FIG. 14. FIG. 15C illustrates sectional views for explaining the rotation operation of the hinge structure 200 illustrated in FIG. 14, wherein the sectional views are taken along line E-E' of FIG. 14.

Referring to FIGS. 14, 15A, 15B, and 15C, the hinge structure 200 according to an embodiment may include the fixed member 210, the interlocking member 280, the first rotary member 220, the first arm member 240, the first coupling member 260, the first elastic member 291, the second rotary member 230, the second arm member 250, the second coupling member 270, and the second elastic member 292.

FIGS. 15A, 15B, and 15C are views in which the fixed member 210 and the interlocking member 280 are omitted. FIGS. 15A, 15B, and 15C illustrate sections of the hinge structure 200 in different directions in the first state S1, the second state S2, and the third state S3. For example, the first state S1, the second state S2, and the third state S3 may be referred to as the first state S1, the second state S2, and the third state S3 of the hinge structure 200 illustrated in FIG. 10.

Hereinafter, movements or operations of the rotary members 220 and 230, the arm members 240 and 250, the coupling members 260 and 270, and the elastic members 291 and 292 when a folding operation of the hinge structure 200 is performed will be described with reference to FIGS. 14, 15A, 15B, and 15C. Hereinafter, the first rotational direction referred to may be the counterclockwise direction based on the drawings, and the second rotational direction may be the clockwise direction opposite to the first rotational direction.

In a process in which the hinge structure 200 is changed from the first state S1 to the second state S2, the first rotary member 220 may rotate about the first axis R1 in the first rotational direction, and the first arm member 240 may rotate about the third axis R3 in the first rotational direction. The first coupling member 260 may rotate about the first axis R1 together with the first rotary member 220 and may rotate about the fifth axis R5 relative to the first rotary member 220 in the second rotational direction while linearly moving relative to the first arm member 240 by a first displacement d in the first sliding direction M1. As the first coupling member 260 linearly moves in the first sliding direction M1 by the first displacement d, the distance between the first support portion 242*b* and the third support portion 263*b* may be decreased, and the first elastic member 291 may be compressed. For example, in the second state S2, the separation distance between the first support portion 242*b* and the third support portion 263*b* may be minimal, and the degree of compression of the first elastic member 291 may be maximal. The first sliding direction M1 may be a direction away from the first axis R1 among radial directions of a circle whose center coincides with the first axis R1. The first displacement d may be the maximum linear movement distance of the first coupling member 260 relative to the first arm member 240.

In a process in which the hinge structure 200 is changed from the second state S2 to the third state S3, the first rotary member 220 and the first arm member 240 may continue to rotate about the first axis R1 and the third axis R3 in the first rotational direction. The first coupling member 260 may rotate about the first axis R1 together with the first rotary member 220 and may continue to rotate about the fifth axis R5 relative to the first rotary member 220 in the second rotational direction while linearly moving relative to the first arm member 240 by the first displacement d in the second sliding direction M2 opposite to the first sliding direction M1. As the first coupling member 260 linearly moves in the second sliding direction M2, the distance between the first support portion 242*b* and the third support portion 263*b* may be increased, and the first elastic member 291, which is compressed when the hinge structure 200 is changed from the first state S1 to the second state S2, may be returned (e.g., uncompressed) to the state prior to the compression. For example, the separation distance between the first support portion 242*b* and the third support portion 263*b* in the third state S3 may be substantially the same as that in the first state S1, and the degree of compression of the first elastic member 291 may be substantially the same in the first state S1 and the third state S3.

In the process in which the hinge structure 200 is changed from the first state S1 to the second state S2, the second rotary member 230 may rotate about the second axis R2 in the second rotational direction, and the second arm member 250 may rotate about the fourth axis R4 in the second rotational direction. The second coupling member 270 may rotate about the second axis R2 together with the second rotary member 230 and may rotate about the sixth axis R6 relative to the second rotary member 220 in the first rotational direction while linearly moving relative to the second arm member 250 by the first displacement d in the first sliding direction M1. As the second coupling member 270 linearly moves in the first sliding direction M1 by the first displacement d, the distance between the second support portion 252*b* and the fourth support portion 273*b* may be decreased, and the second elastic member 292 may be compressed. For example, in the second state, the separation distance between the second support portion 252*b* and the fourth support portion 273*b* may be minimal, and the degree of compression of the second elastic member 292 may be maximal. The first sliding direction M1 may be a direction away from the second axis R2 among radial directions of a circle whose center coincides with the second axis R2.

In the process in which the hinge structure 200 is changed from the second state S2 to the third state S3, the second rotary member 230 and the second arm member 250 may continue to rotate about the second axis R2 and the fourth axis R4 in the second rotational direction. The second coupling member 270 may rotate about the second axis R2 together with the second rotary member 230 and may continue to rotate about the sixth axis R6 relative to the second rotary member 230 in the first rotational direction while linearly moving relative to the second arm member 250 by the first displacement d in the second sliding direction M2 opposite to the first sliding direction M1. As the second coupling member 270 linearly moves in the second sliding direction M2, the distance between the second support portion 252*b* and the fourth support portion 273*b* may be increased, and the second elastic member 292, which is compressed when the hinge structure 200 is changed from the first state S1 to the second state S2, may be returned (e.g., uncompressed) to the state prior to the compression. For example, the separation distance between the second support portion 252*b* and the fourth support portion 273*b* in the third state S3 may be substantially the same as that in the first state S1, and the degree of compression of the second elastic member 292 may be substantially the same in the first state S1 and the third state S3.

Referring to FIG. 15A, the second elastic member 292 may have a first length L1 in the first state S1 and the third state S3 and may have a second length L2 shorter than the first length L1 in the second state S2. The difference between the first length L1 and the second length L2 may be substantially the same as the first displacement (e.g., the first displacement d of FIGS. 15B and 15C) that is a linear movement displacement between the second coupling member 270 and the second arm member 250. For example, when the hinge structure 200 is changed from the first state S1 to the second state S2, the second elastic member 292 may be compressed by the first displacement d as the second support portion 252*b* of the second arm member 250 and the fourth support portion 273*b* of the second coupling member 270 move toward each other, and when the hinge structure 200 is changed from the second state S2 to the third state S3, the second elastic member 292 may be uncompressed by the first displacement d as the second support portion 252*b* and the fourth support portion 273*b* move away from each other, The first displacement d may be about 0.22 mm, but is not limited thereto. Although only the second elastic member 292 is illustrated in FIG. 15A, the description about the operation of the second elastic member 292 may be identically applied to the first elastic member 291.

Referring to FIG. 15B, the first rotary member 220 may rotate relative to the first coupling member 260. For example, when the first coupling member 260 fixed to the first housing 110 of the electronic device 100 is taken as a reference, it may be understood that in the folding operation, the first rotary member 220 may rotate about the fifth axis R5 relative to the first coupling member 260 (or, the first housing 110) in the first rotational direction while rotating about the first axis R1 relative to the fixed member 210 in the first rotational direction.

Referring to FIG. 15B, since the first rotary member 220 rotates about the fifth axis R5 relative to the first coupling member 260, the rotation angle of the first rotary member 220 in the process in which the hinge structure 200 is changed between the first state S1 and the third state S3 may be greater than those of the first coupling member 260 and the first arm member 240. For example, when the electronic device 100 is folded, the first arm member 240 and the first coupling member 260 may rotate through an angle of about 90°, and the first rotary member 220 may rotate through an angle of about 970 greater than 90°. However, the rotation angle of the first rotary member 220 is not limited to 97°. Although not illustrated, the first rotary member 220 may be coupled with a rotary plate (e.g., the rotary plate 150 or 160 of FIGS. 16A, 16B, and 17) that supports the rear surface of the display 140, and the rotary plate 150 or 160 may rotate through an angle greater than 90° together with the first rotary member 220 and may support the display 140 such that the display 140 (particularly, the folding region 143) forms a dumbbell shape or a water-drop shape (e.g., refer to FIG. 18). The description about the relative rotation operation between the first rotary member 220 and the first coupling member 260 may be identically applied to the second rotary member 230 and the second coupling member 270.

The operations of the rotary members 220 and 230, the arm members 240 and 250, the coupling members 260 and 270, and the elastic members 291 and 292 when the hinge structure 200 is unfolded may be substantially the same as the operations thereof when the hinge structure 200 is folded, except that the rotation directions of the components are reversed. For example, even in an unfolding operation of the hinge structure 200, the elastic members 291 and 292 may be compressed by the first displacement d when the hinge structure 200 is changed from the third state S3 to the second state S2 and may be uncompressed by the first displacement d when the hinge structure 200 is changed from the second state S2 to the first state S1.

For a change of state from the first state S1 to the third state S3 or from the third state S3 to the first state S1, the hinge structure 200 may require a force capable of compressing the elastic members 291 and 292. Accordingly, the hinge structure 200 may provide a detent function. When a force sufficient to compress the elastic members 291 and 292 is not applied, the hinge structure 200 in the first state S1 may provide an unfolding detent (or, open detent) function to maintain the first state S1 without being changed to the third state S3. Furthermore, when a force sufficient to compress the elastic members 291 and 292 is not applied, the hinge structure 200 in the third state S3 may provide a folding detent (or, closed detent) function to maintain the third state S3 without being changed to the first state S1. The change of state of the hinge structure 200 may include an unfolding detent section defined between the first state S1 and the second state S2 and a folding detent section defined between the second state S2 and the third state S3.

When a force sufficient to change the hinge structure 200 from the first state S1 to the second state S2 is not applied, the hinge structure 200 according to the illustrated embodiment may be returned to the first state S1 by the restoring forces of the elastic members 291 and 292 (e.g., unfolding detent). Furthermore, when a force sufficient to change the hinge structure 200 from the third state S3 to the second state S2 is not applied, the hinge structure 200 may be returned to the third state S3 by the restoring forces of the elastic members 291 and 292 (e.g., folding detent). In contrast, when a sufficient force is applied in the first state S1 and the hinge structure 200 passes the second state S2, the hinge structure 200 may be changed to the third state S3 by the restoring forces of the elastic members 291 and 292, and when a sufficient force is applied in the third state S3 and the hinge structure 200 passes the second state S2, the hinge structure 200 may be changed to the first state S1 by the restoring forces of the elastic members 291 and 292.

According to various embodiments (e.g., refer to FIG. 23), the hinge structure 200 may provide a free-stop section between the folding detent section and the unfolding detent section. In the free-stop section, the hinge structure 299 may maintain any state included in the free-stop section without being folded or unfolded even when an external force of a user is removed. For example, in a deformation operation of the hinge structure 200, a state 2-1 and a state 2-2 may be defined between the first state S1 and the third state S3. The state 2-1 may be a state in which the hinge structure 200 is folded to a greater degree than in the first state S1 and is folded to a smaller degree than in the state 2-2, and the state 2-2 may be a state in which the hinge structure 200 is folded to a greater degree than in the state 2-1 and is folded to a smaller degree than in the third state s3. The section between the first state S1 and the state 2-1 may be defined as the unfolding detent section, the section between the third state S3 and the state 2-2 may be defined as the folding detent section, and the section between the state 2-1 and the state 2-2 may be defined as the free-stop section. The hinge structure 200 may maintain intermediate states between the state 2-1 and the state 2-2. For example, when the hinge structure 200 is folded from the first state S1 to the third state S3, if the hinge structure 200 fails to pass the state 2-1, the hinge structure 200 may be returned to the first state S1 (e.g., unfolding detent), and if the hinge structure 200 passes the state 2-1, the hinge structure 200 may maintain the current changed state until reaching the state 2-2. In contrast, when the hinge structure 200 is unfolded from the third state S3 to the first state S1, if the hinge structure 200 fails to pass the state 2-2, the hinge structure 200 may be returned to the third state S3 (e.g., folding detent), and if the hinge structure 200 passes the state 2-2, the hinge structure 200 may maintain the current changed state until reaching the state 2-1.

In the first state S1 and the third state S3, the elastic members 291 and 292 may be in a state of being compressed by a predetermined displacement rather than in an equilibrium state (or, a free state) to increase and improve the detent strength of the electronic device 100 and/or the hinge structure 200. For example, in the equilibrium state in which an external force is not applied, the elastic members 291 and 292 may have a predetermined free length, and in the first state S1, the elastic members 291 and 292 may be disposed in a compressed state between the arm members 240 and 250 and the coupling members 260 and 270 to have the first length L1 shorter than the free length. Accordingly, the hinge structure 200 may prove a stable detent function since a force capable of further compressing the compressed elastic members 291 and 292 is required in the detent section.

When the electronic device 100 is in a folded state, the display 140 may generate a restoring force by which a folded region is unfolded again. The restoring force of the display 140 may act in the direction in which the electronic device 100 and the hinge structure 200 are unfolded. A force required for compressing the elastic members 291 and 292 in the third state S3 may be greater than the restoring force of the display 140. Accordingly, an operation in which the electronic device 100 and the hinge structure 200 are unfolded by the restoring force of the display 140 may be prevented, and the electronic device 100 and the hinge structure 200 may maintain the fully folded state (e.g., the state of FIG. 2C) or the third state S3 as long as the user does not unfold the electronic device 100 and the hinge structure 200 by applying an external force thereto.

Since the restoring force of the display 140 acts, forces (e.g., net forces) required for performing a folding operation and an unfolding operation of the hinge structure 200 may differ from each other. For example, when the hinge structure 200 is folded in the first state S1, a force capable of compressing the elastic members 291 and 292 and cancelling out the restoring force of the display 140 may be required. In contrast, when the hinge structure 200 is unfolded in the third state S3, a relatively small magnitude of force may be required to compress the elastic members 291 and 292 since the restoring force of the display 140 acts in the direction of compressing the elastic members 291 and 292. For example, when the electronic device 100 is in the fully folded state, the electronic device 100 may be relatively easily unfolded, and even in a situation not intended by the user, the electronic device 100 may be unfolded.

According to various embodiments, the hinge structure 200 may be configured such that the folding detent is reinforced when compared to the unfolding detent. For example, the hinge structure 200 may be configured such that the unfolding detent strength and the folding detent strength differ from each other by differently setting the degree of compression of the elastic members 291 and 292 in the first state S1 and the third state S3. The hinge structure 200 may be configured such that the elastic members 291 and 292 remain more compressed in the third state S3 than in the first state S1. For example, the folding detent may be reinforced by making the degree of compression of the elastic members 291 and 292 in the third state S3 greater than that in the first state S1 by adjusting the positions of the rotational axes R3 and R4 of the arm members 240 and 250.

Figure 16A:
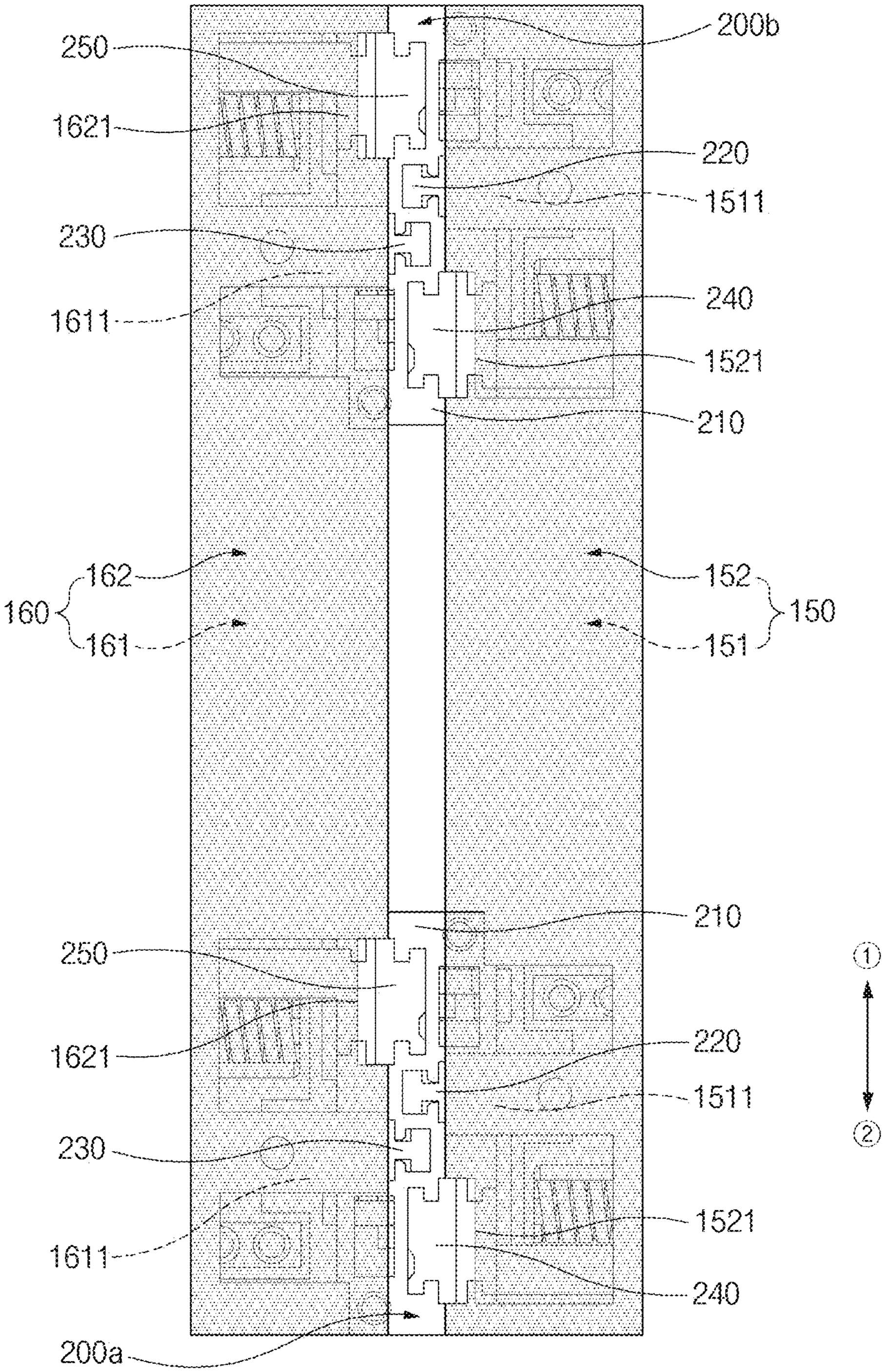
FIG. 16A is a view illustrating the hinge structure and rotary plates according to an embodiment.
Figure 16B:
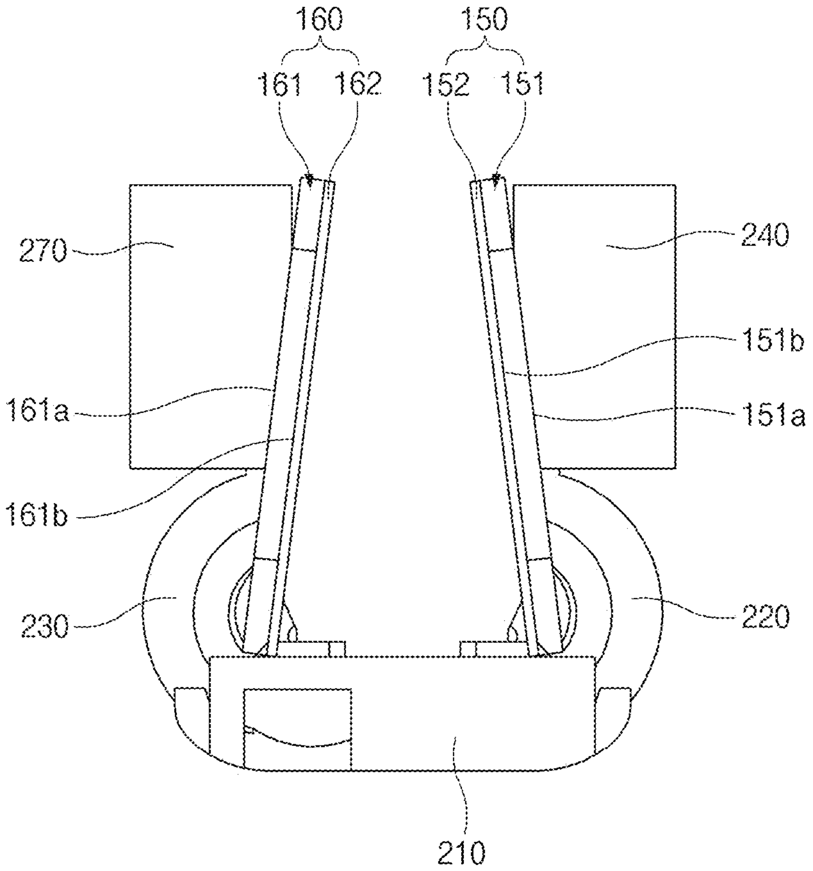
FIG. 16B is a view illustrating the hinge structure and the rotary plates according to an embodiment.
Figure 17:
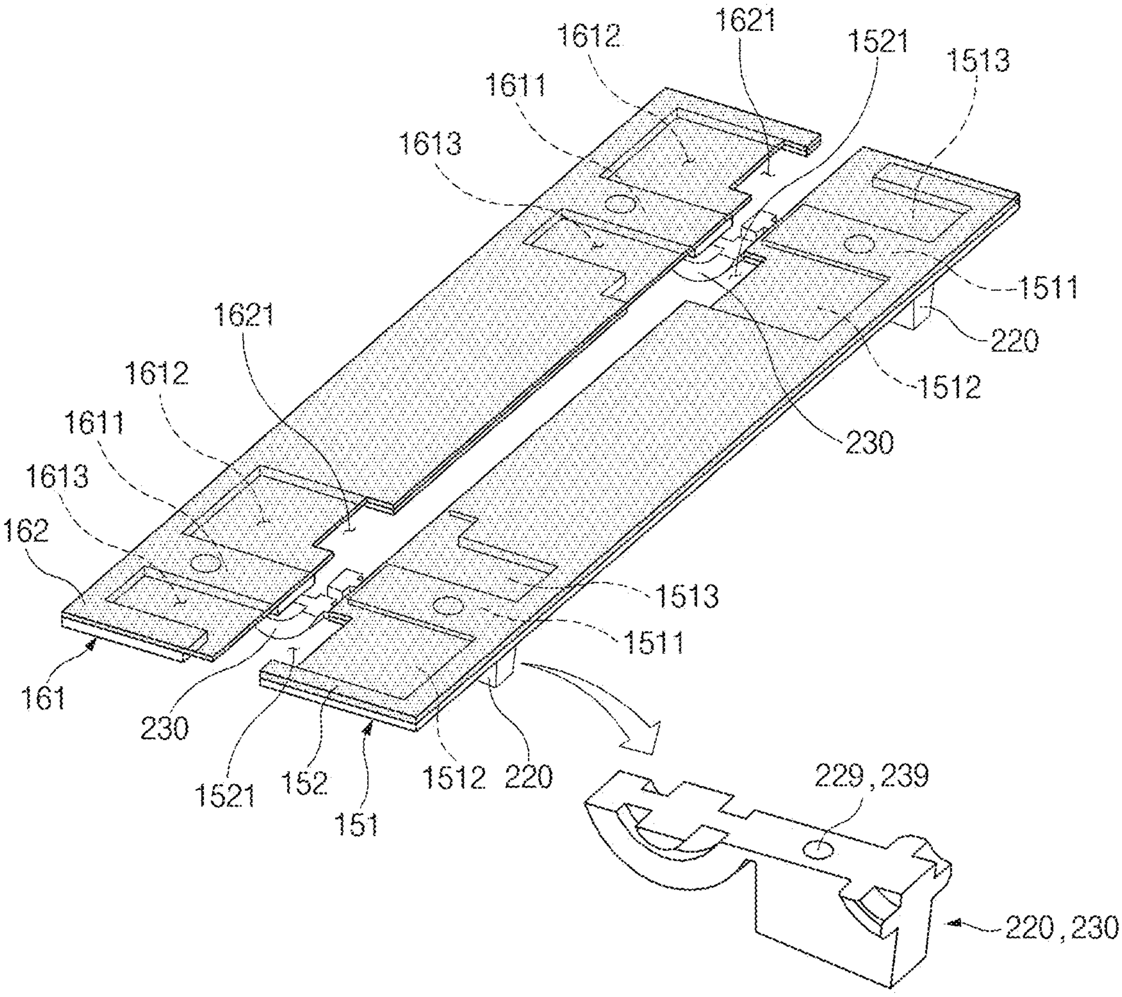
FIG. 17 is a view illustrating the rotary plates and the rotary members according to an embodiment.

FIG. 16A is a view illustrating the hinge structure and the rotary plates according to an embodiment. FIG. 16B is a view illustrating the hinge structure and the rotary plates according to an embodiment. FIG. 17 is a view illustrating the rotary plates and the rotary members according to an embodiment.

FIG. 16A illustrates a plan view of the hinge structure and the rotary plates when the hinge structure is in an unfolded state (e.g., the first state S1 of FIGS. 10 and 12). FIG. 16B illustrates a side view of the hinge structure and the rotary plates as viewed in the first direction ① when the hinge structure of FIG. 16A is in a fully folded state (e.g., the state S3 of FIGS. 10 and 12).

Referring to FIGS. 16A, 16B, and 17, the electronic device according to an embodiment (e.g., the electronic device 100 of FIG. 1) may include the hinge structure 200 and the rotary plates 150 and 160 coupled to the hinge structure 200. For example, the hinge structure 200 may include the fixed member 210, the rotary members 220 and 230, the arm members 240 and 250, and the coupling members 260 and 270, and the rotary plates 150 and 160 may be coupled to the rotary members 220 and 230 and may rotate together with (or, integrally with) the rotary members 220 and 230.

Referring to the electronic device 100 illustrated in FIG. 9 together, the rotary plates 150 and 160 may be coupled to the hinge structure 200 illustrated in FIG. 9 in the form illustrated in FIG. 16A. The electronic device 100 may be configured such that the rotary plates 150 and 160 are coupled to the hinge structure 200 based on FIG. 9, the display (e.g., the display 140 of FIG. 1) is disposed on the rotary plates 150 and 160, and the rotary plates 150 and 160 support a partial region of the display 140 (e.g., the folding region 143 of FIG. 1). For example, FIG. 9 may be understood as a view in which the display 140 and the rotary plates 150 and 160 are omitted.

The rotary plates 150 and 160 may be fixedly coupled to the rotary members 220 and 230 so as to move together with the rotary members 220 and 230. For example, the rotary members 220 and 230 may be fixedly coupled to at least partial regions of the rotary plates 150 and 160 through screws. As illustrated in FIG. 17, the rotary members 220 and 230 may have, in surfaces facing the rotary plates 150 and 160, coupling holes 229 and 239 for screw coupling of the rotary plates 150 and 160. However, a method of coupling the rotary plates 150 and 160 and the rotary members 220 and 230 is not limited to the screw coupling and may include various methods such as bonding, adhesion, and the like.

The rotary plates 150 and 160 may include the first rotary plate 150 coupled to the first rotary member 220 and the second rotary plate 160 coupled to the second rotary member 230. The first rotary plate 150 and the second rotary plate 160 may be formed in substantially the same shape, but are not limited thereto. For example, the first rotary plate 150 may be coupled with the first rotary member 220 of the first hinge structure (e.g., the first hinge structure 200*a* of FIG. 1) and the first rotary member 220 of the second hinge structure (e.g., the second hinge structure 200*b* of FIG. 1). The second rotary plate 160 may be coupled with the second rotary member 230 of the first hinge structure 200*a* and the second rotary member 230 of the second hinge structure 200*b*.

The first rotary plate 150 may include a first layer 151 to which the first rotary member 220 is connected and a second layer 152 stacked on the first layer 151. The first layer 151 may include a first surface 151*a* facing the first rotary member 220 and a second surface 151*b* facing away from the first surface 151*a*, and the second layer 152 may be disposed on the second surface 151*b* of the first layer 151. For example, the first layer 151 may be referred to as a lower layer, and the second layer 152 may be referred to as an upper layer.

The first rotary plate 150 may include a plurality of cut-away portions for avoiding interference with other components of the hinge structure 200 (e.g., the fixed member 210, the first arm member 240, or the first coupling member 260) when the first rotary plate 150 rotates together with the first rotary member 220. For example, cut-away portions 1512, 1513, and 1521 may be formed in the first layer 151 and the second layer 152.

The first layer 151 of the first rotary plate 150 may include the first cut-away portion 1512 and the second cut-away portion 1513 that are formed with a fixed portion 1511 therebetween, the fixed portion 1511 being coupled with the first rotary member 220. For example, the first cut-away portion 1512 and the second cut-away portion 1513 may be formed in positions where the first layer 151 is able to avoid interference or collision with the first arm member 240, the first coupling member 260, and/or the fixed member 210 when folding and unfolding operations of the hinge structure 200 are performed. The first cut-away portion 1512 and the second cut-away portion 1513 may partially overlap the first arm member 240, the first coupling member 260, and/or the fixed member 210 when the second surface 151*b* of the first layer 151 (or, the second layer 152) is viewed from above. The first rotary plate 150 may be provided in a form in which the first cut-away portion 1512 and the second cut-away portion 1513 are formed in the portions to which the first hinge structure 200*a* and the second hinge structure 200*b* are coupled.

The second layer 152 of the first rotary plate 150 may be disposed on the second surface 151*b* of the first layer 151. For example, the second layer 152 may be attached to the second surface 151*b* of the first layer 151. According to an embodiment of the disclosure, considering that stability in the support of the display 140 is likely to lack due to the plurality of cut-away portions 1512 and 1513 formed in the first layer 151, the first rotary plate 150 may be provided in a form in which the second layer 152 is added to the top of the first layer 151. The area occupied by the cut-away portions may be smaller in the second layer 152 than in the first layer 151. For example, the third cut-away portion 1521 for avoiding interference with the first arm member 240 may be formed in the second layer 152.

The second layer 152 of the first rotary plate 150 may partially overlap the first cut-away portion 1512 and the second cut-away portion 1513 that are formed in the first layer 151. For example, when the second layer 152 is viewed from above, the second layer 152 may overlap the first cut-away portion 1512 and the second cut-away portion 1513. The third cut-away portion 1521 of the second layer 152 may be formed in a position overlapping the first cut-away portion 1512 of the first layer 151 and may be formed to be smaller than the first cut-away portion 1512.

The first rotary plate 150 may be formed such that the first layer 151 has a predetermined thickness and may avoid interference with the first arm member 240, the first coupling member 260, and/or the fixed member 210 even though the second layer 152 is disposed to partially cover the cut-away portions 1512 and 1513 of the first layer 151. For example, the first layer 151 may have a specified thickness such that in folding/unfolding operations of the hinge structure 200, at least a portion of each of the first arm member 240, the first coupling member 260, and the fixed member 210 is disposed in a space surrounded by the cut-away portions 1512 and 1513 and the second layer 152, but is not brought into contact with the second layer 152.

Referring to FIG. 15B, when the first rotary member 220 rotates about the fifth axis R5 relative to the first coupling member 260, the first rotary plate 150 may rotate together with the first rotary member 220 by the rotation angle of the first rotary member 220. For example, when the first arm member 240 and the first coupling member 260 rotate through an angle of about 90°, the first rotary member 220 and the first rotary plate 150 may rotate through a rotation angle (e.g., about 97°) exceeding 90°. Accordingly, the first rotary plate 150 may support the folding region 143 of the display 140 such that the folding region 143 forms a dumbbell shape or a water-drop shape.

Although the shape of the first rotary plate 150 and the coupling relationship between the first rotary plate 150 and the first rotary member 220 have been described above based on the first rotary plate 150, the description about the first rotary plate 150 may be identically applied to the second rotary plate 160 and the second rotary member 230. For example, likewise to the first rotary plate 150, the second rotary plate 160 may include a first layer 161 and a second layer 162, and a plurality of cut-away portions 1612, 1613, and 1621 for avoiding interference may be formed in the first layer 161 and the second layer 162. The first layer 161 of the second rotary plate 160 may include a first surface 161*a* and a second surface 161*b*, and the second layer 162 may be disposed on the second surface 161*b*. The first cut-away portion 1612 and the second cut-away portion 1613 may be formed in the first layer 161, and the third cut-away portion 1621 may be formed in the second layer 162. The second rotary plate 160 may rotate together with the second rotary member 230 through a rotation angle (e.g., about 97°) exceeding 90° and may support the folding region 143 of the display 140 together with the first rotary plate 150 such that the folding region 143 forms a dumbbell shape or a water-drop shape.

According to the illustrated embodiment, the rotary plates 150 and 160 may have a structure in which the first layers 151 and 161 and the second layers 152 and 162 are formed as separate parts and coupled together. However, this is illustrative, and according to various embodiments, the first layers 151 and 161 and the second layers 152 and 162 may be integrally formed with each other. According to the illustrated embodiment, the first layers 151 and 161 may be thicker than the second layers 152 and 162. However, without being limited thereto, the thicknesses of the first layers 151 and 161 and the second layers 152 and 162 may be diversely modified.

Figure 18:
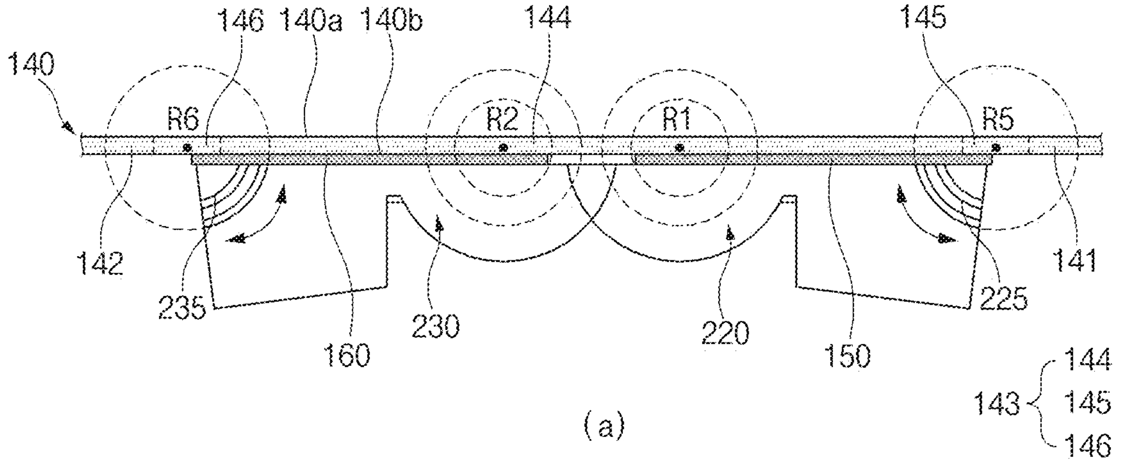
FIG. 18 is a view illustrating a rotation operation of the rotary members and the rotary plates and a folding operation of a display when the electronic device is folded, according to an embodiment.
Figure 18:
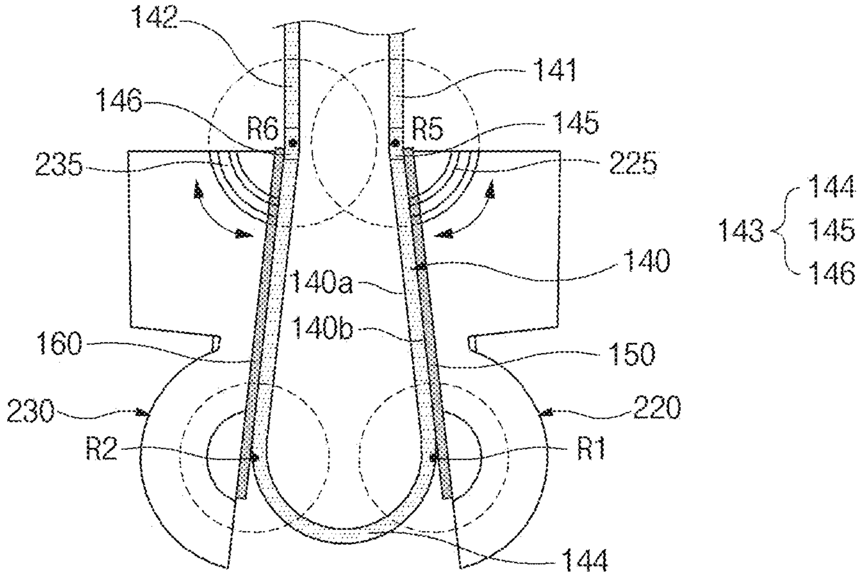
Figure 19:
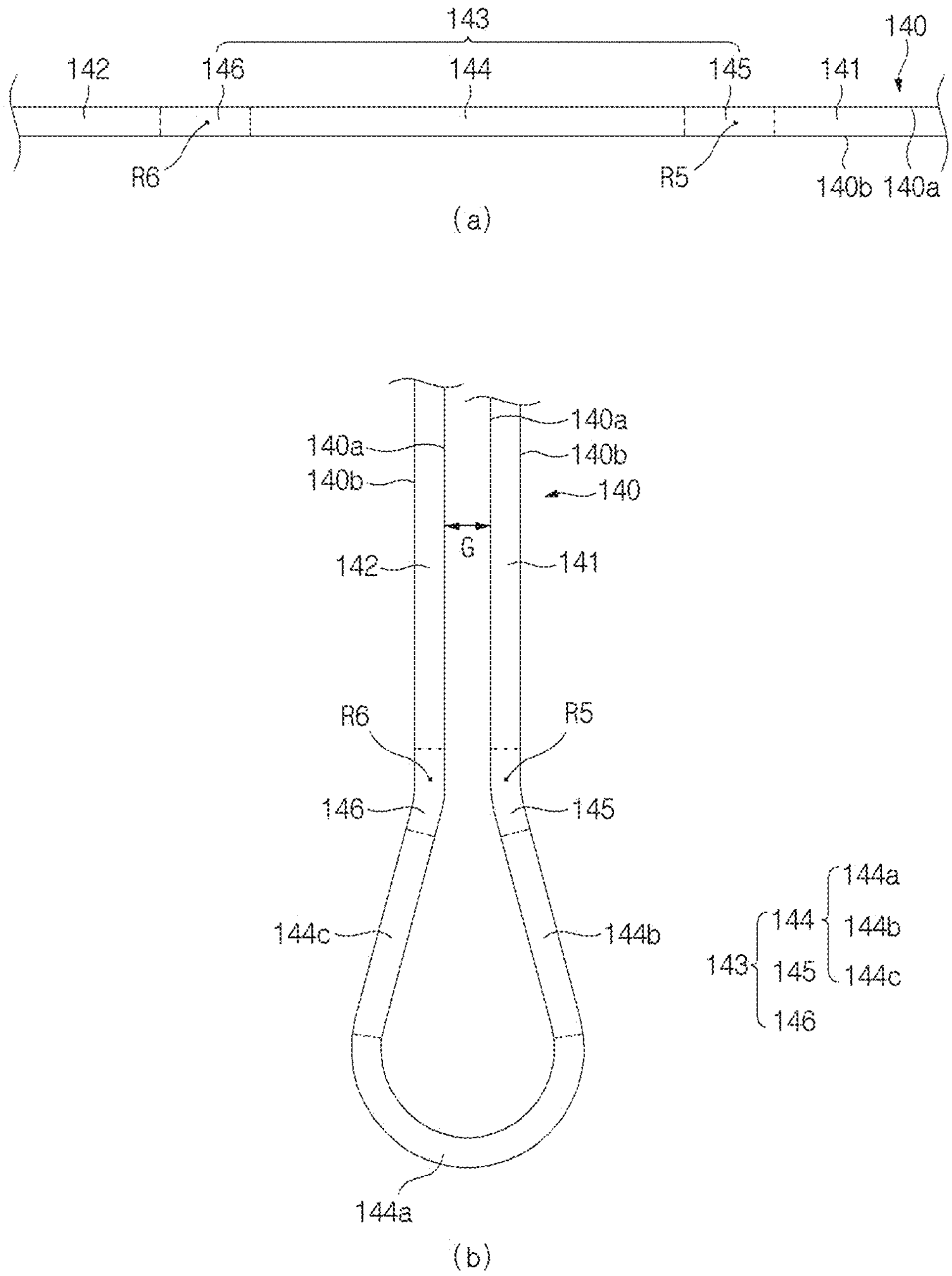
FIG. 19 is a view illustrating the folding operation of the display when the electronic device is folded, according to an embodiment.

FIG. 18 is a view illustrating a rotation operation of the rotary members and the rotary plates and a folding operation of the display when the electronic device is folded, according to an embodiment. FIG. 19 is a view illustrating the folding operation of the display when the electronic device is folded, according to an embodiment.

FIG. 18 illustrates the positions of the rotary members and the rotary plates and the shape of the display when the electronic device is in an unfolded state and a fully folded state. For example, FIG. 18(*a*) illustrated the rotary members, the rotary plates, and the display when the electronic device is in the unfolded state, and FIG. 18(*b*) illustrates the rotary members, the rotary plates, and the display when the electronic device is in the fully folded state.

FIG. 19 illustrates the shape of the display when the electronic device is in the unfolded state and the fully folded state. For example, FIG. 19(*a*) illustrates the display in the state illustrated in FIG. 18(*a*), and FIG. 19(*b*) illustrates the display in the state illustrated in FIG. 18(*b*).

Referring to FIGS. 18 and 19, the electronic device according to an embodiment (e.g., the electronic device 100 of FIG. 1) may include the display 140, the first rotary plate 150, the second rotary plate 160, the first rotary member 220, and the second rotary member 230. FIG. 18 may be a view in which other components of the electronic device 100 and the hinge structure 200 are omitted to describe an operation in which the display is supported while forming a predetermined shape by rotation of the rotary members and the rotary plates.

The display 140 may be folded as the display 140 moves together with the first housing (e.g., the first housing 110 of FIG. 1) and the second housing (e.g., the second housing 120 of FIG. 1) of the electronic device 100. For example, the display 140 may include the first region 141 disposed on the first housing 110, the second region 142 disposed on the second housing 120, and the folding region 143 located between the first region 141 and the second region 142. The first region 141 may be attached to at least a portion of the first housing 110, and the second region 142 may be attached to at least a portion of the second housing 120. When the electronic device 100 is folded or unfolded, the first region 141 may move together with the first housing 110, the second region 142 may move together with the second housing 120, and the folding region 143 may partially form a curved or flat surface between the first region 141 and the second region 142.

The display 140 may generate a repulsive force in the folding operation. For example, the repulsive force may be generated from the folding region 143 as the folding region 143 forms a curved surface when the folding operation is performed. The repulsive force of the display 140 may act on the first rotary plate 150 and the second rotary plate 160. For example, the repulsive force may push the first rotary plate 150 and the second rotary plate 160 toward the outside. The repulsive force applied to the first rotary plate 150 and the second rotary plate 160 may be transmitted to the first rotary member 220 and the second rotary member 230. The first rotary member 220 and the second rotary member 230 may be rotated through a predetermined angle along the specified rotational paths by the transmitted repulsive force, and the first rotary plate 150 and the second rotary plate 160 may support the display 140 such that a portion of the display 140 forms a specific shape (e.g., a dumbbell shape, a water-drop shape, or a jar shape).

The folding region 143 of the display 140 may include an in-folding region 144, a first out-folding region 145 located between the first region 141 and the in-folding region 144, and a second out-folding region 146 located between the second region 142 and the in-folding region 144. In the unfolded state, the in-folding region 144 and the out-folding regions 145 and 146 may form substantially the same plane as the first region 141 and the second region 142. In the fully folded state, each of the in-folding region 144 and the out-folding regions 145 and 146 may partially form a curved surface having a predetermined curvature. Referring to FIG. 18(*b*), in the fully folded state, the in-folding region 144 and the out-folding regions 145 and 146 may be folded while being supported by the rotary plates 150 and 160, and the display 140 may be formed in a dumbbell shape or a water-drop shape.

According to various embodiments, in the unfolded state, the in-folding region 144 and the out-folding regions 145 and 146 may form a substantially flat shape, or may have a small curvature less than or equal to a specified value so as to be very close to a substantially flat surface. For example, the unfolded state may mean a state in which the in-folding region 144 and the out-folding regions 145 and 146 of the display 140 have a minimum curvature (or, a maximum radius of curvature).

The display 140 may include a first surface 140*a* forming the outer surface (or, the front surface) of the electronic device 100 in the unfolded state and a second surface 140*b* facing away from the first surface 140*a*. For example, the first surface 140*a* may mean the surface exposed outside the electronic device 100 in the unfolded state, and the second surface 140*b* may mean the rear surface of the display 140.

For example, the housings 110 and 120 and/or the rotary plates 150 and 160 may be brought into contact with at least portions of the second surface 140*b*.

The in-folding region 144 may mean the region where the display 140 is folded inward, and the out-folding regions 145 and 146 may mean the regions where the display 140 is folded outward. For example, the in-folding region 144 may be defined as a region where one region and another region of the first surface 140*a* adjacent to each other are folded toward each other. The out-folding regions 145 and 146 may be defined as regions where one region and another region of the second surface 140*b* adjacent to each other are folded toward each other. In the fully folded state, the curvature of a curved surface formed by the in-folding region 144 may be greater than the curvatures of curved surfaces formed by the out-folding region 145 and 146.

According to the illustrated embodiment, in the fully folded state, the first region 141 and the second region 142 of the display 140 may be disposed to face each other in parallel. For example, in the fully folded state, the first region 141 and the second region 142 may extend parallel to each other in the z-axis direction from the opposite end portions of the folding region 143. Accordingly, in the fully folded state, the curvature of the folding region 143 may be made smaller than a specified value so that a crease in the folding region 143 may be improved, and as the first region 141 and the second region 142 extend parallel to each other, the first housing 110 and the second housing 120 may completely make contact with each other such that a gap is not generated between the first housing 110 and the second housing 120.

Hereinafter, a rotation operation of the rotary members 220 and 230 and the rotary plates 150 and 160 for forming the display 140 in a dumbbell shape or a water-drop shape will be described.

The first rotary member 220 and the first rotary plate 150 may be rotated about the fifth axis R5 by the repulsive force of the display 140. For example, in a folding operation of the electronic device 100, the first rotary member 220 and the first rotary plate 150 may be rotated about the fifth axis R5 relative to the first coupling member (e.g., the first coupling member 260 of FIGS. 3 and 4) in the first rotational direction by the repulsive force while rotating about the first axis R1 in the first rotational direction (e.g., the counterclockwise direction base on FIG. 18). Accordingly, the first rotary member 220 and the first rotary plate 150 may rotate more in the first rotational direction than the first coupling member 260. A rotational path of the first rotary member 220 and the first rotary plate 150 relative to the first coupling member 260 may be formed as the fifth guide protrusions 225 of the first rotary member 220 move along the fifth guide rails (e.g., the fifth guide rails 265 of FIG. 4) of the first coupling member 260, and the centers of the arcs of the fifth guide protrusions 225 and the fifth guide rails 265 may form the fifth axis R5. For example, when the electronic device 100 is folded or unfolded, the first rotary member 220 may rotate through a specified range along an arc-shaped path whose center coincides with the fifth axis R5.

The second rotary member 230 and the second rotary plate 160 may be rotated about the sixth axis R6 by the repulsive force of the display 140. For example, in the folding operation of the electronic device 100, the second rotary member 230 and the second rotary plate 160 may be rotated about the sixth axis R6 relative to the second coupling member (e.g., the second coupling member 270 of FIGS. 3 and 4) in the second rotational direction by the repulsive force while rotating about the second axis R2 in the second rotational direction (e.g., the clockwise direction base on FIG. 18). Accordingly, the second rotary member 230 and the second rotary plate 160 may rotate more in the second rotational direction than the second coupling member 270. A rotational path of the second rotary member 230 and the second rotary plate 160 relative to the second coupling member 270 may be formed as the sixth guide protrusions 235 of the second rotary member 230 move along the sixth guide rails (e.g., the sixth guide rails 275 of FIG. 4) of the second coupling member 270, and the centers of the arcs of the sixth guide protrusions 235 and the sixth guide rails 275 may form the sixth axis R6. For example, when the electronic device 100 is folded or unfolded, the second rotary member 230 may rotate through a specified range along an arc-shaped path whose center coincides with the sixth axis R6.

The fifth axis R5 and the sixth axis R6 may be located on the display 140. For example, the fifth axis R5 and the sixth axis R6 may be located in at least partial regions of the display 140 when the electronic device 100 is viewed in the axial directions. For example, the fifth axis R5 and the sixth axis R6 may be located between the opposite surfaces of the display 140 in the thickness direction. Based on FIG. 18, the fifth axis R5 and the sixth axis R6 may be located between the first surface 140*a* and the second surface 140*b* of the display 140. For example, the fifth axis R5 and the sixth axis R6 may pass through or penetrate at least portions of the display 140 in the axial directions.

The fifth axis R5 and the sixth axis R6 may overlap the display 140. For example, the fifth axis R5 and the sixth axis R6 may overlap at least portions of the display 140 when the display 140 is viewed in the axial directions. For example, the fifth axis R5 may overlap at least a portion of the first out-folding region 145 of the display 140, and the sixth axis R6 may overlap at least a portion of the second out-folding region 146 of the display 140. The fifth axis R5 may appear to penetrate the first out-folding region 145 of the display 140 in a direction parallel to the axial directions. The sixth axis R6 may appear to penetrate the second out-folding region 146 of the display 140 in a direction parallel to the axial directions.

According to the embodiment illustrated in FIG. 19, the folding region 143 of the display 140 may include a portion (e.g., a variable region 144*a* of the in-folding region 144 and the out-folding regions 145 and 146) that deforms to be curved or flat while being folded when the electronic device 100 is folded or unfolded and a portion (e.g., non-variable regions 144*b* and 144*c* of the in-folding region 144) that remains substantially flat without being folded.

The in-folding region 144 of the display 140 may include the variable region 144*a* that deforms to be curved or flat in response to folding and unfolding operations and the first non-variable region 144*b* and the second non-variable region 144*c* that extend from the opposite end portions of the variable region 144*a* and remain flat. For example, the first non-variable region 144*b* may be defined as a region between the first out-folding region 145 and the variable region 144*a*. The second non-variable region 144*c* may be defined as a region between the second out-folding region 146 and the variable region 144*a*. The variable region 144*a* may form a curved surface having a predetermined curvature in a folded state and may form a substantially flat surface in an unfolded state. The first non-variable region 144*b* and the second non-variable region 144*c* may remain flat in the folded state and the unfolded state.

The variable region 144*a* may be partially spaced apart from, or brought into contact with, the first rotary plate 150 and the second rotary plate 160 depending on the folding and unfolding operations. In the unfolded state, the variable region 144*a* may be brought into contact with the first rotary plate 150 and the second rotary plate 160 and may be supported by the first rotary plate 150 and the second rotary plate 160. In the folding operation, the variable region 144*a* may deform to be curved while being spaced apart from the first rotary plate 150 and the second rotary plate 160. For example, the variable region 144*a* may not be attached to the first rotary plate 150 and the second rotary plate 160.

The first non-variable region 144*b* may be attached to at least a portion of the first rotary plate 150. For example, the first non-variable region 144*b* may move together with the first rotary plate 150. The display 140 may be configured such that as the fifth axis R5 is located in the first out-folding region 145, the first non-variable region 144*b* rotates about the fifth axis R5 relative to the first region 141 in the folding and unfolding operations. For example, the first non-variable region 144*b* may substantially form an angle of 180° with the first region 141 in the unfolded state and may form an angle of less than 180° with the first region 141 in the fully folded state.

The second non-variable region 144*c* may be attached to at least a portion of the second rotary plate 160. For example, the second non-variable area 144*c* may move together with the second rotary plate 160. The display 140 may be configured such that as the sixth axis R6 is located in the second out-folding region 146, the second non-variable region 144*c* rotates about the sixth axis R6 relative to the second region 142 in the folding and unfolding operations. For example, the second non-variable region 144*c* may substantially form an angle of 180° with the second region 142 in the unfolded state and may form an angle of less than 180° with the second region 142 in the fully folded state.

The first out-folding region 145 may be defined between the first region 141 and the first non-variable region 144*b*. The first out-folding region 145 may be a region that is used as the basis for relative rotation between the first region 141 and the first non-variable region 144*b* in the folding and unfolding operations. For example, in response to rotation between the first region 141 and the first non-variable region 144*b*, the first out-folding region 145 may form a flat surface, or may form, in at least a portion thereof, a curved surface having a predetermined curvature. As at least a portion of the first out-folding region 145 forms a curved surface, the first region 141 and the first non-variable region 144*b* may form an angle of less than 180°. The total length of the first out-folding region 145 may remain substantially the same in the folding and unfolding operations.

The second out-folding region 146 may be defined between the second region 142 and the second non-variable region 144*c*. The second out-folding region 146 may be a region that is used as the basis for relative rotation between the second region 142 and the second non-variable region 144*c* in the folding and unfolding operations. For example, in response to rotation between the second region 142 and the second non-variable region 144*c*, the second out-folding region 146 may form a flat surface, or may form, in at least a portion thereof, a curved surface having a predetermined curvature. As at least a portion of the second out-folding region 146 forms a curved surface, the second region 142 and the second non-variable region 144*c* may form an angle of less than 180°. The total length of the second out-folding region 146 may remain substantially the same in the folding and unfolding operations.

The division of the folding region 143 according to the illustrated embodiment is illustrative, and the disclosure is not limited thereto. The folding region 143 may be configured in various ways as long as the first region 141 and the second region 142 extend in parallel while being spaced apart from each other by a predetermined gap by an in-folding region folded inward by the rotary plates 150 and 160 in response to a folding operation of the electronic device 100 and out-folding regions located at opposite ends of the in-folding region.

Figure 20:
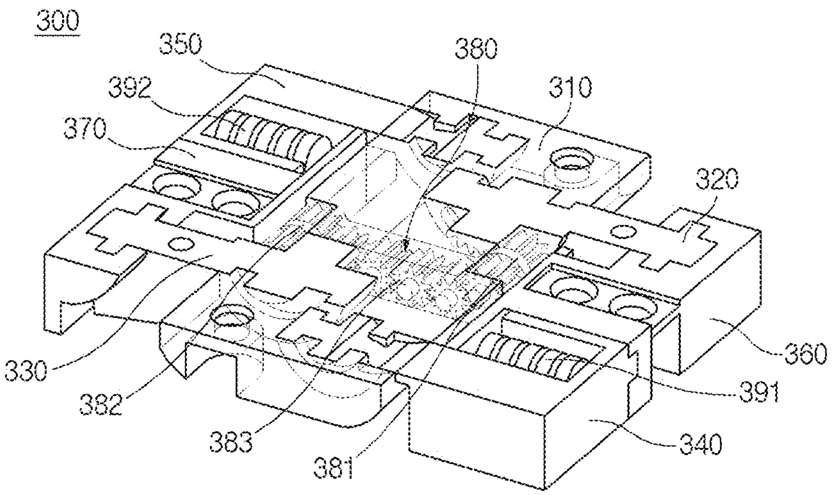
FIG. 20 is a view illustrating a hinge structure according to an embodiment.
Figure 20:
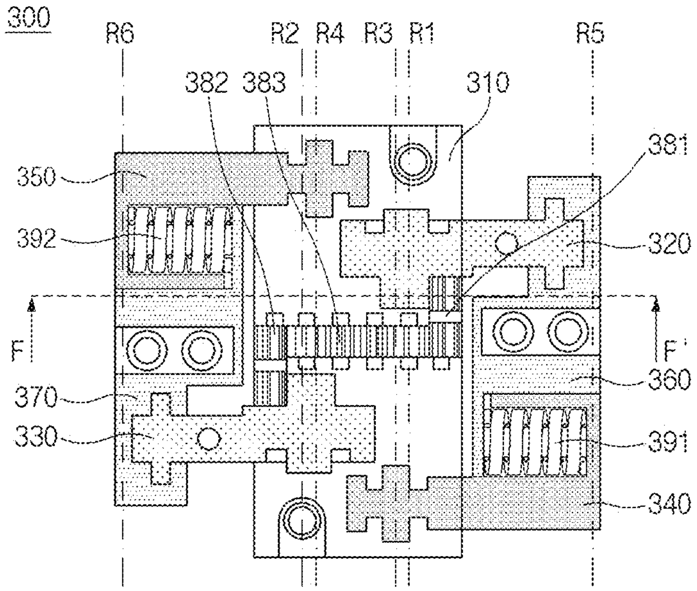
Figure 21:
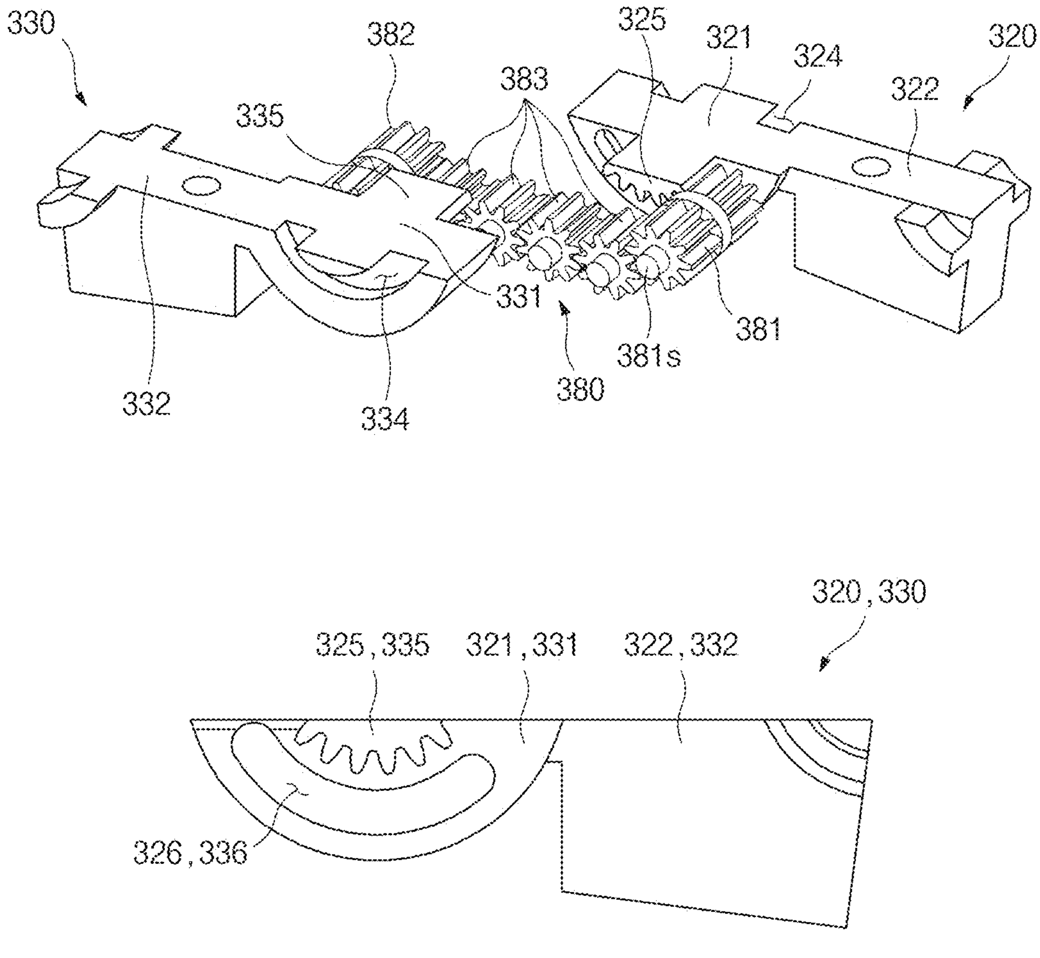
FIG. 21 is a view illustrating an interlocking member of the hinge structure according to an embodiment.
Figure 22:
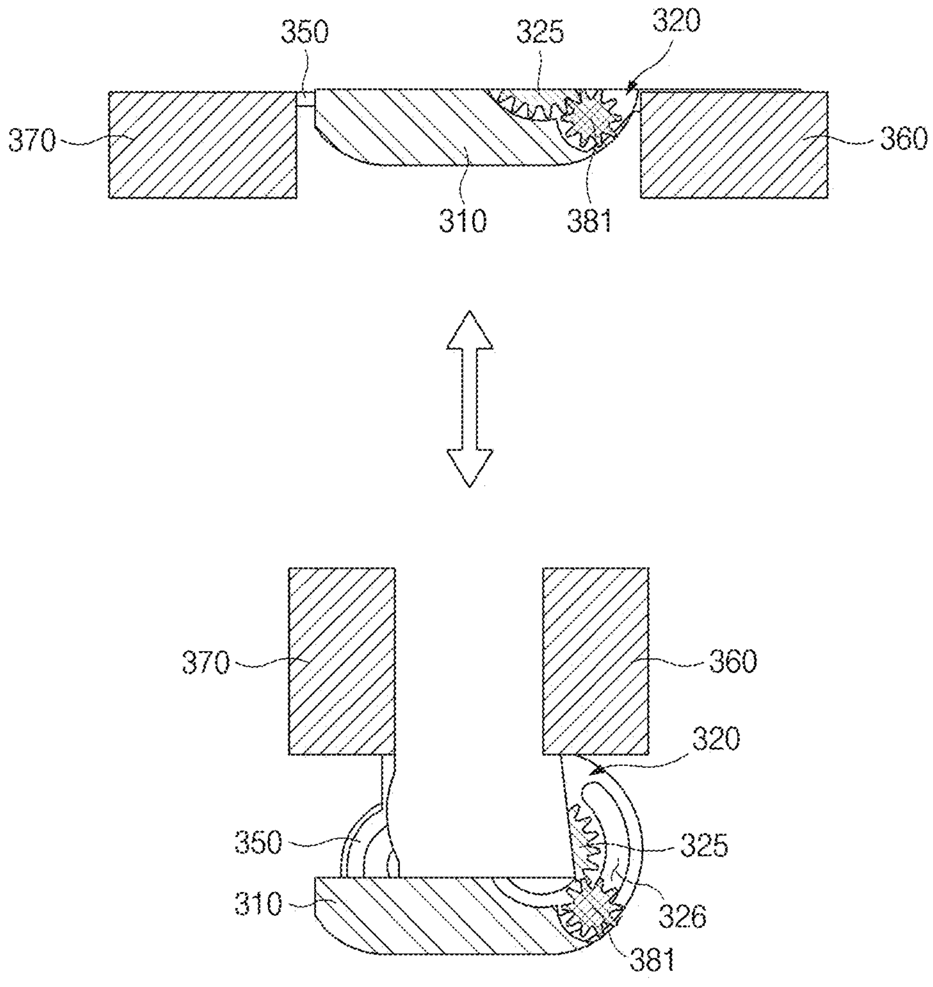
FIG. 22 is a view illustrating an operation of the interlocking member of the hinge structure according to an embodiment.

FIG. 20 is a view illustrating a hinge structure according to an embodiment. FIG. 21 is a view illustrating an interlocking member and rotary members of the hinge structure according to an embodiment. FIG. 22 is a view illustrating an operation of the interlocking member of the hinge structure according to an embodiment.

FIG. 22 illustrates sectional views for explaining a rotation operation of the hinge structure illustrated in FIG. 20, wherein the sectional views are taken along line F-F' of FIG. 20.

Referring to FIGS. 20, 21, and 22, the hinge structure 300 according to an embodiment may include a fixed member 310, a first rotary member 320, a second rotary member 330, a first arm member 340, a second arm member 350, a first coupling member 360, a second coupling member 370, a first elastic member 391, a second elastic member 392, and the interlocking member 380.

FIGS. 20, 21, and 22 illustrate the hinge structure 300 according to the second embodiment that has a shape and/or structure different from that of the hinge structure according to the first embodiment (e.g., the hinge structure 200 of FIGS. 3, 4, and 10) described above with reference to the previous drawings.

The hinge structure 300 according to the second embodiment and the hinge structure 200 according to the first embodiment may differ from each other in terms of the configuration of the interlocking member 380. For example, the fixed member 310, the rotary members 320 and 330, the arm members 340 and 350, the coupling members 360 and 370, and the elastic members 391 and 392 of the hinge structure 300 according to the second embodiment may be substantially the same as, or similar to, the fixed member (e.g., the fixed member 210 of FIGS. 3, 4, and 10), the rotary members (e.g., the rotary members 220 and 230 of FIGS. 3, 4, and 10), the arm members (e.g., the arm members 240 and 250 of FIGS. 3, 4, and 10), the coupling members (e.g., the coupling members 260 and 270 of FIGS. 3, 4, and 10), and the elastic members (e.g., the elastic members 291 and 292 of FIGS. 3, 4, and 10) of the hinge structure 200 according to the first embodiment, and the descriptions about the operations of the hinge structure 200 according to the first embodiment may be identically applied to the hinge structure 300 according to the second embodiment.

Hereinafter, in describing the hinge structure 300 according to the second embodiment, repetitive descriptions will be omitted, and the following description will be focused on the difference between the hinge structure 200 according to the first embodiment and the hinge structure 300 according to the second embodiment.

The interlocking member 380 may be formed in a gear structure. Accordingly, the hinge structure 300 may rotationally interlock components (e.g., the first rotary member 320, the first arm member 340, and the first coupling member 360) connected to one side of the fixed member 310 and components (e.g., the second rotary member 330, the second arm member 350, and the second coupling member 370) connected to an opposite side of the fixed member 310.

The interlocking member 380 may interlock the first rotary member 320 and the second rotary member 330 such that the first rotary member 320 and the second rotary member 330 rotate through the same angle in opposite directions. For example, when one of the first rotary member 320 and the second rotary member 330 rotates through a first angle in a first rotational direction, the interlocking member 380 may rotate the other one by the first angle in the direction opposite to the first rotational direction. The interlocking member 380 may be disposed inside or under the fixed member 310 in a state of being connected to the first rotary member 320 and the second rotary member 330.

The interlocking member 380 may include a first main gear 381 connected with a first saw-tooth portion 325 of the first rotary member 320, a second main gear 382 connected with a second saw-tooth portion 335 of the second rotary member 330, and a connecting gear 383 that connects the first main gear 381 and the second main gear 382. For example, the connecting gear 383 may be connected to the first main gear 381 and the second main gear 382 such that the first main gear 381 and the second main gear 382 interlock with each other. The first main gear 381 may be engaged with the first saw-tooth portion 325 of the first rotary member 320 and part of the connecting gear 383. For example, the first main gear 381 may include a first gear engaged with the first saw-tooth portion 325 and a second gear engaged with the connecting gear 383. The second main gear 382 may be engaged with the second saw-tooth portion 335 of the second rotary member 330 and another part of the connecting gear 383. For example, the second main gear 382 may include a third gear engaged with the second saw-tooth portion 335 and a fourth gear engaged with the connecting gear 383. The connecting gear 383 may include an even number of sub-gears such that the first main gear 381 and the second main gear 382 rotationally interlock with each other in opposite directions. According to the illustrated embodiment, the connecting gear 383 may include four sub-gears, but is not limited thereto.

The rotary members 320 and 330 may include the saw-tooth portions 325 and 335 engaged with saw teeth (e.g., gear teeth) of the main gears 381 and 382 of the interlocking member 380.

The first rotary member 320 may include a first coupling part 321 to which the fixed member 310 is coupled so as to be rotatable about a first axis R1 and a second coupling part 322 to which the first coupling member 360 is coupled so as to be rotatable about a fifth rotational axis. The first coupling part 321 may include the first saw-tooth portion 325 engaged with the first main gear 381 of the interlocking member 380. For example, the first main gear 381 may rotate in the direction opposite to the rotational direction of the first coupling part 321 in response to a rotation operation of the first coupling part 321 relative to the fixed member 310.

The first saw-tooth portion 325 may be formed on a partial region of the first coupling part 321 that faces toward the first arm member 340, and a first guide rail 324 in which a first guide protrusion (not illustrated) of the fixed member 310 is accommodated may be formed on a partial region of the first coupling part 321 that faces away from the first saw-tooth portion 325. A plurality of saw teeth engaged with the plurality of saw teeth of the first main gear 381 may protrude from an outer circumferential surface of the first saw-tooth portion 325. A first recess 326 may be formed on the first coupling part 321 along the periphery of the first saw-tooth portion 325. A shaft **381*s* of the first main gear 381 may be accommodated in the first recess 326, and when the first rotary member 320 rotates, the shaft 381*s* of the first main gear 381 may move along the first recess 326. For example, the first recess 326** may have an arc shape whose center coincides with the first axis R1.

The second rotary member 330 may include a third coupling part 331 to which the fixed member 310 is coupled so as to be rotatable about a second axis R2 and a fourth coupling part 332 to which the second coupling member 370 is coupled so as to be rotatable about a sixth axis R6. The third coupling part 331 may include the second saw-tooth portion 335 engaged with the second main gear 382 of the interlocking member 380. For example, the second main gear 382 may rotate in the direction opposite to the rotational direction of the third coupling part 331 in response to a rotation operation of the third coupling part 331 relative to the fixed member 310.

The second saw-tooth portion 335 may be formed on a partial region of the third coupling part 331 that faces toward the second arm member 350, and a second guide rail 334 in which a second guide protrusion (not illustrated) of the fixed member 310 is accommodated may be formed on a partial region of the third coupling part 331 that faces away from the second saw-tooth portion 335. A plurality of saw teeth engaged with the plurality of saw teeth of the second main gear 382 may protrude from an outer circumferential surface of the second saw-tooth portion 335. A second recess 336 may be formed on the second coupling part 322 along the periphery of the second saw-tooth portion 335. A shaft **381*s* of the second main gear 382 may be accommodated in the second recess 336, and when the second rotary member 330 rotates, the shaft 381*s* of the second main gear 382 may move along the second recess 336. For example, the second recess 336** may have an arc shape whose center coincides with the second axis R2.

Hereinafter, an operation in which the first rotary member 320 and the second rotary member 330 are rotationally interlocked with each other by the interlocking member 380 will be described with reference to FIGS. 21 and 22.

In a folding operation of the hinge structure 300, the first main gear 381 engaged with the first saw-tooth portion 325 may rotate in a second rotational direction opposite to the first rotational direction as the first rotary member 320 rotates in the first rotational direction. In response to the rotation of the first main gear 381, the sub-gears included in the connecting gear 383 may rotate in conjunction with each other and may rotate the second main gear 382 in the first rotational direction. As the second main gear 382 rotates in the first rotational direction, the second rotary member 330 may rotate in the second rotational direction by substantially the same angle as the angle by which the first rotary member 320 rotates. Rotational interlocking by the interlocking member 380 in an unfolding operation of the hinge structure 300 may operate substantially the same as that in the folding operation of the hinge structure 300, except that the rotational directions are reversed.

According to the illustrated embodiment, the main gears 381 and 382 and the rotary members 320 and 330 (e.g., the saw-tooth portions 325 and 335) may be rotationally interlocked with each other since the saw teeth thereof are engaged with each other. However, the illustrated embodiment is illustrative, and the disclosure is not limited thereto. According to various embodiments, the main gears 381 and 382 may be directly fixed to the rotary members 320 and 330 through the shafts. For example, the shafts **381*s* of the main gears 381 and 382 may be coupled to the rotary members 320 and 330 so as to rotate together when the rotary members 320 and 330 rotate, and the main gears 381 and 382 may rotate the connecting gear 383 while rotating together when the rotary members 320 and 330 rotate. In another example, the main gears 381 and 382 may be omitted from the interlocking member 380, and the saw-tooth portions 325 and 335 of the rotary members 320 and 330 may be directly engaged with the connecting gear 383 to interlock the first rotary member 320 and the second rotary member 330**.

Figure 23:
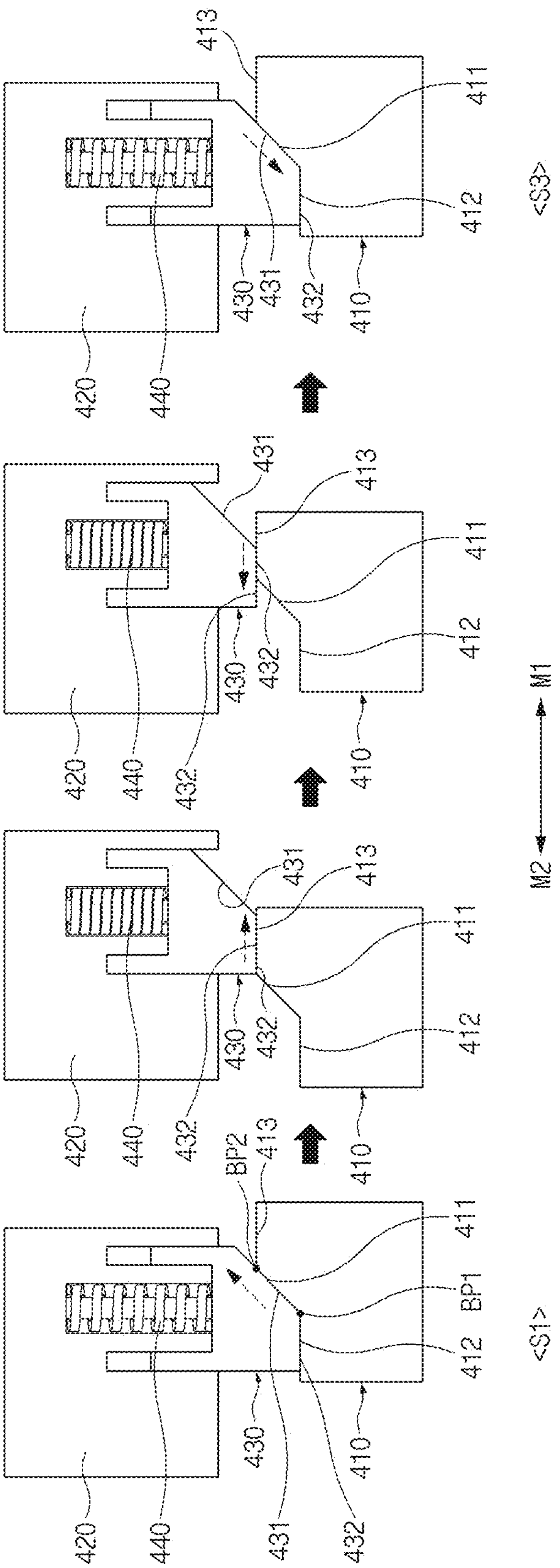
FIG. 23 is a view illustrating a cam structure of a hinge structure according to an embodiment.

FIG. 23 is a view illustrating a cam structure of a hinge structure according to an embodiment.

FIG. 23 illustrates the hinge structure including the cam structure to provide a free-stop function.

Referring to FIG. 23, the hinge structure 400 according to an embodiment may include an arm member 410, a coupling member 420, a cam member 430, and an elastic member 440. The hinge structure 400 may be referred to as the hinge structure 200 according to the first embodiment illustrated in FIGS. 3 and 4 and/or the hinge structure 300 according to the second embodiment illustrated in FIG. 20.

For example, the arm member 410 may be referred to as the arm member of the hinge structure 200 according to the first embodiment (e.g., the arm member 240 or 250 of FIGS. 3 and 4) or the arm member of the hinge structure 300 according to the second embodiment (e.g., the arm member 340 or 350 of FIG. 20). The coupling member 420 may be referred to as the coupling member of the hinge structure 200 according to the first embodiment (e.g., the coupling member 260 or 270 of FIGS. 3 and 4) or the coupling member of the hinge structure 300 according to the second embodiment (e.g., the coupling member 360 or 370 of FIG. 20). The elastic member 440 may be referred to as the elastic member of the hinge structure 200 according to the first embodiment (e.g., the elastic member 291 or 292 of FIGS. 3 and 4) and/or the elastic member of the hinge structure 300 according to the second embodiment (e.g., the elastic member 391 or 392 of FIG. 20). The cam structure to be described below may be applied to the hinge structure 200 according to the first embodiment and the hinge structure 300 according to the second embodiment described above.

The cam member 430 may be disposed between the coupling member 420 and the arm member 410. The cam member 430 may be coupled to the coupling member 420 so as to be movable in a direction of compressing/uncompressing the elastic member 440 with respect to the coupling member 420. The cam member 430, together with the coupling member 420, may perform a linear reciprocating motion relative to the arm member 410.

The cam member 430 may include a first inclined surface 431 and a first horizontal surface 432 extending from the first inclined surface 431. The cam member 430 may support the elastic member 440 such that the elastic member 440 is compressed/uncompressed between the cam member 430 and the coupling member 420. For example, the elastic member 440 may be disposed between the cam member 430 and the coupling member 420 and may be compressed or uncompressed depending on a change in the distance between the cam member 430 and the coupling member 420.

The arm member 410 may be disposed to make contact with the cam member 430. The arm member 410 may include a second inclined surface 411 corresponding to the cam member 430, a second horizontal surface 412 extending from one side of the second inclined surface 411, and a third horizontal surface 413 extending from an opposite side of the second inclined surface 411. For example, the second inclines surface 411 may obliquely extend from the second horizontal surface 412 toward the coupling member 420, and the third horizontal surface 413 may extend parallel to the second horizontal surface 412 from the second inclined surface 411.

According to the illustrated embodiment, the first horizontal surface 432, the second horizontal surface 412, and the third horizontal surface 413 may be formed parallel to each other and may be parallel to sliding directions M1 and M2 between the arm member 410 and the coupling member 420. However, the illustrated embodiment is illustrative, and the disclosure is not limited thereto. According to various embodiments, the first horizontal surface 432 may be obliquely formed to have a smaller inclination than the first inclined surface 431, and the second horizontal surface 412 and the third horizontal surface 413 may be obliquely formed to correspond to the inclination of the first horizontal surface 432 so as to make contact with the first horizontal surface 432.

The hinge structure 400 may be in a first state S1 when an electronic device (e.g., the electronic device 100 of FIGS. 1, 2A, 2B, and 2C) is in an unfolded state (e.g., the state of FIG. 2A) and may be in a third state S3 when the electronic device 100 is in a fully folded state (e.g., the state of FIG. 2C).

The hinge structure 400 may be configured such that in the first state S1 and the third state S3, the first horizontal surface 432 of the cam member 430 makes contact with the second horizontal surface 412 of the arm member 410 and the first inclined surface 431 of the cam member 430 makes contact with the second inclined surface 411 of the arm member 410. When the hinge structure 400 is folded or unfolded, the coupling member 420 may perform a linear reciprocating motion relative to the arm member 410. Accordingly, in the first state S1 and the third state S3, the relative position between the cam member 430 and the arm member 410 may be substantially the same.

In an operation in which the hinge structure 400 is changed from the first state S1 to the third state S3, the coupling member 420 may linearly move relative to the arm member 410, and the cam member 430 may compress the elastic member 440 as the first inclined surface 431 moves along the second inclined surface 411 of the arm member 410. When the first horizontal surface 432 of the cam member 430 and the third horizontal surface 413 of the arm member 410 make contact with each other, the elastic member 440 may remain in a predetermined compressed state, and the hinge structure 400 may remain folded with a certain angle between the first state S1 and the third state S3. Accordingly, the electronic device 100 may remain in an intermediate folded state between the unfolded state (e.g., refer to FIG. 2A) and the fully folded state (e.g., refer to FIG. 2C) (e.g., a free-stop function).

When the hinge structure 400 is changed from the first state S1 to the third state S3, the coupling member 420 and the cam member 430 may perform a reciprocating motion while moving relative to the arm member 410 in the first sliding direction M1 and then moving in the second sliding direction M2 opposite to the first sliding direction M1. In the process of being changed from the first state S1 to the third state S3, the hinge structure 400 may provide the free-stop function while the first horizontal surface 432 of the cam member 430 and the third horizontal surface 413 of the arm member 410 remain in contact with each other. To describe the operation, the point at which the first inclined surface 431 and the first horizontal surface 432 meet each other may be defined as a first boundary point BP1, and the point at which the second inclined surface 411 and the third horizontal surface 413 meet each other may be defined as a second boundary point BP2. For example, the hinge structure 400 may provide the free-stop function from the time when the cam member 430 makes contact with the first boundary point BP1 and the second boundary point BP2 while moving in the first sliding direction M1 to the time when the cam member 430 makes contact with the first boundary point BP1 and the second boundary point BP2 while returning in the second sliding direction M2 after moving in the first sliding direction M1.

In the operation in which the hinge structure 400 is changed from the first state S1 to the third state S3, if an external force is not applied until the first horizontal surface 432 of the cam member 430 makes contact with the third horizontal surface 413 of the arm member 410, the elastic member 440 may fail to remain in a compressed state, and therefore the hinge structure 400 may be returned to the first state S1 by the restoring force of the elastic member 440 (e.g., unfolding detent). Likewise, in an operation in which the hinge structure 400 is changed from the third state S3 to the first state S1, if an external force is not applied until the first horizontal surface 432 of the cam member 430 makes contact with the third horizontal surface 413 of the arm member 410, the elastic member 440 may fail to remain in a compressed state, and therefore the hinge structure 400 may be returned to the third state S3 by the restoring force of the elastic member 440 (e.g., folding detent).

The hinge structure 200 according to the first embodiment and the hinge structure 300 according to the second embodiment may be configured such that the directions in which the elastic members are compressed and uncompressed are parallel to the sliding directions of the coupling members and the arm members. In contrast, the hinge structure 400 according to the embodiment illustrated in FIG. 23 may be configured such that to provide a friction structure by the cam member 430, the compression direction of the elastic member 440 is perpendicular to the sliding directions M1 and M2 of the coupling member 420 and the arm member 410. However, the disclosure is not limited thereto.

Figure 24:
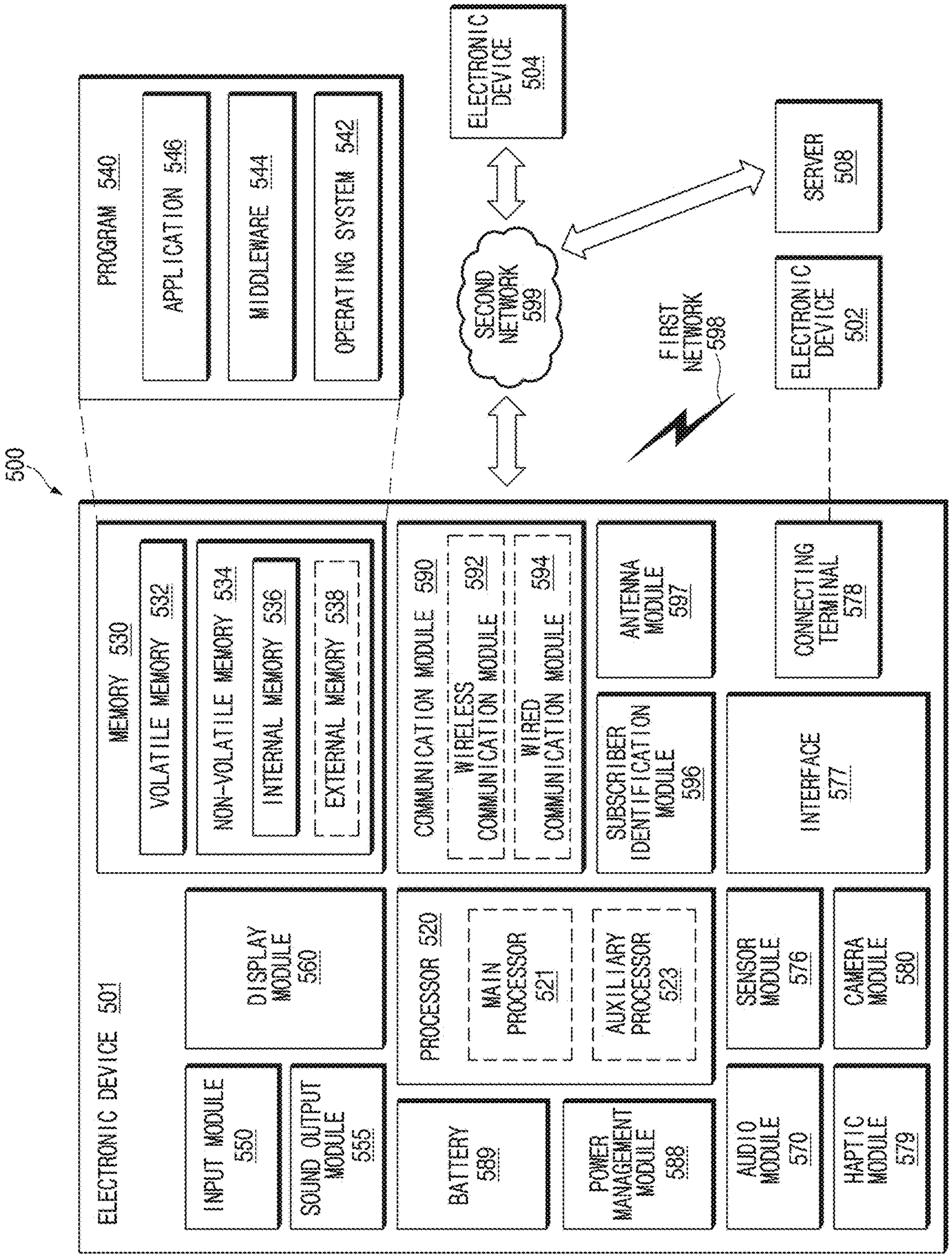
FIG. 24 is a block diagram of an electronic device in a network environment according to an embodiment.

FIG. 24 is a block diagram of an electronic device in a network environment according to an embodiment.

For example, the electronic device 501 of FIG. 24 may be referred to as the electronic device 100 shown in FIGS. 1, 2A, 2B, and 2C.

Referring to FIG. 24, the electronic device 501 in the network environment 500 may communicate with an electronic device 502 via a first network 598 (e.g., a short-range wireless communication network), or at least one of an electronic device 504 or a server 508 via a second network 599 (e.g., a long-range wireless communication network). According to an embodiment, the electronic device 501 may communicate with the electronic device 504 via the server 508. According to an embodiment, the electronic device 501 may include a processor 520, memory 530, an input module 550, a sound output module 555, a display module 560, an audio module 570, a sensor module 576, an interface 577, a connecting terminal 578, a haptic module 579, a camera module 580, a power management module 588, a battery 589, a communication module 590, a subscriber identification module (SIM) 596, or an antenna module 597. In some embodiments, at least one of the components (e.g., the connecting terminal 578) may be omitted from the electronic device 501, or one or more other components may be added in the electronic device 501. In some embodiments, some of the components (e.g., the sensor module 576, the camera module 580, or the antenna module 597) may be implemented as a single component (e.g., the display module 560).

The processor 520 may execute, for example, software (e.g., a program 540) to control at least one other component (e.g., a hardware or software component) of the electronic device 501 coupled with the processor 520, and may perform various data processing or computation. According to one embodiment, as at least part of the data processing or computation, the processor 520 may store a command or data received from another component (e.g., the sensor module 576 or the communication module 590) in volatile memory 532, process the command or the data stored in the volatile memory 532, and store resulting data in non-volatile memory 534. According to an embodiment, the processor 520 may include a main processor 521 (e.g., a central processing unit (CPU) or an application processor (AP)), or an auxiliary processor 523 (e.g., a graphics processing unit (GPU), a neural processing unit (NPU), an image signal processor (ISP), a sensor hub processor, or a communication processor (CP)) that is operable independently from, or in conjunction with, the main processor 521. For example, when the electronic device 501 includes the main processor 521 and the auxiliary processor 523, the auxiliary processor 523 may be adapted to consume less power than the main processor 521, or to be specific to a specified function. The auxiliary processor 523 may be implemented as separate from, or as part of the main processor 521.

The auxiliary processor 523 may control at least some of functions or states related to at least one component (e.g., the display module 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). According to an embodiment, the auxiliary processor 523 (e.g., an image signal processor or a communication processor) may be implemented as part of another component (e.g., the camera module 580 or the communication module 590) functionally related to the auxiliary processor 523. According to an embodiment, the auxiliary processor 523 (e.g., the neural processing unit) may include a hardware structure specified for artificial intelligence model processing. An artificial intelligence model may be generated by machine learning. Such learning may be performed, e.g., by the electronic device 501 where the artificial intelligence is performed or via a separate server (e.g., the server 508). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 530 may store various data used by at least one component (e.g., the processor 520 or the sensor module 576) of the electronic device 501. The various data may include, for example, software (e.g., the program 540) and input data or output data for a command related thererto. The memory 530 may include the volatile memory 532 or the non-volatile memory 534.

The program 540 may be stored in the memory 530 as software, and may include, for example, an operating system (OS) 542, middleware 544, or an application 546.

The input module 550 may receive a command or data to be used by another component (e.g., the processor 520) of the electronic device 501, from the outside (e.g., a user) of the electronic device 501. The input module 550 may include, for example, a microphone, a mouse, a keyboard, a key (e.g., a button), or a digital pen (e.g., a stylus pen).

The sound output module 555 may output sound signals to the outside of the electronic device 501. The sound output module 555 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 560 may visually provide information to the outside (e.g., a user) of the electronic device 501. The display module 560 may include, for example, a display, a hologram device, or a projector and control circuitry to control a corresponding one of the display, hologram device, and projector. According to an embodiment, the display module 560 may include a touch sensor adapted to detect a touch, or a pressure sensor adapted to measure the intensity of force incurred by the touch.

The audio module 570 may convert a sound into an electrical signal and vice versa. According to an embodiment, the audio module 570 may obtain the sound via the input module 550, or output the sound via the sound output module 555 or a headphone of an external electronic device (e.g., an electronic device 502) directly (e.g., wiredly) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. According to an embodiment, the sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device (e.g., the electronic device 502) directly (e.g., wiredly) or wirelessly. According to an embodiment, the interface 577 may include, for example, a high definition multimedia interface (HDMI), a universal serial bus (USB) interface, a secure digital (SD) card interface, or an audio interface.

A connecting terminal 578 may include a connector via which the electronic device 501 may be physically connected with the external electronic device (e.g., the electronic device 502). According to an embodiment, the connecting terminal 578 may include, for example, a HDMI connector, a USB connector, a SD card connector, or an audio connector (e.g., a headphone connector).

The haptic module 579 may convert an electrical signal into a mechanical stimulus (e.g., a vibration or a movement) or electrical stimulus which may be recognized by a user via his tactile sensation or kinesthetic sensation. According to an embodiment, the haptic module 579 may include, for example, a motor, a piezoelectric element, or an electric stimulator.

The camera module 580 may capture a still image or moving images. According to an embodiment, the camera module 580 may include one or more lenses, image sensors, image signal processors, or flashes.

The power management module 588 may manage power supplied to the electronic device 501. According to one embodiment, the power management module 588 may be implemented as at least part of, for example, a power management integrated circuit (PMIC).

The battery 589 may supply power to at least one component of the electronic device 501. According to an embodiment, the battery 589 may include, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more communication processors that are operable independently from the processor 520 (e.g., the application processor (AP)) and supports a direct (e.g., wired) communication or a wireless communication. According to an embodiment, the communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or infrared data association (IrDA)) or the second network 599 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The wireless communication module 592 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 592 may support a high-frequency band (e.g., the mmWave band) to achieve, e.g., a high data transmission rate. The wireless communication module 592 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 592 may support various requirements specified in the electronic device 501, an external electronic device (e.g., the electronic device 504), or a network system (e.g., the second network 599). According to an embodiment, the wireless communication module 592 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 597 may transmit or receive a signal or power to or from the outside (e.g., the external electronic device) of the electronic device 501. According to an embodiment, the antenna module 597 may include an antenna including a radiating element composed of a conductive material or a conductive pattern formed in or on a substrate (e.g., a printed circuit board (PCB)). According to an embodiment, the antenna module 597 may include a plurality of antennas (e.g., array antennas). In such a case, at least one antenna appropriate for a communication scheme used in the communication network, such as the first network 598 or the second network 599, may be selected, for example, by the communication module 590 (e.g., the wireless communication module 592) from the plurality of antennas. The signal or the power may then be transmitted or received between the communication module 590 and the external electronic device via the selected at least one antenna. According to an embodiment, another component (e.g., a radio frequency integrated circuit (RFIC)) other than the radiating element may be additionally formed as part of the antenna module 597.

According to various embodiments, the antenna module 597 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)). According to an embodiment, commands or data may be transmitted or received between the electronic device 501 and the external electronic device 504 via the server 508 coupled with the second network 599. Each of the electronic devices 502 or 504 may be a device of a same type as, or a different type, from the electronic device 501. According to an embodiment, all or some of operations to be executed at the electronic device 501 may be executed at one or more of the external electronic devices 502, 504, or 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 501. The electronic device 501 may provide the outcome, with or without further processing of the outcome, as at least part of a reply to the request. To that end, a cloud computing, distributed computing, mobile edge computing (MEC), or client-server computing technology may be used, for example. The electronic device 501 may provide ultra low-latency services using, e.g., distributed computing or mobile edge computing. In another embodiment, the external electronic device 504 may include an internet-of-things (IoT) device. The server 508 may be an intelligent server using machine learning and/or a neural network. According to an embodiment, the external electronic device 504 or the server 508 may be included in the second network 599. The electronic device 501 may be applied to intelligent services (e.g., smart home, smart city, smart car, or healthcare) based on 5G communication technology or IoT-related technology.

An electronic device 100 according to an embodiment of the disclosure may include a housing including a first housing 110 and a second housing 120, a display 140 that extends from the first housing to the second housing, and a hinge structure 200 that rotatably connects the first housing and the second housing. The hinge structure may include a fixed member 210, a first rotary member 220 coupled to one side of the fixed member so as to be rotatable about a first axis R1, a second rotary member 230 coupled to an opposite side of the fixed member so as to be rotatable about a second axis R2, a first arm member 240 coupled to the one side of the fixed member so as to be rotatable about a third axis R3, the third axis and the first axis being spaced apart from each other in parallel, a second arm member 250 coupled to the opposite side of the fixed member so as to be rotatable about a fourth axis R4, the fourth axis and the second axis being spaced apart from each other in parallel, a first coupling member 260 including one portion coupled to the first housing and another portion coupled to the first arm member so as to be linearly movable, a second coupling member 270 including one portion coupled to the second housing and another portion coupled to the second arm member so as to slide, a first elastic member 291 disposed between the first coupling member and the first arm member such that opposite ends of the first elastic member are supported by the first coupling member and the first arm member, and a second elastic member 292 disposed between the second coupling member and the second arm member such that opposite ends of the second elastic member are supported by the second coupling member and the second arm member. In folding and unfolding operations of the electronic device, the first coupling member and the second coupling member may perform a linear reciprocating motion relative to the first arm member and the second arm member, respectively. The first elastic member and the second elastic member may be compressed or uncompressed based on the linear reciprocating motion of the first coupling member and the second coupling member.

In various embodiments, the first coupling member may be coupled to the first rotary member so as to be rotatable about a fifth axis R5, and the second coupling member may be coupled to the second rotary member so as to be rotatable about a sixth axis R6. In the folding and unfolding operations of the electronic device, the first coupling member may rotate about the first axis together with the first rotary member and may rotate about the fifth axis relative to the first rotary member, and the second coupling member may rotate about the second axis together with the second rotary member and may rotate about the sixth axis relative to the second rotary member.

In various embodiments, the first coupling member may include a first part 261 fixedly coupled to the first housing, a second part 262 that extends from the first part and to which the first rotary member is coupled so as to be rotatable, and a third part 263 that extends from the second part and to which the first arm member is coupled so as to slide. The second coupling member may include a fourth part 271 fixedly coupled to the second housing, a fifth part 272 that extends from the fourth part and to which the second rotary member is coupled so as to be rotatable, and a sixth part 273 that extends from the fifth part and to which the second arm member is coupled so as to slide.

In various embodiments, the first coupling member may include, on the third part thereof, a first slide groove 266 in which a first slide protrusion 245 of the first arm member is accommodated. The second coupling member may include, on the sixth part thereof, a second slide groove 276 in which a second slide protrusion 255 of the second arm member is accommodated. The first slide groove and the second slide groove may extend in a lengthwise direction of the first elastic member or the second elastic member.

In various embodiments, the first arm member may include a first support portion **242*b* that supports a first end portion of the first elastic member, and the second arm member may include a second support portion 252*b* that supports a first end portion of the second elastic member. The first coupling member may include a third support portion 263*b* that is disposed to face the first support portion and that supports a second end portion of the first elastic member that faces away from the first end portion of the first elastic member. The second coupling member may include a fourth support portion 273*b*** that is disposed to face the second support portion and that supports a second end portion of the second elastic member that faces away from the first end portion of the second elastic member.

In various embodiments, in the folding and unfolding operations of the electronic device, a distance between the first support portion and the second support portion may decrease by a first displacement d and then may increase by the first displacement, the first elastic member may be compressed and uncompressed by the first displacement in response to a change in the distance between the first support portion and the second support portion, a distance between the third support portion and the fourth support portion may decrease by the first displacement and then may increase by the first displacement, and the second elastic member may be compressed and uncompressed by the first displacement in response to a change in the distance between the third support portion and the fourth support portion.

In various embodiments, in response to the folding and unfolding operations of the electronic device, the hinge structure may be changed to a first state S1 in which the first coupling member and the second coupling member form substantially the same straight line, a second state S2 in which the first coupling member and the second coupling member form a specified included angle, and a third state S3 in which the first coupling member and the second coupling member face each other in parallel. The first elastic member and the second elastic member may be compressed to the maximum in the second state.

In various embodiments, the first elastic member and the second elastic member may have a first length L1 in the first state and the third state and may have a second length L2 shorter than the first length in the second state, and a difference between the first length and the second length may be substantially the same as the first displacement.

In various embodiments, the first elastic member and the second elastic member may be compressed to a first degree of compression in the first state and may be compressed to a second degree of compression greater than the first degree of compression in the third state.

In various embodiments, the fixed member may include a first guide protrusion 211 inserted into a first guide rail 224 of the first rotary member, a second guide protrusion 212 inserted into a second guide rail 234 of the second rotary member, a third guide protrusion 213 inserted into a third guide rail 244 of the first arm member, and a fourth guide protrusion 214 inserted into a fourth guide rail 254 of the second arm member.

In various embodiments, the first rotary member may include a first coupling part 221 having the first guide rail formed thereon and a second coupling part 222 that extends from the first coupling part and to which the first coupling member is coupled so as to be rotatable. The second rotary member may include a third coupling part 231 having the second guide rail formed thereon and a fourth coupling part 232 that extends from the third coupling part and to which the second coupling member is coupled so as to be rotatable.

In various embodiments, the first guide rail of the first rotary member may have an arc shape, and the first guide protrusion may rotate in the first guide rail about the first axis that extends from the center of the arc of the first guide rail. The second guide rail of the second rotary member may have an arc shape, and the second guide protrusion may rotate in the second guide rail about the second axis that extends from the center of the arc of the second guide rail.

In various embodiments, the first arm member may include a fifth coupling part 241 having the third guide rail formed thereon and a sixth coupling part 242 that extends from the fifth coupling part and to which the first coupling member is coupled so as to be linearly movable. The second arm member may include a seventh coupling part 251 having the fourth guide rail formed thereon and an eighth coupling part 252 that extends from the seventh coupling part and to which the second coupling member is coupled so as to be linearly movable.

In various embodiments, the third guide rail of the first arm member may have an arc shape, and the third guide protrusion may rotate in the third guide rail about the third axis that extends from the center of the arc of the third guide rail. The fourth guide rail of the second arm member may have an arc shape, and the fourth guide protrusion may rotate in the fourth guide rail about the fourth axis that extends from the center of the arc of the fourth guide rail.

In various embodiments, when the hinge structure is viewed in an axial direction parallel to the first axis to the fourth axis, the third axis and the fourth axis may be formed between the first axis and the second axis, and a distance between the first axis and the second axis may be longer than a distance between the third axis and the fourth axis.

In various embodiments, the fixed member may include an upper surface that faces toward the display. The third axis may be formed in a position to penetrate a portion of the first arm member, and the first axis may be formed in a higher position than the third axis based on the upper surface. The fourth axis may be formed in a position to penetrate a portion of the second arm member, and the second axis may be formed in a higher position than the third axis based on the upper surface.

In various embodiments, the electronic device may further include a first rotary plate 150 that is coupled to the first rotary member and that rotates about the fifth axis relative to the first coupling member together with the first rotary member and a second rotary plate 160 that is coupled to the second rotary member and that rotates about the sixth axis relative to the second coupling member together with the second rotary member.

In various embodiments, the display may include a first region 141 at least partially disposed on the first housing and formed to be flat, a second region 142 at least partially disposed on the second housing and formed to be flat, and a folding region 143 located between the first region and the second region. The first rotary plate may support one portion of the folding region, and the second rotary plate may support another portion of the folding region.

In various embodiments, the display may include a first surface 140*b* that makes contact with the first rotary plate and the second rotary plate and a second surface 140*a* that faces away from the first surface, and the fifth axis and the sixth axis may be formed between the first surface and the second surface.

In various embodiments, the hinge structure may further include an interlocking member 280 coupled to the fixed member, and the interlocking member may rotationally interlock the first arm member and the second arm member, or may rotationally interlock the first rotary member and the second rotary member.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as “A or B,” “at least one of A and B,” “at least one of A or B,” “A, B, or C,” “at least one of A, B, and C,” and “at least one of A, B, or C,” may include any one of, or all possible combinations of the items enumerated together in a corresponding one of the phrases. As used herein, such terms as “1st” and “2nd,” or “first” and “second” may be used to simply distinguish a corresponding component from another, and does not limit the components in other aspect (e.g., importance or order). It is to be understood that if an element (e.g., a first element) is referred to, with or without the term “operatively” or “communicatively”, as “coupled with,” “coupled to,” “connected with,” or “connected to” another element (e.g., a second element), it means that the element may be coupled with the other element directly (e.g., wiredly), wirelessly, or via a third element.

As used in connection with various embodiments of the disclosure, the term “module” may include a unit implemented in hardware, software, or firmware, and may interchangeably be used with other terms, for example, “logic,” “logic block,” “part,” or “circuitry”. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 540) including one or more instructions that are stored in a storage medium (e.g., internal memory 536 or external memory 538) that is readable by a machine (e.g., the electronic device 501). For example, a processor (e.g., the processor 520) of the machine (e.g., the electronic device 501) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term “non-transitory” simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer’s server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:

a housing including a first housing and a second housing;

a display configured to extend from the first housing to the second housing; and a hinge structure configured to rotatably connect the first housing and the second housing, wherein the hinge structure includes:

a fixed member;

a first rotary member coupled to one side of the fixed member so as to be rotatable about a first axis;

a second rotary member coupled to an opposite side of the fixed member so as to be rotatable about a second axis;

a first arm member coupled to the one side of the fixed member so as to be rotatable about a third axis, the third axis and the first axis being spaced apart from each other in parallel;

a second arm member coupled to the opposite side of the fixed member so as to be rotatable about a fourth axis, the fourth axis and the second axis being spaced apart from each other in parallel;

a first coupling member including one portion coupled to the first housing and another portion coupled to the first arm member so as to be linearly movable;

a second coupling member including one portion coupled to the second housing and another portion coupled to the second arm member so as to slide;

a first elastic member disposed between the first coupling member and the first arm member such that opposite ends of the first elastic member are supported by the first coupling member and the first arm member; and a second elastic member disposed between the second coupling member and the second arm member such that opposite ends of the second elastic member are supported by the second coupling member and the second arm member, wherein in folding and unfolding operations of the electronic device, the first coupling member and the second coupling member perform a linear reciprocating motion relative to the first arm member and the second arm member, respectively, wherein the first elastic member and the second elastic member are compressed or uncompressed based on the linear reciprocating motion of the first coupling member and the second coupling member, wherein the first coupling member is coupled to the first rotary member so as to be rotatable with respect to the first rotary member about a fifth axis, wherein the second coupling member is coupled to the second rotary member so as to be rotatable with respect to the second rotary member about a sixth axis, and wherein the first coupling member includes a first part fixedly coupled to the first housing, a second part to which the first rotary member is coupled so as to be rotatable, the second part being configured to extend from the first part, and a third part to which the first arm member is coupled so as to slide.

2. The electronic device of claim 1, wherein in the folding and unfolding operations of the electronic device, the first coupling member rotates about the first axis together with the first rotary member and rotates about the fifth axis relative to the first rotary member, and the second coupling member rotates about the second axis together with the second rotary member and rotates about the sixth axis relative to the second rotary member.

3. The electronic device of claim 2, wherein the third part is configured to extend from the second part, and wherein the second coupling member includes a fourth part fixedly coupled to the second housing, a fifth part to which the second rotary member is coupled so as to be rotatable, the fifth part being configured to extend from the fourth part, and a sixth part to which the second arm member is coupled so as to slide, the sixth part being configured to extend from the fifth part.

4. The electronic device of claim 3, wherein the first coupling member includes, on the third part thereof, a first slide groove in which a first slide protrusion of the first arm member is accommodated, wherein the second coupling member includes, on the sixth part thereof, a second slide groove in which a second slide protrusion of the second arm member is accommodated, and wherein the first slide groove and the second slide groove extend in a lengthwise direction of the first elastic member or the second elastic member.

5. The electronic device of claim 2, further comprising:

a first rotary plate coupled to the first rotary member and configured to rotate about the fifth axis relative to the first coupling member together with the first rotary member; and a second rotary plate coupled to the second rotary member and configured to rotate about the sixth axis relative to the second coupling member together with the second rotary member.

6. The electronic device of claim 5, wherein the display includes a first region at least partially disposed on the first housing and formed to be flat, a second region at least partially disposed on the second housing and formed to be flat, and a folding region located between the first region and the second region, and wherein the first rotary plate supports one portion of the folding region, and the second rotary plate supports another portion of the folding region.

7. The electronic device of claim 6, wherein the display includes a first surface configured to make contact with the first rotary plate and the second rotary plate and a second surface configured to face away from the first surface, and wherein the fifth axis and the sixth axis are formed between the first surface and the second surface.

8. The electronic device of claim 1, wherein the first arm member includes a first support portion configured to support a first end portion of the first elastic member, wherein the second arm member includes a second support portion configured to support a first end portion of the second elastic member, wherein the first coupling member includes a third support portion disposed to face the first support portion and configured to support a second end portion of the first elastic member configured to face away from the first end portion of the first elastic member, and wherein the second coupling member includes a fourth support portion disposed to face the second support portion and configured to support a second end portion of the second elastic member configured to face away from the first end portion of the second elastic member.

9. The electronic device of claim 8, wherein in the folding and unfolding operations of the electronic device, a distance between the first support portion and the second support portion decreases by a first displacement and then increases by the first displacement, the first elastic member is compressed and uncompressed by the first displacement in response to a change in the distance between the first support portion and the second support portion, a distance between the third support portion and the fourth support portion decreases by the first displacement and then increases by the first displacement, and the second elastic member is compressed and uncompressed by the first displacement in response to a change in the distance between the third support portion and the fourth support portion.

10. The electronic device of claim 9, wherein in response to the folding and unfolding operations of the electronic device, the hinge structure is changed to a first state in which the first coupling member and the second coupling member form substantially the same straight line, a second state in which the first coupling member and the second coupling member form a specified included angle, and a third state in which the first coupling member and the second coupling member face each other in parallel, and wherein the first elastic member and the second elastic member are compressed to the maximum in the second state.

11. The electronic device of claim 10, wherein the first elastic member and the second elastic member have a first length in the first state and the third state and have a second length shorter than the first length in the second state, and wherein a difference between the first length and the second length is substantially the same as the first displacement.

12. The electronic device of claim 10, wherein the first elastic member and the second elastic member are compressed to a first degree of compression in the first state and are compressed to a second degree of compression greater than the first degree of compression in the third state.

13. The electronic device of claim 1, wherein the fixed member includes a first guide protrusion inserted into a first guide rail of the first rotary member, a second guide protrusion inserted into a second guide rail of the second rotary member, a third guide protrusion inserted into a third guide rail of the first arm member, and a fourth guide protrusion inserted into a fourth guide rail of the second arm member.

14. The electronic device of claim 13, wherein the first rotary member includes a first coupling part having the first guide rail formed thereon and a second coupling part to which the first coupling member is coupled so as to be rotatable, the second coupling part being configured to extend from the first coupling part, and wherein the second rotary member includes a third coupling part having the second guide rail formed thereon and a fourth coupling part to which the second coupling member is coupled so as to be rotatable, the fourth coupling part being configured to extend from the third coupling part.

15. The electronic device of claim 13, wherein the first guide rail of the first rotary member has an arc shape, and the first guide protrusion rotates in the first guide rail about the first axis configured to extend from the center of the arc of the first guide rail, and wherein the second guide rail of the second rotary member has an arc shape, and the second guide protrusion rotates in the second guide rail about the second axis configured to extend from the center of the arc of the second guide rail.

16. The electronic device of claim 13, wherein the first arm member includes a fifth coupling part having the third guide rail formed thereon and a sixth coupling part to which the first coupling member is coupled so as to be linearly movable, the sixth coupling part being configured to extend from the fifth coupling part, and wherein the second arm member includes a seventh coupling part having the fourth guide rail formed thereon and an eighth coupling part to which the second coupling member is coupled so as to be linearly movable, the eighth coupling part being configured to extend from the seventh coupling part.

17. The electronic device of claim 13, wherein the third guide rail of the first arm member has an arc shape, and the third guide protrusion rotates in the third guide rail about the third axis configured to extend from the center of the arc of the third guide rail, and wherein the fourth guide rail of the second arm member has an arc shape, and the fourth guide protrusion rotates in the fourth guide rail about the fourth axis configured to extend from the center of the arc of the fourth guide rail.

18. The electronic device of claim 1, wherein when the hinge structure is viewed in an axial direction parallel to the first to the fourth axis, the third axis and the fourth axis are formed between the first axis and the second axis, and a distance between the first axis and the second axis is longer than a distance between the third axis and the fourth axis.

19. The electronic device of claim 18, wherein the fixed member includes an upper surface configured to face toward the display, wherein the third axis is formed in a position to penetrate a portion of the first arm member, and the first axis is formed in a higher position than the third axis based on the upper surface, and wherein the fourth axis is formed in a position to penetrate a portion of the second arm member, and the second axis is formed in a higher position than the third axis based on the upper surface.

20. The electronic device of claim 1, wherein the hinge structure further includes an interlocking member coupled to the fixed member, and wherein the interlocking member rotationally interlocks the first arm member and the second arm member, or rotationally interlocks the first rotary member and the second rotary member.

* * * * *